US012677443B2

(12) United States Patent
Frougier et al.

(10) Patent No.: US 12,677,443 B2
(45) Date of Patent: Jul. 7, 2026

(54) SELF-ALIGNED SUBSTRATE ISOLATION (SASI) OF GATE-ALL-AROUND NANOSHEET FIELD EFFECT TRANSISTORS

(71) Applicant: International Business Machines Corporation, Armonk, NY (US)

(72) Inventors: Julien Frougier, Albany, NY (US); Nicolas Jean Loubet, Guilderland, NY (US); Andrew M. Greene, Slingerlands, NY (US); Andrew Gaul, Halfmoon, NY (US); Ruilong Xie, Niskayuna, NY (US); Shogo Mochizuki, Mechanicville, NY (US); Curtis S. Durfee, Schenectady, NY (US); Eric Miller, Albany, NY (US); Ronald Newhart, Lebanon, PA (US); Choudhury Mahboob Ellahi, Halfmoon, NY (US); Anthony I. Chou, Guilderland, NY (US); Susan Ng Emans, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 495 days.

(21) Appl. No.: 18/113,686

(22) Filed: Feb. 24, 2023

(65) Prior Publication Data

US 2024/0290860 A1     Aug. 29, 2024

(51) Int. Cl.
*H10D 30/67*       (2025.01)
*H10D 30/01*       (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .... H10D 84/85; H10D 84/851; H10D 62/114; H10D 62/116; H10D 62/121;
(Continued)

(56) References Cited

U.S. PATENT DOCUMENTS 8,008,144 B2    8/2011  Ananthan
9,947,804 B1    4/2018  Frougier
(Continued)

FOREIGN PATENT DOCUMENTS

TW       200414538 A     8/2004
TW       200601826 A     1/2006
(Continued)

OTHER PUBLICATIONS

"High-k dielectric." Wikipedia, Wikimedia Foundation, Jun. 18, 2025, https://en.wikipedia.org/wiki/High-%CE%BA_dielectric. Accessed Oct. 11, 2025. (Year: 2025).*
(Continued)

*Primary Examiner* — Reema Patel
(74) *Attorney, Agent, or Firm* — Harrity & Harrity, LLP

(57)            ABSTRACT

A semiconductor structure includes a substrate and a gate-all-around field effect transistor disposed over the substrate. The gate-all-around field effect transistor includes a first source-drain region; a second source-drain region; at least one channel region interconnecting the first and second source drain regions; and a gate structure surrounding the at least one channel region. A self-aligned substrate isolation (SASI) layer is located between the substrate and the gate structure and extends over a width of the gate structure.

22 Claims, 53 Drawing Sheets

(51) Int. Cl.

| | |
|---|---|
| *H10D 30/43* | (2025.01) |
| *H10D 62/10* | (2025.01) |
| *H10D 64/01* | (2025.01) |

(52) U.S. Cl.

CPC ....... *H10D 30/6757* (2025.01); *H10D 62/121* (2025.01); *H10D 64/017* (2025.01); *H10D 64/018* (2025.01)

(58) Field of Classification Search

CPC .............. H10D 62/371; H10D 62/364; H10D 30/6735; H10D 30/6757

See application file for complete search history.

(56) References Cited

U.S. PATENT DOCUMENTS

| | | | |
|---|---|---|---|
| 9,991,352 | B1 | 6/2018 | Frougier |
| 10,103,238 | B1 | 10/2018 | Zang |
| 10,332,961 | B2 | 6/2019 | Cheng |
| 10,453,824 | B1 | 10/2019 | Mochizuki |
| 10,468,311 | B2 | 11/2019 | Reznicek |
| 11,133,230 | B2 | 9/2021 | Lin |
| 11,302,794 | B2 | 4/2022 | Xie |
| 2004/0036126 | A1 | 2/2004 | Chau et al. |
| 2005/0285165 | A1 | 12/2005 | Ohkawa et al. |
| 2009/0243676 | A1* | 10/2009 | Feng ................ G01R 31/31727 327/157 |
| 2015/0021690 | A1 | 1/2015 | Jacob |
| 2015/0056781 | A1 | 2/2015 | Akarvardar |

| | | | |
|---|---|---|---|
| 2015/0162436 | A1 | 6/2015 | Toh |
| 2015/0221726 | A1 | 8/2015 | Wong |
| 2016/0197004 | A1 | 7/2016 | Akarvardar |
| 2018/0374761 | A1 | 12/2018 | Guillorn |
| 2019/0312104 | A1 | 10/2019 | Cheng |
| 2020/0105868 | A1 | 4/2020 | Loubet |
| 2020/0105869 | A1 | 4/2020 | Loubet |
| 2022/0157941 | A1 | 5/2022 | Liaw |
| 2022/0157947 | A1 | 5/2022 | Seol et al. |
| 2022/0310602 | A1 | 9/2022 | Greene |
| 2022/0352386 | A1 | 11/2022 | Yu |

FOREIGN PATENT DOCUMENTS

| | | |
|---|---|---|
| TW | 202445865 A | 11/2024 |
| WO | 2024/175381 A1 | 8/2024 |

OTHER PUBLICATIONS

Zhang J, Frougier J, Greene A, Miao X, Yu L, Vega R, Montanini P, Durfee C, Gaul A, Pancharatnam S, Adams C. Full bottom dielectric isolation to enable stacked nanosheet transistor for low power and high performance applications. In2019 IEEE International Electron Devices Meeting (IEDM) Dec. 7, 2019 (pp. 11-16). IEEE. 4 pages plus cover sheet.

Taiwan Patent Office, "Office Action," Jan. 21, 2025, 17 Pages, TW Application No. 113100832.

European Patent Office, ISR & WO on related PCT case PCT/EP2024/053364, May 16, 2024. pp. 20.

\* cited by examiner

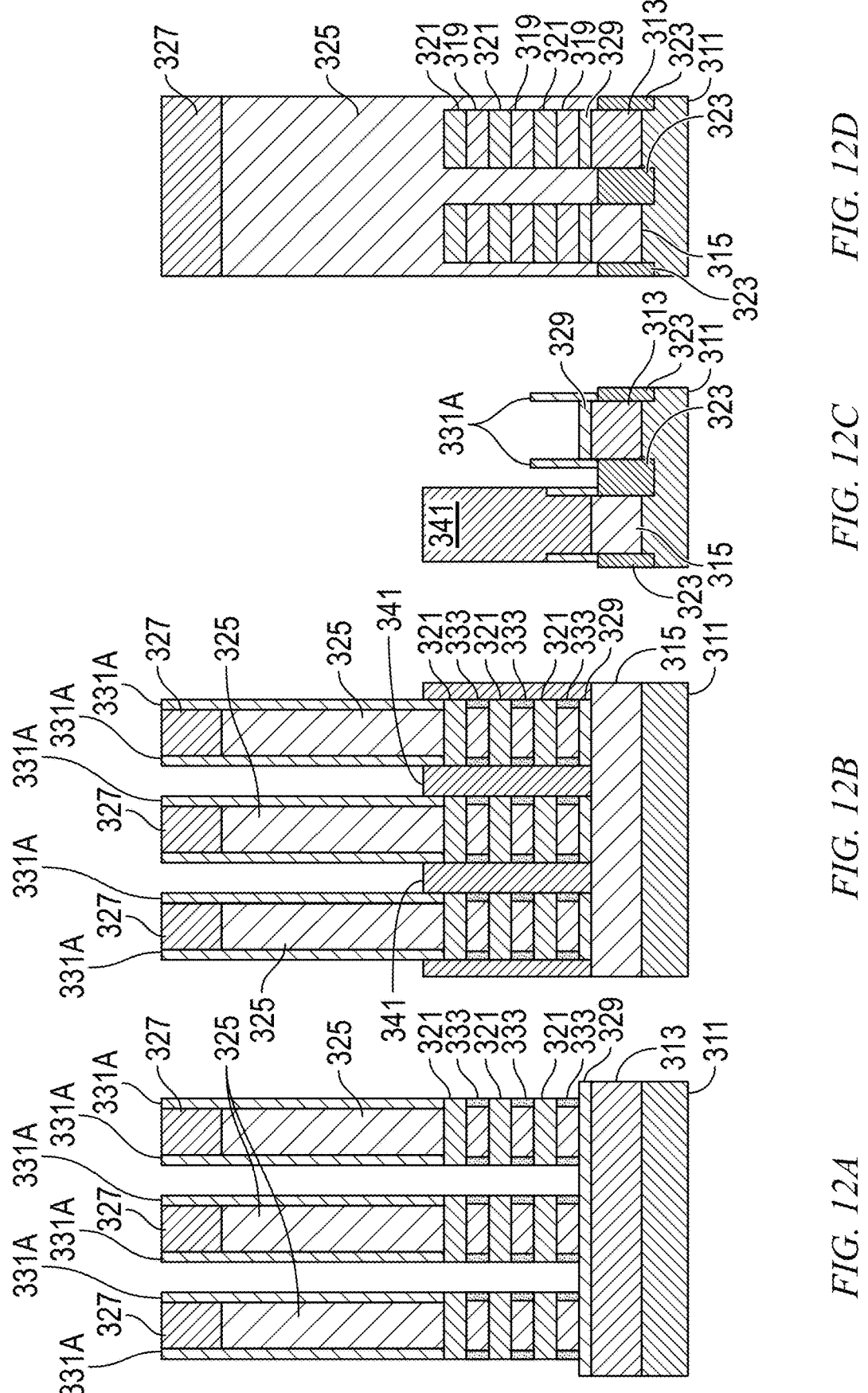
*FIG. 12A*     *FIG. 12B*     *FIG. 12C*     *FIG. 12D*

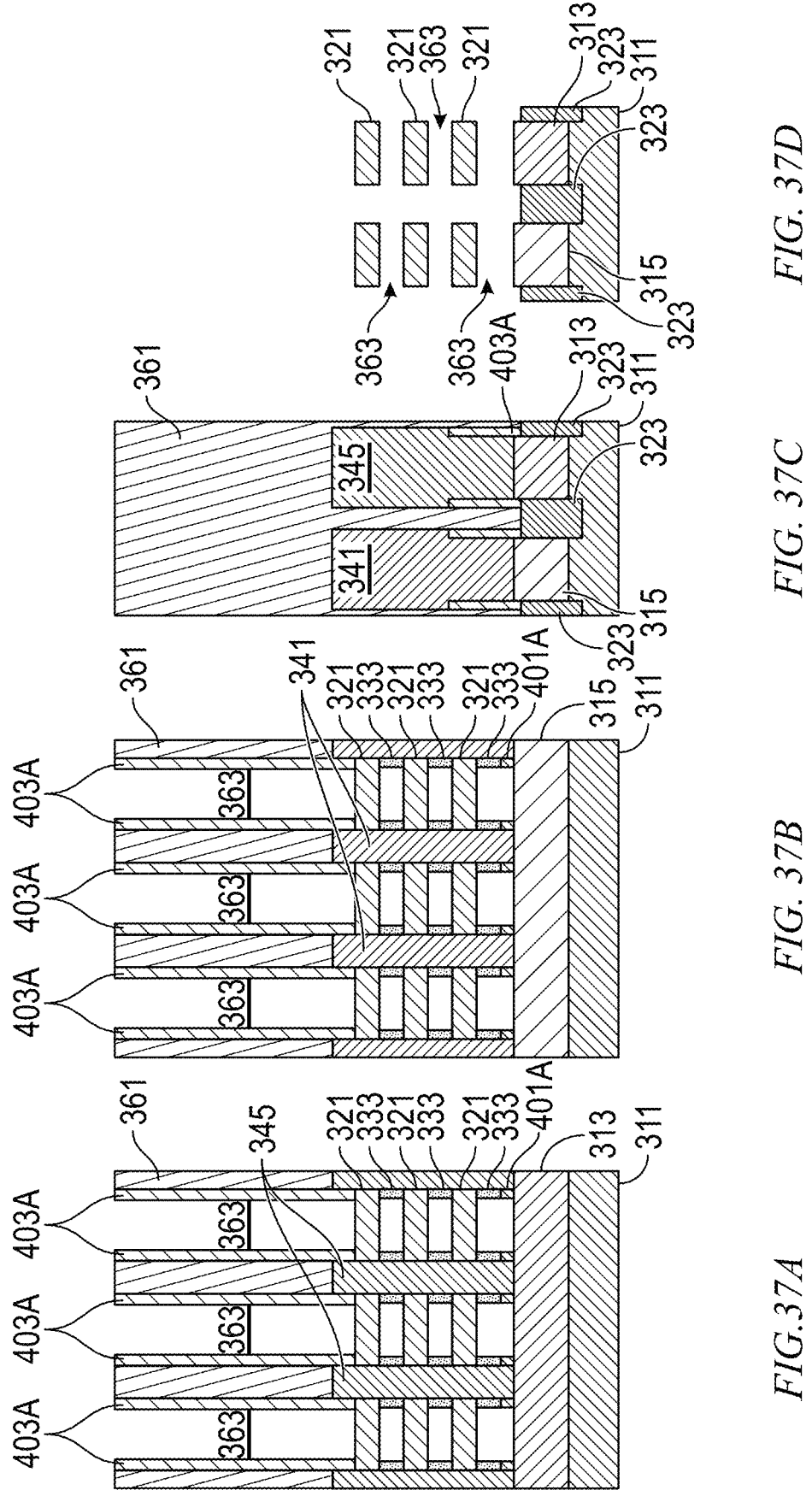
*FIG. 37A*     *FIG. 37B*     *FIG. 37C*     *FIG. 37D*

311

311

311

311

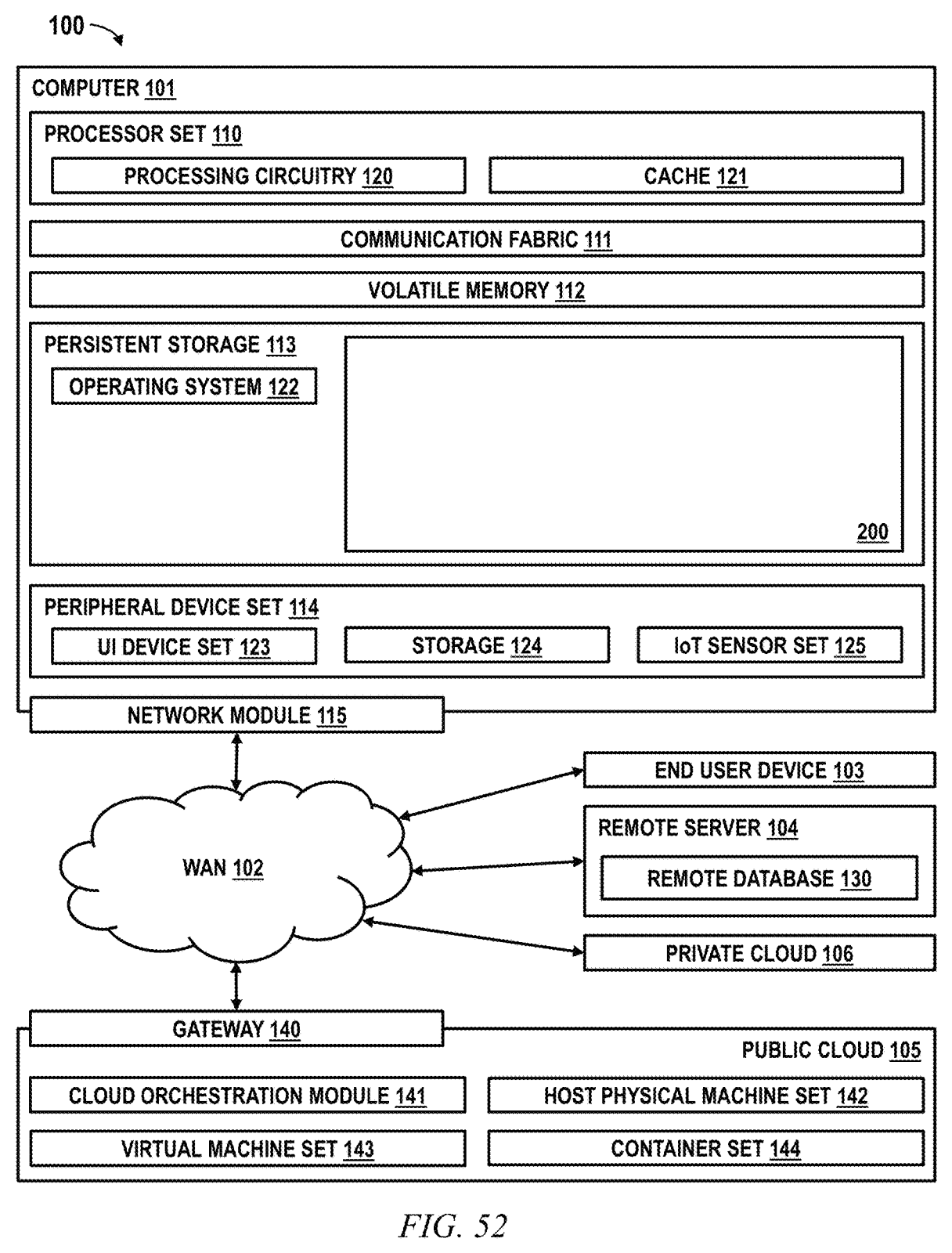

100

COMPUTER 101

PROCESSOR SET 110

PROCESSING CIRCUITRY 120     CACHE 121

COMMUNICATION FABRIC 111

VOLATILE MEMORY 112

PERSISTENT STORAGE 113

OPERATING SYSTEM 122

200

PERIPHERAL DEVICE SET 114

UI DEVICE SET 123     STORAGE 124     IoT SENSOR SET 125

NETWORK MODULE 115

WAN 102

END USER DEVICE 103

REMOTE SERVER 104

REMOTE DATABASE 130

PRIVATE CLOUD 106

GATEWAY 140

PUBLIC CLOUD 105

CLOUD ORCHESTRATION MODULE 141     HOST PHYSICAL MACHINE SET 142

VIRTUAL MACHINE SET 143     CONTAINER SET 144

FIG. 52

SELF-ALIGNED SUBSTRATE ISOLATION (SASI) OF GATE-ALL-AROUND NANOSHEET FIELD EFFECT TRANSISTORS

BACKGROUND

The present invention relates generally to the electrical, electronic and computer arts and, more particularly, to techniques for controlling the off-state leakage of gate-all-around (GAA) field effect transistors (FETs).

In nanosheet technology, the channel is physically isolated from the substrate, while the remaining portion of silicon substrate under the structure can act as a parasitic channel. Studies have shown that leakage of a FET in the OFF state is highly dependent on the amount of recess of the source-drain regions into the substrate. The deeper the source-drain (S-D) regions extend below the stack into the substrate, the more leakage is encountered, and the relation is non-linear. For example, an increase from nominal to 5 nm deeper increases the leakage current by a factor of two; an increase from nominal to 10 nm deeper increases the leakage current by a factor of ten. Current techniques for optimally controlling the off-state leakage of GAA FETs rely on physically disconnecting the gate, source, and drain from the substrate by forming a continuous dielectric layer under the device across the gate and source-drain regions. This method solved two problems in the prior art: isolating the source-drain and channel regions from the substrate while preventing excessive recessing of the source-drain regions. However, the presence of a dielectric layer over the substrate in the source-drain region can be an obstacle for proper nucleation and growth of adequate source-drain epitaxy ("epi"). Moreover, the presence of a dielectric layer over the substrate in the source-drain region can be a significant limitation for strain engineering of GAA FETs using source-drain epitaxy.

There are limitations to conventional punch-through stoppers (PTS) for nanosheet devices. In the prior art, sensitivity to sub-sheet leakage is more pronounced for short gate lengths ($L_g$) due to proximity of the S-D regions. The mechanism of source-to-drain leakage under the device under the device through the substrate can be a limitation for $L_g$ scaling. Furthermore, leakage current ($I_{soff}$), sub-threshold slope ($SS_{sat}$), and effective capacitance ($C_{eff}$) increase as the S-D recess increases, with no on-state current benefit, implying degradation of device performance. Fin recess depth control in the source-drain region is quite pertinent to ensure minimization of parasitic leakage under the gate.

BRIEF SUMMARY

Principles of the invention provide techniques for off-state leakage control of gate-all-around field effect transistors on bulk substrate. In one aspect, an exemplary semiconductor structure includes a substrate and a gate-all-around field effect transistor disposed over the substrate. The gate-all-around field effect transistor includes a first source-drain region; a second source-drain region; at least one channel region interconnecting the first and second source drain regions; and a gate structure surrounding the at least one channel region. The exemplary semiconductor structure further includes a self-aligned substrate isolation (SASI) layer located between the substrate and the gate structure and extending over a width of the gate structure.

Optionally, a punch-through stopper implant layer is included in the substrate adjacent an upper surface of the substrate, facing towards the gate-all-around field effect transistor, below the first and second source-drain regions and the gate structure, and the self-aligned substrate isolation (SASI) layer is located between the punch-through stopper implant layer and the gate structure, and in contact with the punch-through stopper implant layer.

Optionally, the outer surface of the substrate is flat, continuous, and does not exhibit substantial topography changes between a portion of the outer surface adjacent the first and second source drain regions and a portion of the outer surface adjacent the gate structure.

In another aspect, another exemplary semiconductor structure includes a substrate and a gate-all-around field effect transistor disposed over the substrate. The gate-all-around field effect transistor includes a first source-drain region; a second source-drain region; at least one channel region interconnecting the first and second source drain regions; and a gate structure surrounding the at least one channel region. The gate structure includes: a high-K metal gate in a gate region; conformal gate spacers on each side of the high-K metal gate, in an extension region; and inner spacers on each side of the high-K metal gate, in the extension region. The exemplary semiconductor structure further includes a self-aligned substrate isolation (SASI) layer located between the substrate and the inner spacers; the self-aligned substrate isolation (SASI) layer does not extend across the high-K metal gate.

In a further aspect, an exemplary semiconductor array structure includes a substrate, a plurality of P-type gate-all-around field effect transistors disposed over the substrate, and a plurality of N-type gate-all-around field effect transistors disposed over the substrate. Each P-type gate-all-around field effect transistor includes a first P-type source-drain region; a second P-type source-drain region; at least one PFET channel region interconnecting the first and second P-type source drain regions; and a PFET gate structure surrounding the at least one PFET channel region. Each N-type gate-all-around field effect transistor includes a first N-type source-drain region; a second N-type source-drain region; at least one NFET channel region interconnecting the first and second N-type source drain regions; and an NFET gate structure surrounding the at least one NFET channel region. The exemplary semiconductor array structure further includes a first plurality of self-aligned substrate isolation (SASI) layers located between the substrate and the NFET gate structures and extending over a width of the NFET gate structures; and a second plurality of self-aligned substrate isolation (SASI) layers located between the substrate and the PFET gate structures and extending over a width of the PFET gate structures.

Optionally, a plurality of N-type punch-through stopper implant layers are included in the substrate adjacent an upper surface of the substrate, facing towards the P-type gate-all-around field effect transistors, below the first and second P-type source-drain regions and the PFET gate structures; and a plurality of P-type punch-through stopper implant layers are included in the substrate adjacent the upper surface of the substrate, facing towards the N-type gate-all-around field effect transistors, below the first and second N-type source-drain regions and the NFET gate structures.

In still a further aspect, an exemplary method of forming a semiconductor array structure includes epitaxially growing, outward of a substrate, a nanosheet stack including a lower, sacrificial high Ge % SiGe layer, and a plurality of alternating low Ge % SiGe layers and Si layers above the sacrificial high Ge % SiGe layer; forming a plurality of fins in the nanosheet stack; forming shallow trench isolation material between the fins; and forming dummy gates surrounding the fins. The method further includes substituting a self-aligned substrate isolation (SASI) layer for the sacrificial high Ge % SiGe layer; forming gate spacers on sides of the dummy gates; forming source-drain trenches between the dummy gates; forming inner spacers adjacent edges of the plurality of alternating low Ge % SiGe layers; and selectively removing the self-aligned substrate isolation (SASI) layer from bottoms of the source-drain trenches. The method still further includes epitaxially growing source-drain regions in the source-drain trenches; replacing the dummy gates and the plurality of low Ge % SiGe layers with high-K metal gate (HKMG) stacks; and forming trench metal contacts between the high-K metal gate (HKMG) stacks down to the source-drain regions.

Optionally, the step of selectively removing the self-aligned substrate isolation (SASI) layer from bottoms of the source-drain trenches is carried out prior to the step of forming the inner spacers adjacent to the edges of the plurality of alternating low Ge % SiGe layers.

In yet a further aspect, a hardware description language (HDL) design structure is encoded on a machine-readable data storage medium. The HDL design structure includes elements that when processed in a computer-aided design system generate a machine-executable representation of a semiconductor structure and/or semiconductor structure array, and/or any portion thereof, as described.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

Providing a self-aligned substrate isolation (SASI) layer for optimal fin recess control—reduces or eliminates over-etch into the substrate/PTS, minimizing the risk of leakage under the gate.

Significantly reducing gate-to-substrate capacitance—a SASI layer is preserved under the stack, which physically disconnects the bottom high-K metal gate (HKMG) from the sub-fin.

Providing an exposed substrate for S-D epitaxy nucleation, which is a significant advantage for epitaxy formation, and potentially for strain engineering.

Adapting known processes for fabrication.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 2A-15D show steps in fabrication of an exemplary semiconductor array structure, according to an aspect of the invention, wherein "A" figures are cross-sections taken along line $X_1$ in FIG. 1, "B" figures are cross-sections taken along line $X_2$ in FIG. 1, "C" figures are cross-sections taken along line $Y_1$ in FIG. 1, and "D" figures are cross-sections taken along line $Y_2$ in FIG. 1;

FIGS. 16A-26D show steps in fabrication of another exemplary semiconductor array structure, according to an aspect of the invention, wherein "A" figures are cross-sections taken along line $X_1$ in FIG. 1, "B" figures are cross-sections taken along line $X_2$ in FIG. 1, "C" figures are cross-sections taken along line $Y_1$ in FIG. 1, and "D" figures are cross-sections taken along line $Y_2$ in FIG. 1;

FIGS. 27A-33D show steps in fabrication of still another exemplary semiconductor array structure, according to an aspect of the invention, wherein "A" figures are cross-sections taken along line $X_1$ in FIG. 1, "B" figures are cross-sections taken along line $X_2$ in FIG. 1, "C" figures are cross-sections taken along line $Y_1$ in FIG. 1, and "D" figures are cross-sections taken along line $Y_2$ in FIG. 1;

FIGS. 34A-38D show steps in fabrication of yet another exemplary semiconductor array structure, according to an aspect of the invention, wherein "A" figures are cross-sections taken along line $X_1$ in FIG. 1, "B" figures are cross-sections taken along line $X_2$ in FIG. 1, "C" figures are cross-sections taken along line $Y_1$ in FIG. 1, and "D" figures are cross-sections taken along line $Y_2$ in FIG. 1;

FIGS. 39A-43D show steps in fabrication of a further exemplary semiconductor array structure, according to an aspect of the invention, wherein "A" figures are cross-sections taken along line $X_1$ in FIG. 1, "B" figures are cross-sections taken along line $X_2$ in FIG. 1, "C" figures are cross-sections taken along line $Y_1$ in FIG. 1, and "D" figures are cross-sections taken along line $Y_2$ in FIG. 1;

FIGS. 45A-48D show steps in fabrication of still a further exemplary semiconductor array structure, according to an aspect of the invention, wherein "A" figures are cross-sections taken along line $X_1$ in FIG. 1, "B" figures are cross-sections taken along line $X_2$ in FIG. 1, "C" figures are cross-sections taken along line $Y_1$ in FIG. 1, and "D" figures are cross-sections taken along line $Y_2$ in FIG. 1;

FIGS. 50A-51D show an alternative sequence of fabrication steps, according to an aspect of the invention, wherein "A" figures are cross-sections taken along line $X_1$ in FIG. 1, "B" figures are cross-sections taken along line $X_2$ in FIG. 1, "C" figures are cross-sections taken along line $Y_1$ in FIG. 1, and "D" figures are cross-sections taken along line $Y_2$ in FIG. 1;

FIG. 52 depicts a computing environment useful in connection with some aspects of the present invention, such as with the design process of FIG. 53.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Aspects of invention provide techniques to control off-state leakage of GAA FETs on a bulk substrate. In the prior art, the gate, source, and drain are physically disconnected from the substrate using a continuous dielectric layer under the device across the gate and source-drain regions. One or more embodiments employ a self-aligned substrate isolation (SASI) layer, which, in at least some embodiments, also functions as an etch stop. In one or more embodiments, self-align a thin dielectric layer under the gate only.

In some prior art techniques employing a continuous dielectric layer under the device across the gate and source-drain regions, epitaxy is typically only grown from the edge of the nanosheet. In other prior art techniques, the substrate is exposed to permit epitaxial growth. Stress/strain engineering is a pertinent consideration for high performance of complementary metal oxide semiconductor (CMOS) devices. Mechanical stress affects material properties such as bandgap, effective mass, carrier mobility, and leakage current. In addition, mechanical stress can be deliberately added (such as SiGe layers onto silicon) to improve device performance. Consider strain engineering of a PFET—if it is desired to generate compressive strain on a PFET channel, because of the way epitaxy grows, it is typically necessary to have the substrate exposed. One or more embodiments advantageously provide the advantage of a bulk substrate, with the substrate exposed for nucleation of epitaxy, and the potential for strain engineering, yet at the same time have advantages including: leakage control and the avoidance of excessive recess into the substrate. One other exemplary advantage of one or more embodiments is that having the substrate exposed helps nucleation and growth of adequate source-drain epitaxy, since the substrate is exposed as compared to techniques that only expose the sides of the nanosheets.

Figure 1:
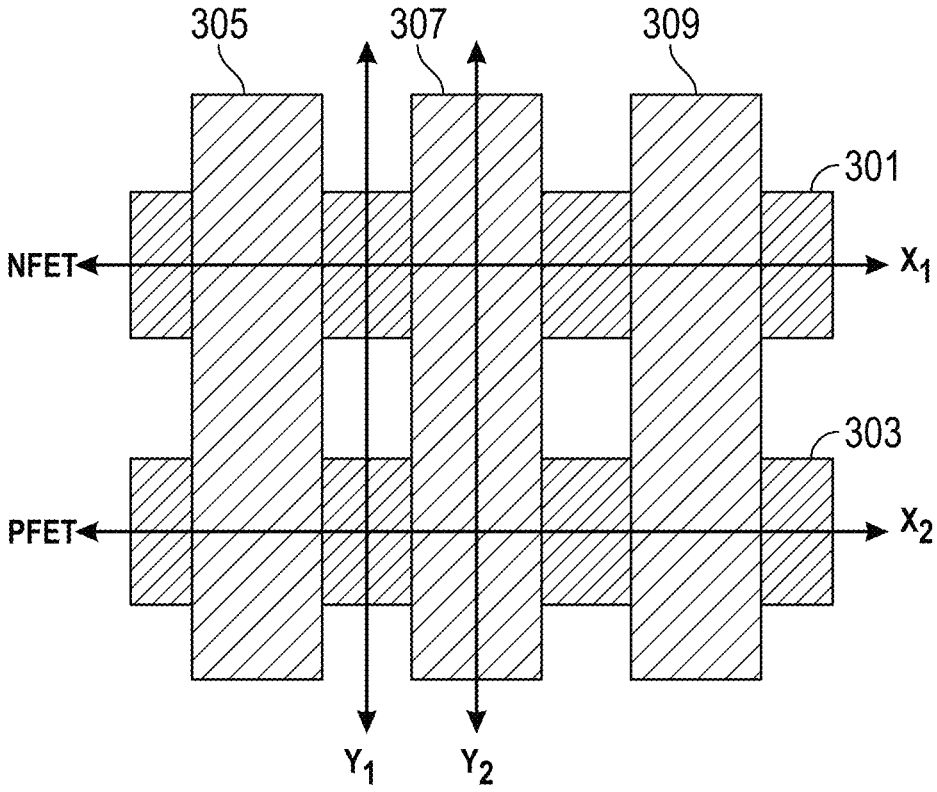
FIG. 1 is a top view of a semiconductor array structure, according to an aspect of the invention.
Figures 2A, 2B, 2C, 2D:
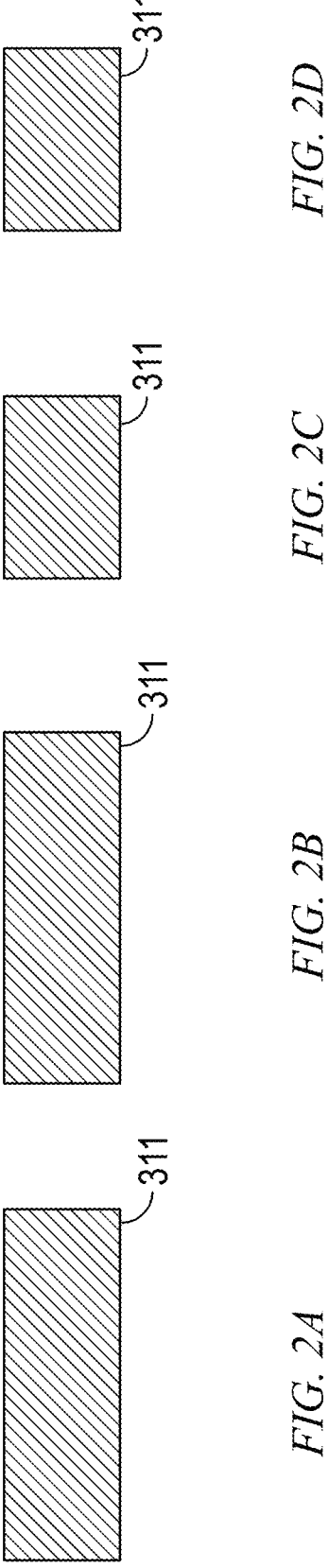
Figures 3A, 3B, 3C, 3D:
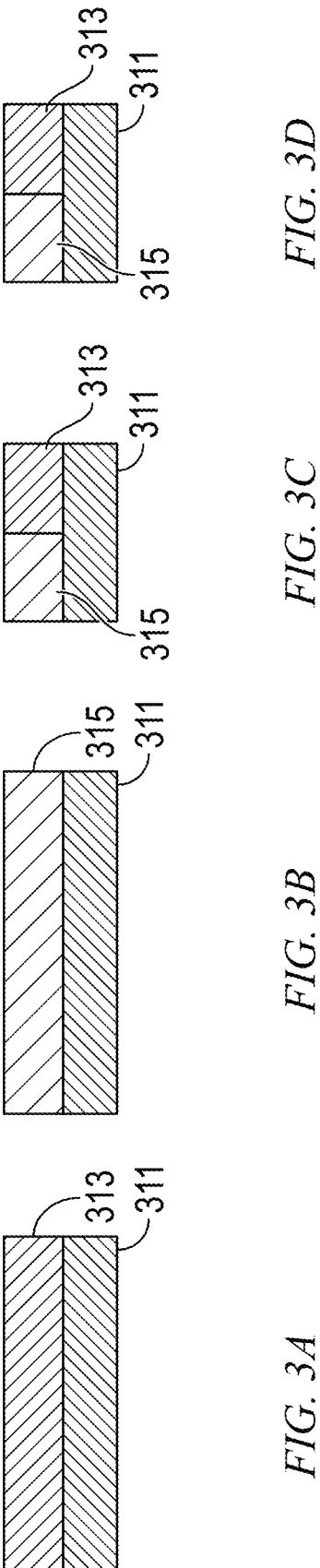
Figures 4A, 4B, 4C, 4D:
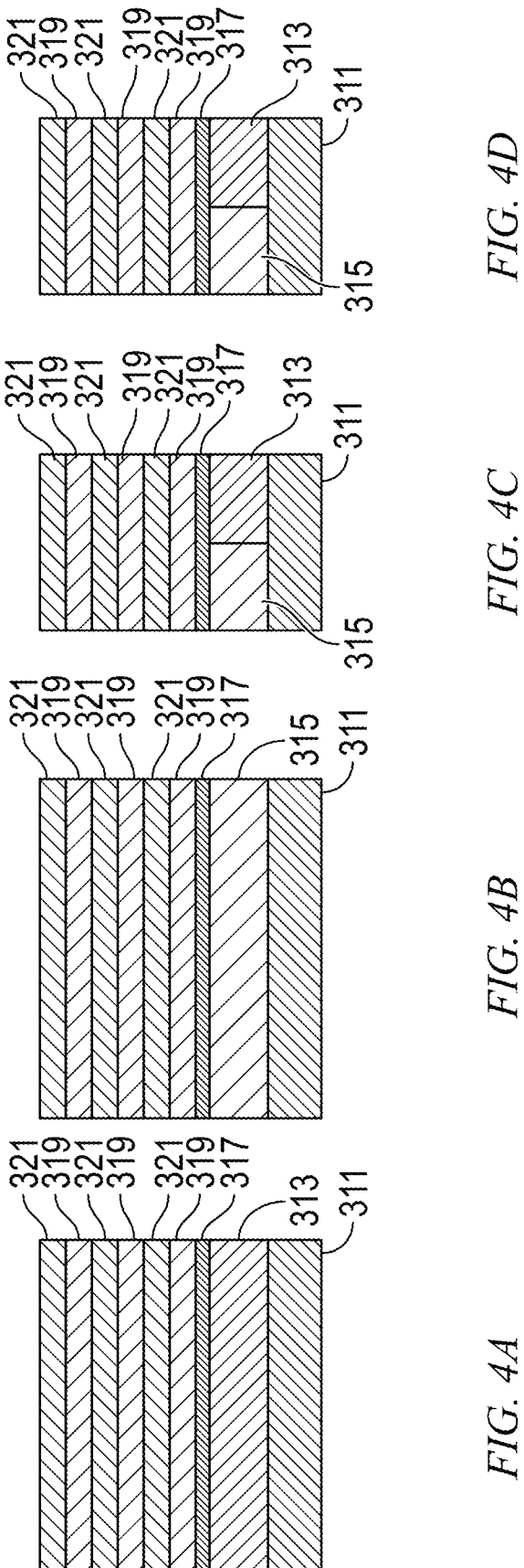
Figures 5A, 5B, 5C, 5D:
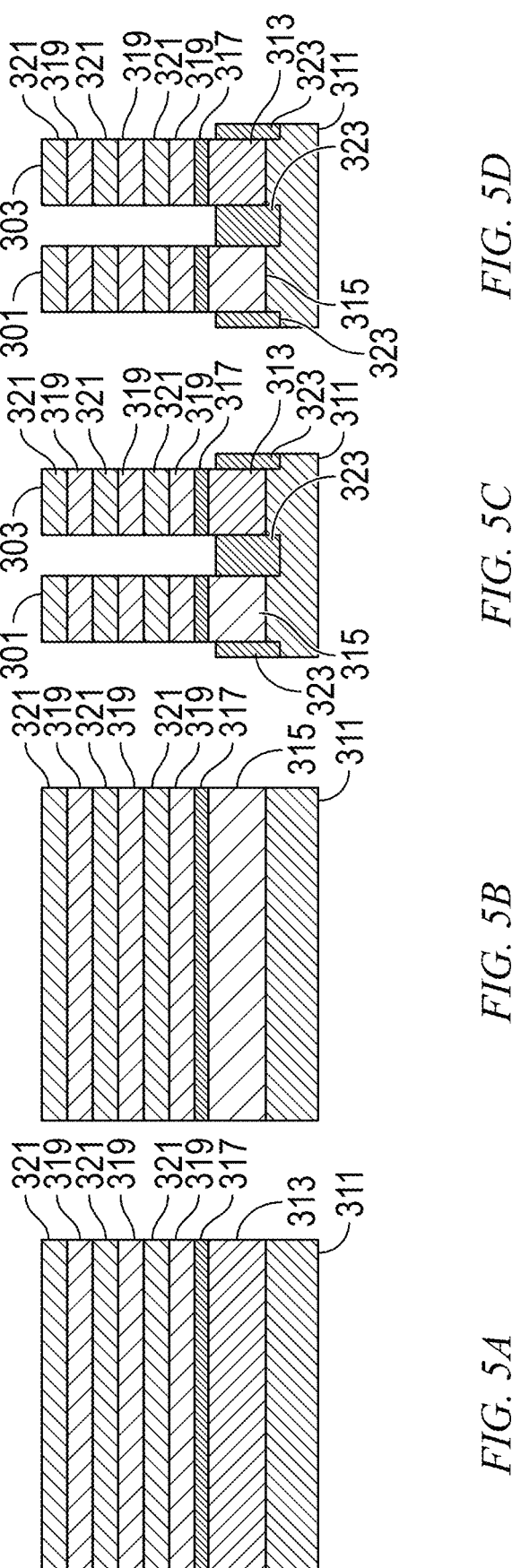
Figures 6A, 6B, 6C, 6D:
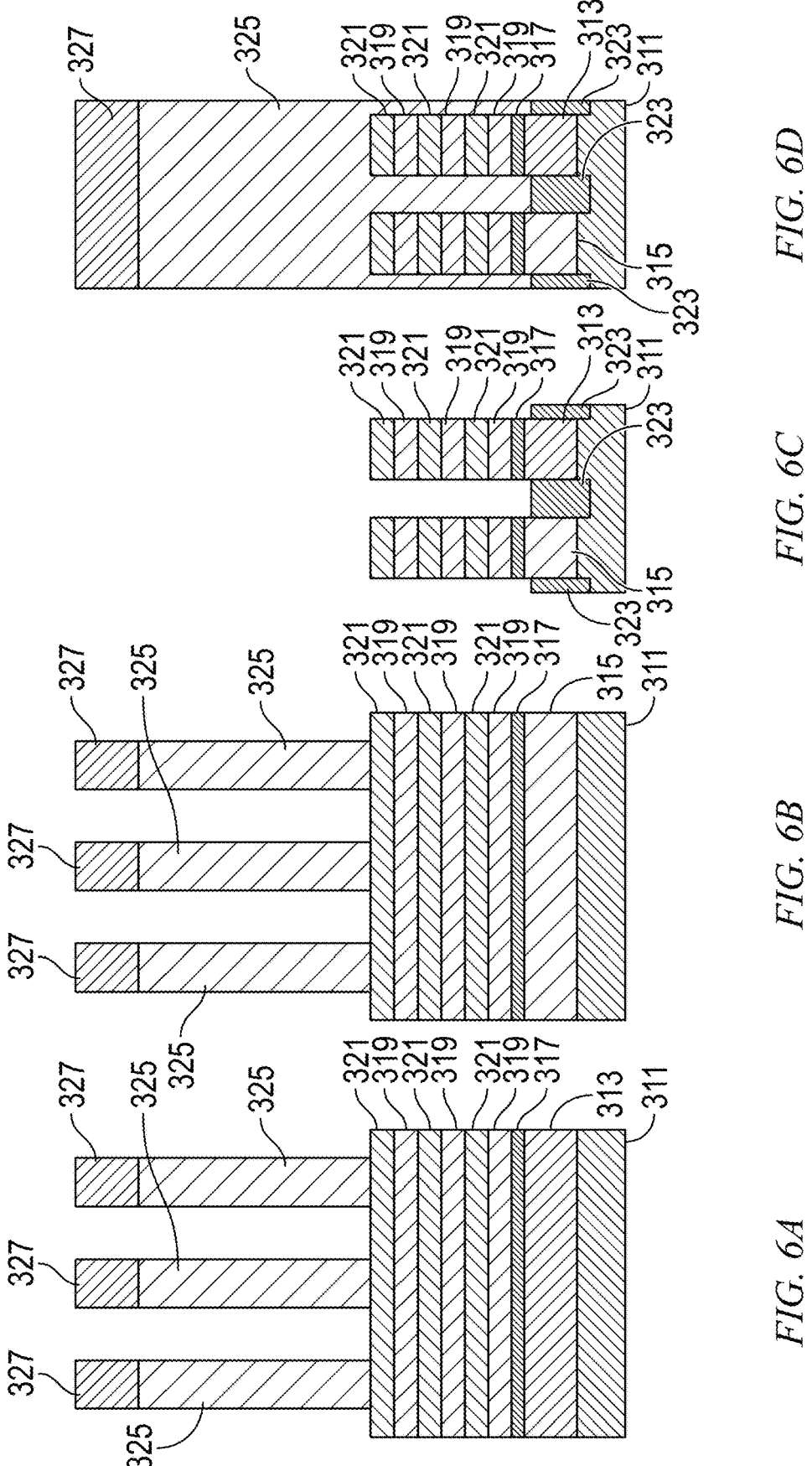

Consider now exemplary fabrication steps for an exemplary embodiment with single dielectric integration (i.e., same dielectric for gate spacer and SASI). Referring to FIG. 1 and FIGS. 2A-2B, in the top view of FIG. 1, the upper fin 301 is for the NFET; FIG. 2A is an NFET cross-gate cross section taken along line X1 in FIG. 1. The lower fin 303 is for the PFET; FIG. 2B is a PFET cross-gate cross section taken along line X2 in FIG. 1. Note the three gates 305, 307, 309. FIG. 2C shows a cross section in the S-D region taken along Y1 in FIG. 1, while FIG. 2D shows a cross section in the gate region taken along Y2 in FIG. 1 (i.e., inside the gate

307). FIGS. 2A-2D show a starting point with a (bulk) silicon substrate 311. Note that in FIGS. 2A-51D, the "A" figure is along line X1 in FIG. 1, the "B" is along line X2 in FIG. 1, the "C" is along line Y1 in FIG. 1, and the "D" is along line Y2 in FIG. 1. In FIGS. 3A-3D, implant a P-type dopant PTS (P-PTS) 313 over the NFET regions and an N-type dopant PTS (N-PTS) 315 over the PFET regions. The N and P wells can be seen next to each other cross-fin at Y1 and Y2.

In FIGS. 4A-4D, epitaxially grow a nanosheet stack. One or more embodiments employ an inner, sacrificial high Ge % SiGe layer, referred to herein as high Ge % SiGe layer 317. The remainder of the nanosheet stack includes alternating low Ge % SiGe layers 319 and Si layers 321. In prior art techniques that use a continuous dielectric layer under the device across the gate and source-drain regions, unlike one or more embodiments, the sacrificial SiGe is typically 10-15 nm thick, to provide a robust etch stop. In one or more embodiments, high Ge % SiGe layer 317 is thinner (about 3-8 nm) to facilitate controllable removal in the S-D region.

In general, high Ge % SiGe layer 317 can include SiGe with the Ge % ranging from 40-75% (in one specific example, with the Ge %=50%); while low Ge % SiGe layers 319 can include SiGe with the Ge % ranging from 15-35% (in one specific example, with the Ge %=25%). "Low" and "high" % are definite as measured with respect to each other.

In FIGS. 5A-5D, form the fins and shallow trench isolation (STI) 323. This can be done using known techniques, including depositing a hard mask (HM), patterning the HM, and transferring the pattern down into the nanosheet (NS) stack and substrate. Then, for the STI, carry out an oxide overfill, planarize, and reveal the fins with an oxide etch.

FIGS. 6A-6D show dummy gate formation. The dummy gates 325 can be made of polysilicon or amorphous silicon (a-Si). For example, carry out a-Si deposition over the structure of FIGS. 5A-5D, carry out planarization (e.g., CMP), deposit hard mask 327 and pattern same, then transfer the pattern down into the a-Si yielding the dummy gates 325.

Figures 7A, 7B, 7C, 7D:
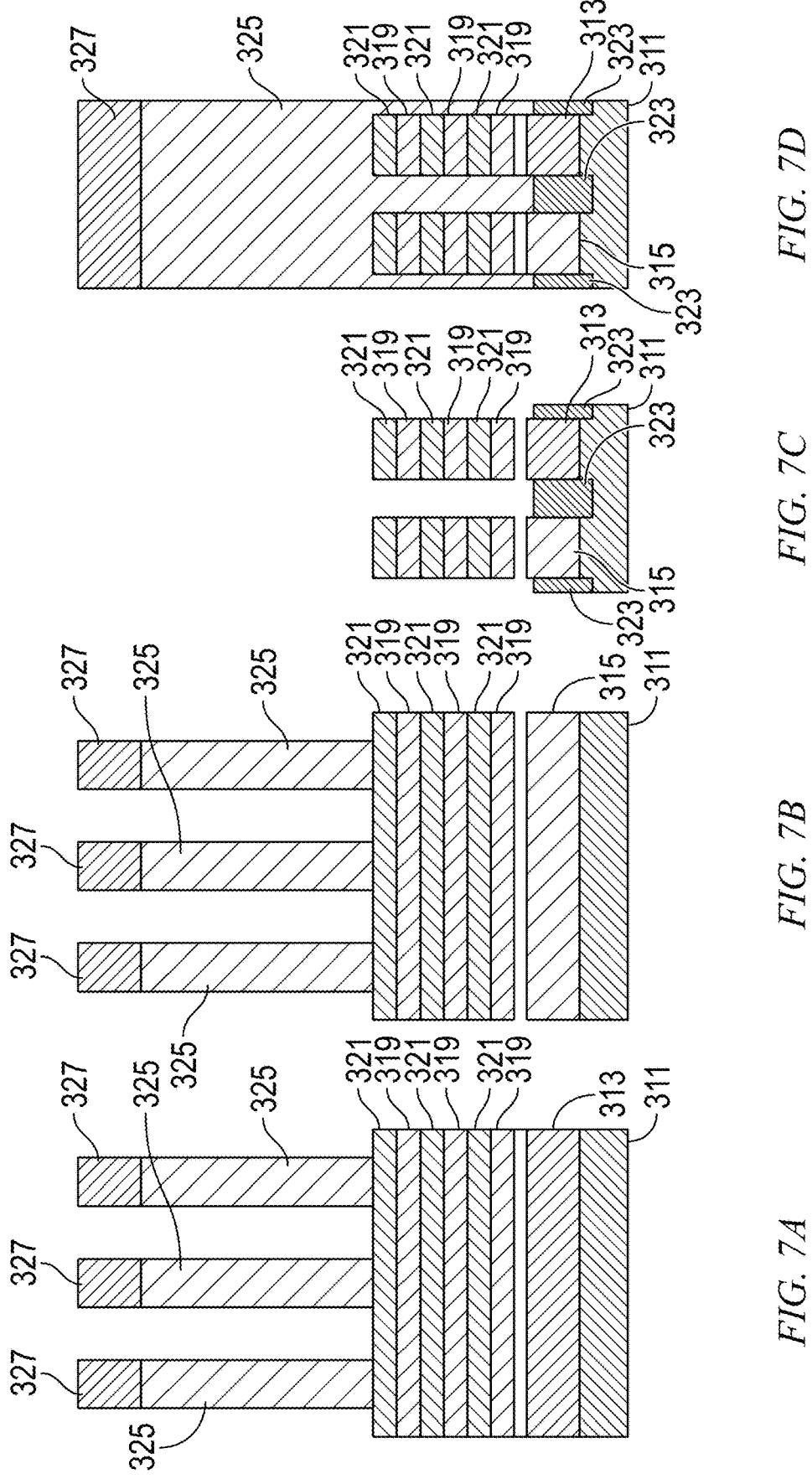
Figures 8A, 8B, 8C, 8D:
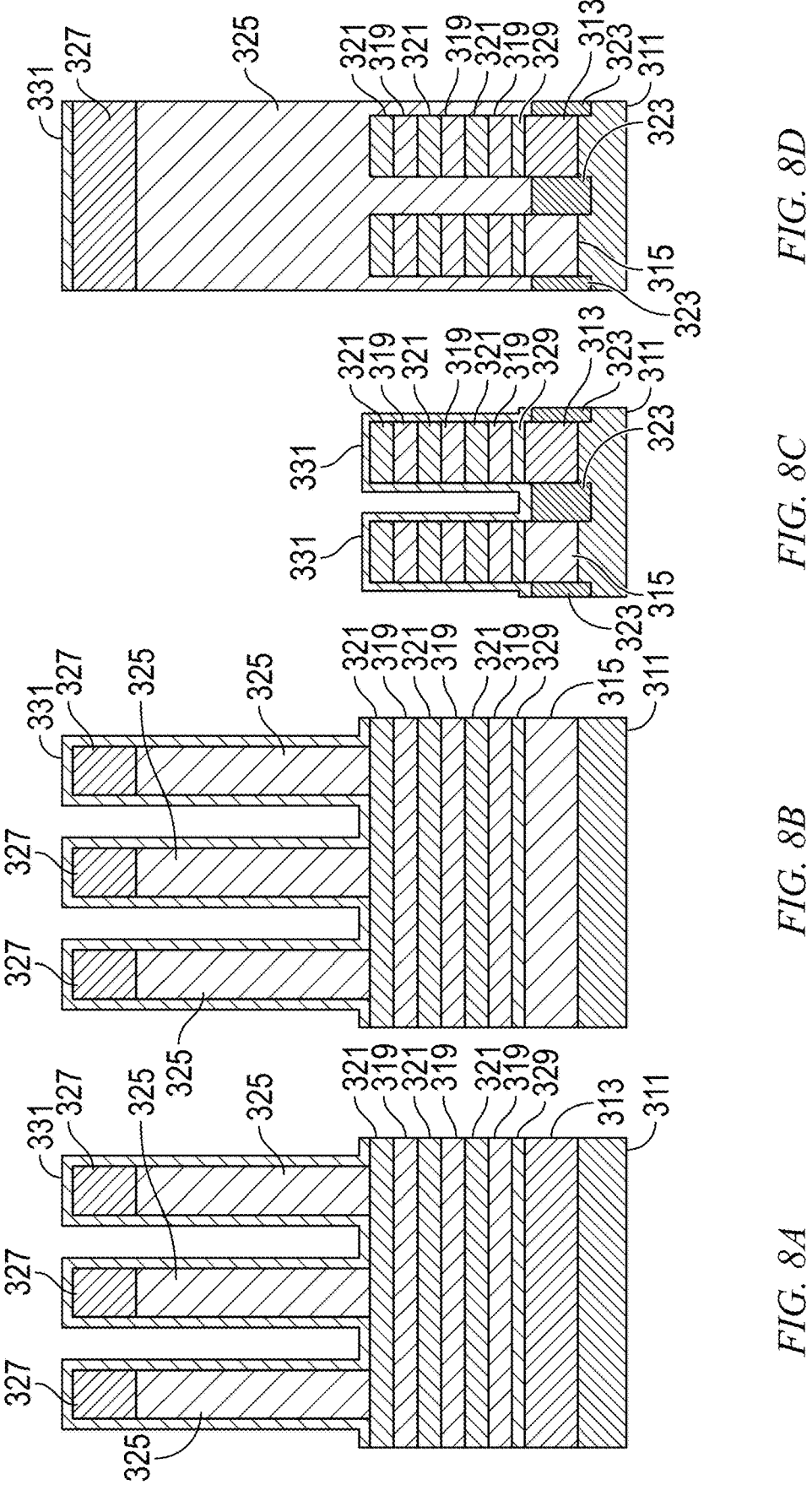

In FIGS. 7A-7D, selectively remove the high Ge % SiGe layer 317. For example, carry out selective removal of the high Ge % SiGe layer 317 selective to low Ge % SiGe layers 319, Si layers 321, and hard mask 327. For example, use a gas phase HCl process for this aspect. At this stage, the structure is not "floating"-all the nanosheets are supported by the a-Si as seen in FIG. 7D, so they are stable.

In FIGS. 8A-8D, carry out conformal gate spacer and SASI layer deposition, with the same material (e.g., SiOCN) used for both the SASI layer 329 and conformal gate spacer initial layer 331. In one or more embodiments, SASI layer 329 is thin (3-8 nm), the same as the high Ge % SiGe layer 317 that it replaces.

Figures 9A, 9B, 9C, 9D:
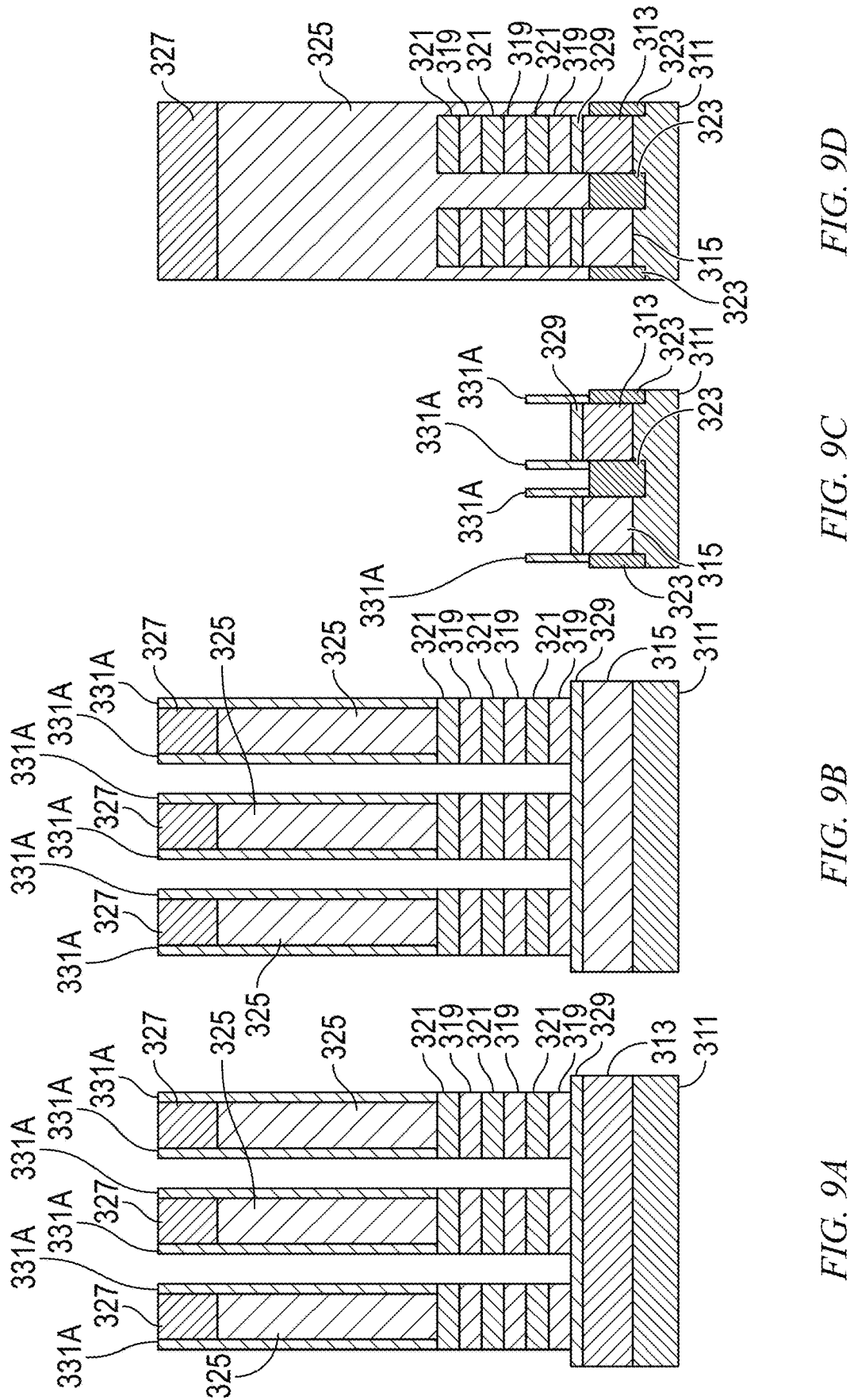
Figures 10A, 10B, 10C, 10D:
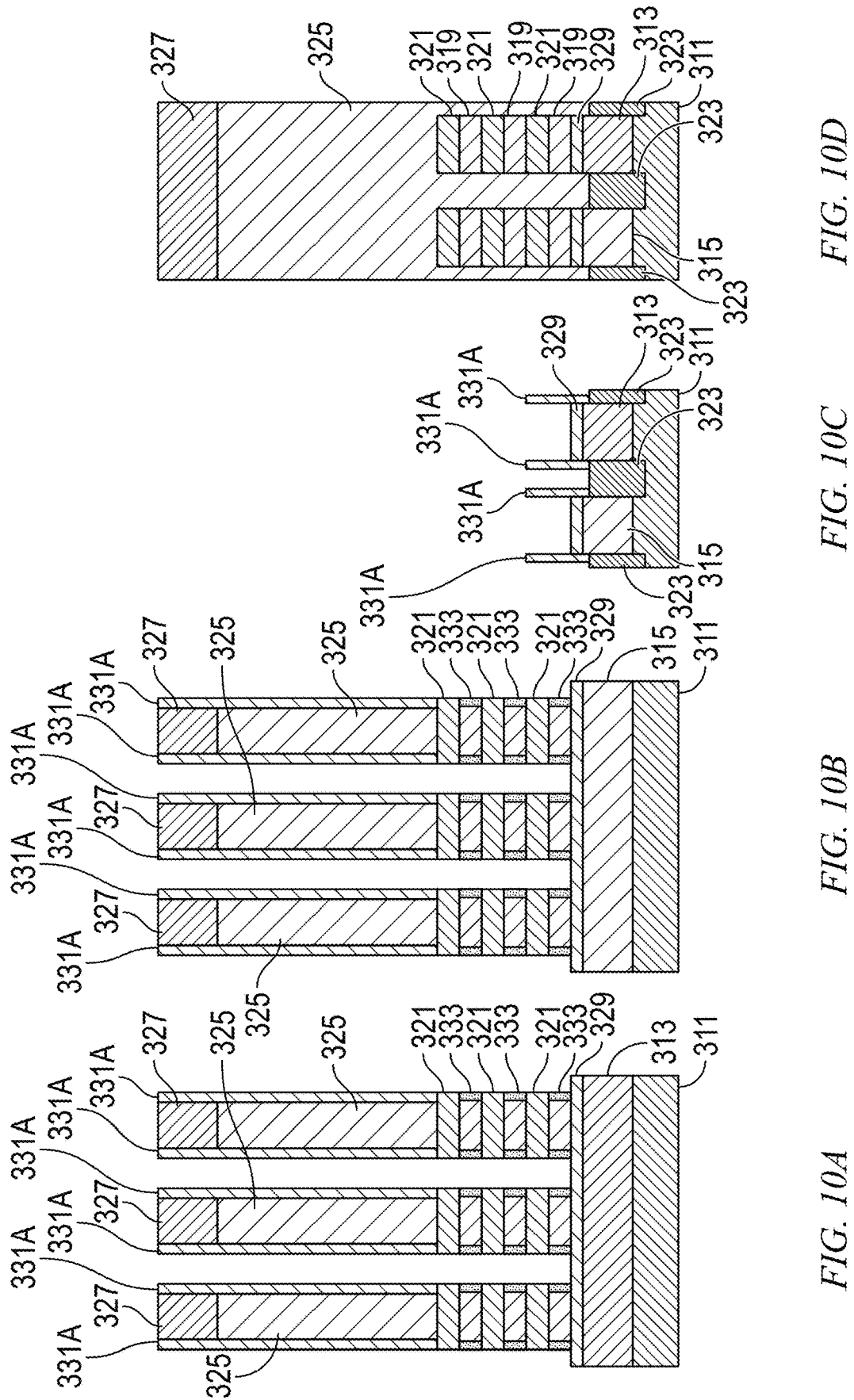

Referring now to FIGS. 9A-9D, carry out anisotropic etching of the spacers and recessing of the fins. Material is removed from the horizontal surfaces of conformal gate spacer initial layer 331, which re-exposes the NS stack in between the gates. The remaining portions of the conformal gate spacer initial layer 331 are designated as conformal gate spacers 331A. The fins are then recessed (i.e., etch through the NS stack as seen in FIGS. 9A, 9B, and 9C). In one or more embodiments, the SASI layer 329 (a thin dielectric) acts as a selective etch stop, enabling optimization of the fin sidewall vertical profile while reducing the risk of over-etching into the substrate.

FIGS. 10A-10D depict inner spacer formation. Selectively indent the low Ge % SiGe layers 319, then carry out conformal deposition of inner spacer such as SiBCN to form inner spacers 333. The indented low Ge % SiGe layers are not separately numbered in FIGS. 10A-10D, to avoid clutter.

Figures 11A, 11B, 11C, 11D:
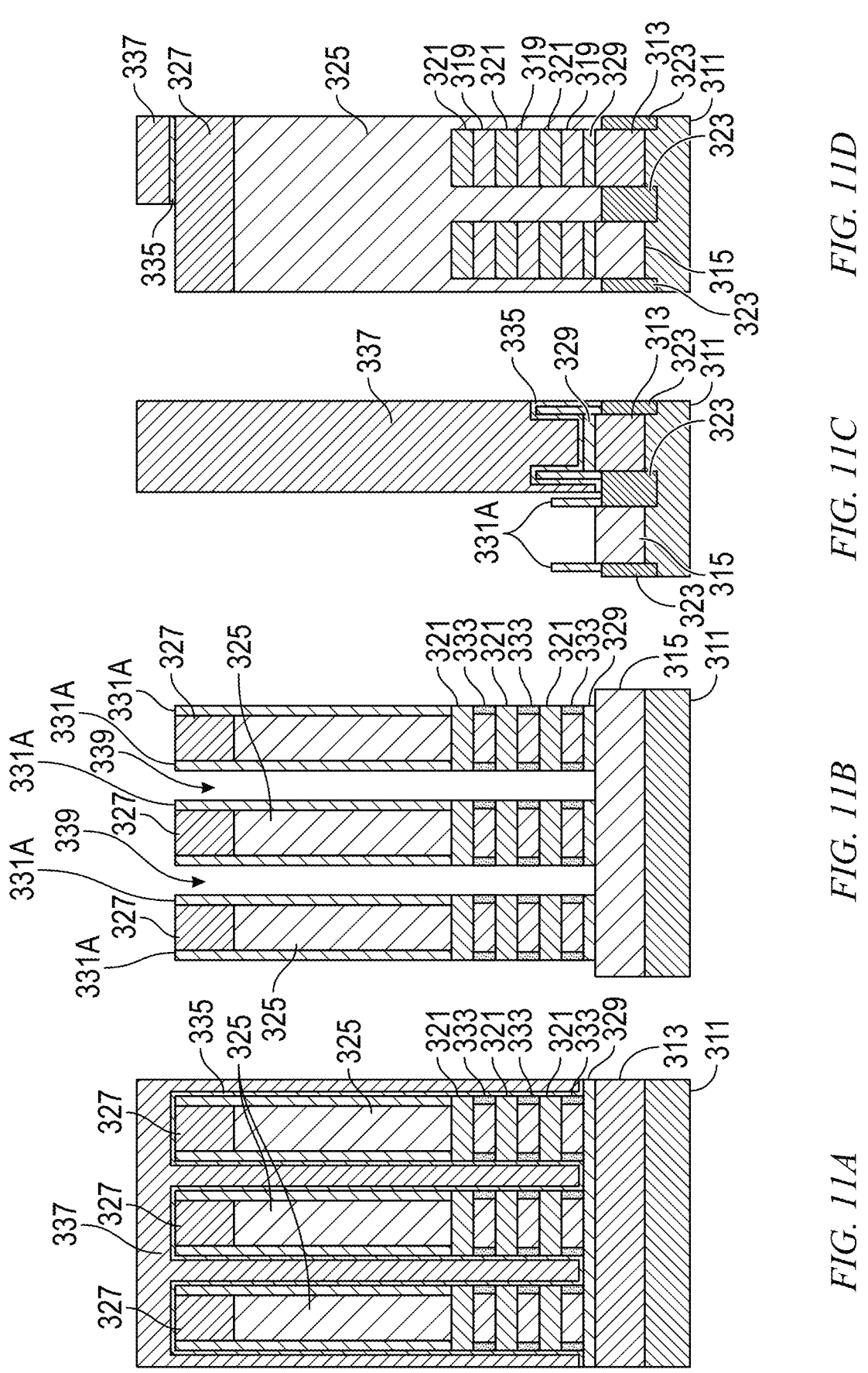

In FIGS. 11A-11D, deposit a patterning liner 335 such as AlO$_x$ on the whole wafer, both the NFETs and PFETs. Then deposit OPL 337 over the whole wafer, and carry out patterning for the PFET S-D epitaxy as seen in FIG. 11B. Keeping the NFETs protected (the liner 335 and OPL 337 are still present in FIG. 11A), selectively open the PFETs by removing the OPL and the patterning liner on the PFET only. Carry out a pre-cleaning process prior to epitaxial growth. Remove the SASI layer in the cavities 339 over the N-PTS 315. Strip the OPL before entering the epitaxy chamber. Numbering of some fine details, such as in the nanosheets stacks, is omitted from some of FIGS. 11A-11D and some other figures to avoid clutter.

Note, regarding FIGS. 11A-11D, in an alternative, in FIGS. 9A-9D, after FIN recess, SASI layer 329 is exposed and can be removed at that point or also after forming the inner spacer. This may be less desirable than removing in FIGS. 11A-11D because the substrate is potentially exposed to damage in downstream processing. See discussion of FIGS. 50A-51D below. It is worth noting, with regard to the conformal gate spacers 331A, comparing FIG. 10C to FIG. 11C, the conformal gate spacers 331A located over the N-PTS 315 are reduced in height from FIG. 10C to FIG. 11C. The material of SASI layer 329 is removed, for example, with directional reactive ion etching (RIE) which also lowers the height of the conformal gate spacers 331A located over the N-PTS 315.

In FIGS. 12A-12D, enter the epitaxy chamber, and carry out epitaxial growth for the PFET. Note the resulting PFET S-D epitaxy 341. In a non-limiting example, the PFET S-D epitaxy is SiGe doped with Boron. The substrate (i.e., the N-PTS 315 thereof) is exposed but not deeply recessed. The extent of the PFET is from the upper edge of the nanosheet stack to the substrate (i.e., the N-PTS 315 thereof). Then, exit the epitaxy chamber and strip the patterning liner 335 on the NFET side.

Figures 13A, 13B, 13C, 13D:
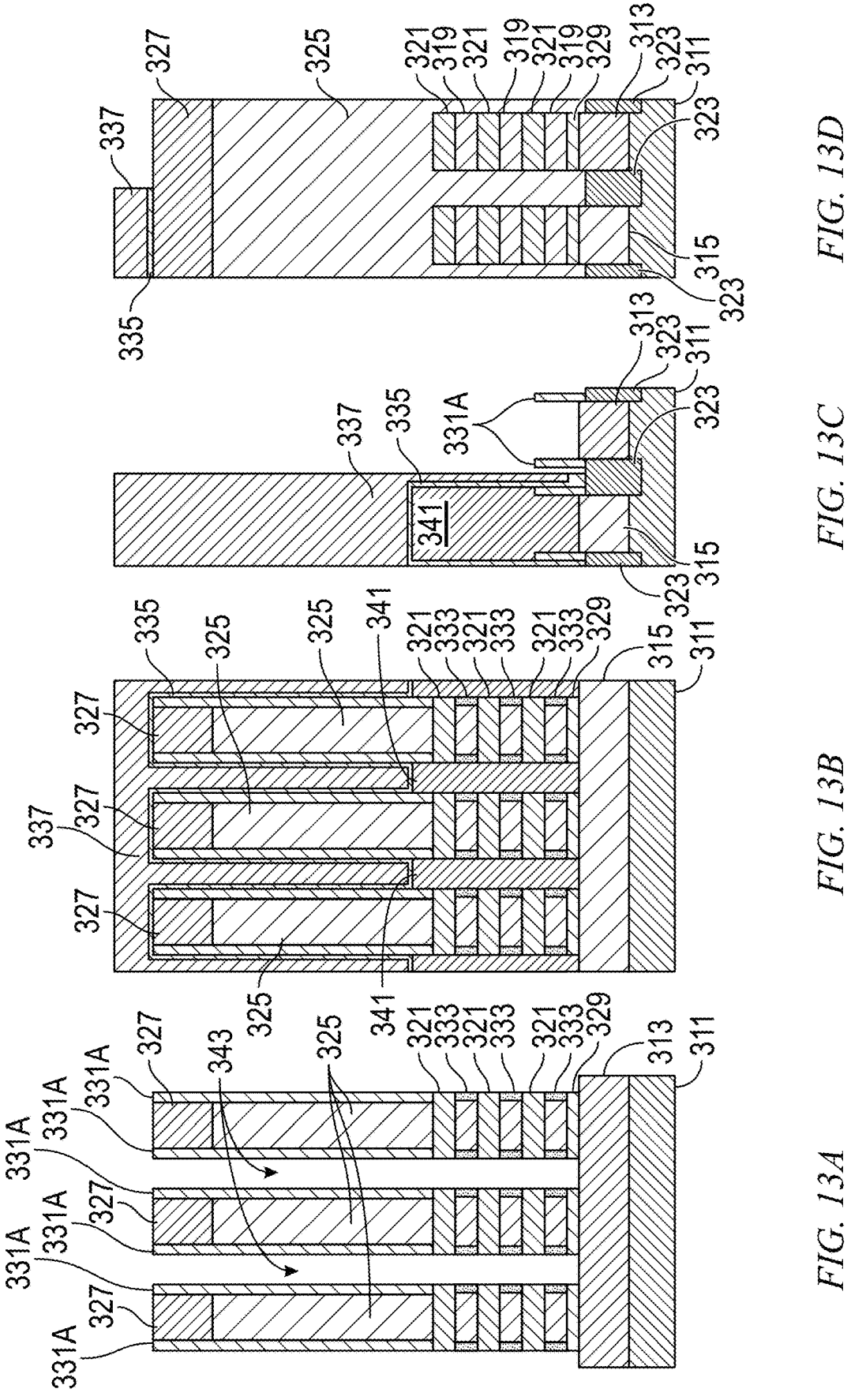
Figures 14A, 14B, 14C, 14D:
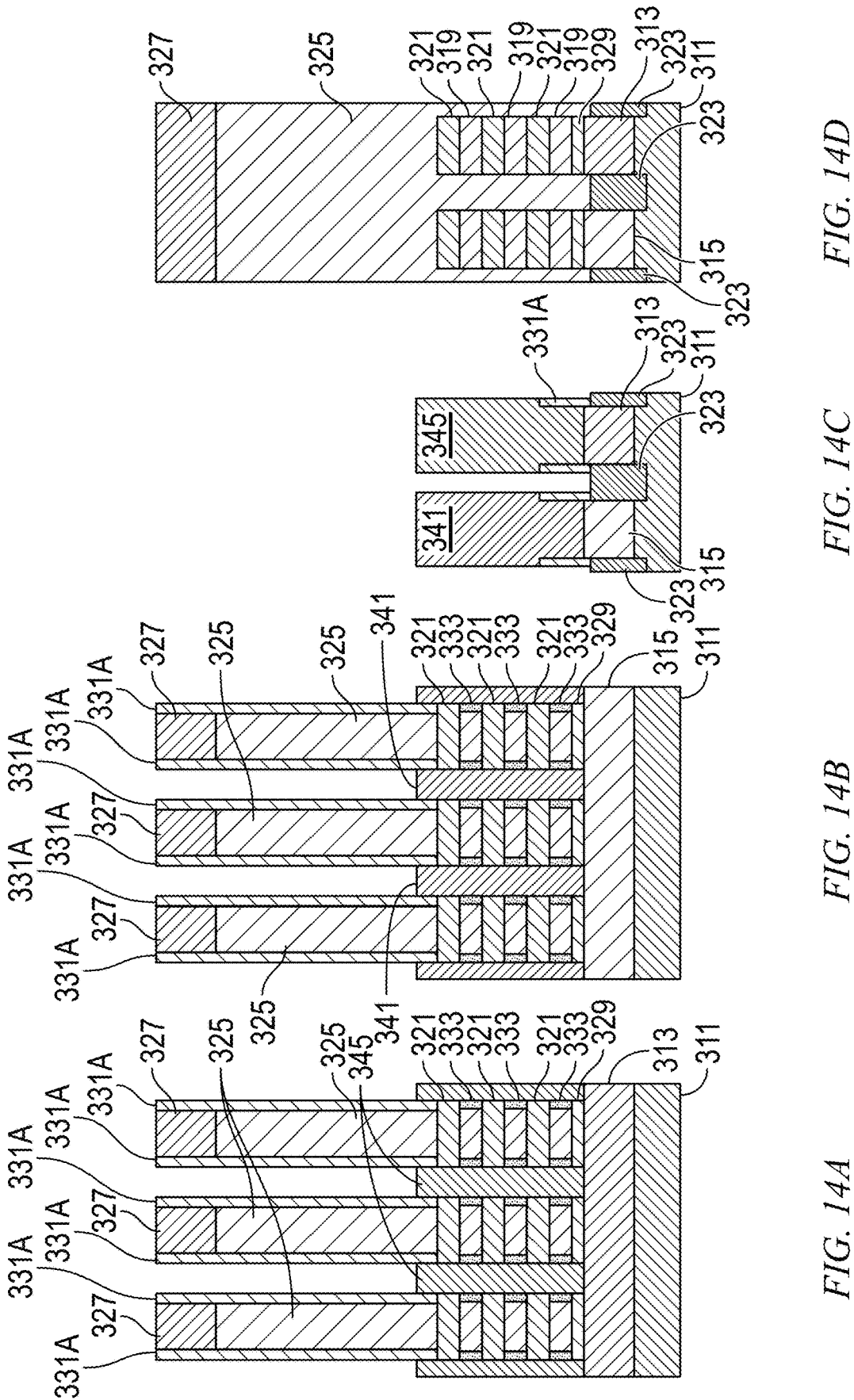

In FIGS. 13A-13D and 14A-14D, "reverse" the process just described. In FIGS. 13A-13D, deposit a patterning liner 335 such as AlO$_x$ on the whole wafer, both the NFETs and PFETs. Then deposit OPL 337 over the whole wafer, and carry out patterning for the NFET S-D epitaxy as seen in FIG. 13A. Keeping the PFETs protected (the liner 335 and OPL 337 are still present in FIG. 13B), selectively open the NFETs by removing the OPL and the patterning liner on the NFET only. Carry out a pre-cleaning process prior to epitaxial growth. Remove the etch stop layer in the cavities 343 over the P-PTS 313. Strip the OPL before entering the epitaxy chamber. As part of the preclean, remove the SASI layer 329 at the bottom of the S-D region for the NFETs, as seen in FIG. 13A.

In FIGS. 14A-14D, enter the epitaxy chamber, and carry out epitaxial growth for the NFET. Note the resulting NFET S-D epitaxy 345. In a non-limiting example, the NFET S-D epitaxy is Si doped with Phosphorous. Then, exit the epitaxy chamber and strip the patterning liner 335 on the PFET side.

After this point, given the teachings herein, known processes can be employed by the skilled artisan to obtain the final structure shown in FIGS. 15A-15D. The known processes include dummy gate open, dummy gate removal, channel release, self-aligned contact (SAC) cap and trench metal contact formation. In particular, deposit ILD 353, planarize down to reopen the dummy gates, and carry out selective dummy gate removal and channel release. Deposit HKMG stacks 347, self-aligned contact (SAC) caps 349, and the trench metal contacts 351 to the S-D regions. The skilled artisan will be familiar with the "dummy gate" process for forming HKMGs. More generally, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term.

Thus, the final structure shown in FIGS. 15A-15D includes P-PTS 313 and N-PTS 315 which run from right under the nanosheet stack into the Si substrate 311. The PFET region has N-PTS 315, while the NFET region has P-PTS 313. Thus, the dopant type of the PTS is opposite to that of the adjacent S-D epi. SASI layer 329, which is electrically insulating, is located in the regions of the HKMG stacks 347 and the inner spacers 333, in-between the HKMG stacks 347 and the inner spacers 333 and the Si substrate 311 with the corresponding PTS. As used herein, the "gate region" is the width of the HKMG stacks 347. The region immediately to the left and right under the conformal gate spacers 331A is called the "extension region." In the embodiment of FIGS. 15A-15D, the SASI layer 329 is the same material as the conformal gate spacers 331A.

As noted above, in an alternative, begin with the structure of FIGS. 9A-9D. After the fin recess depicted therein, SASI layer 329 is exposed and can be removed at that point or also after forming the inner spacer. As noted, this may be less desirable than removing in FIGS. 11A-11D because the substrate is potentially exposed to damage and additional recess in downstream processing. Referring now to FIGS. 50A-50D, consider, therefore, a method variation of the embodiment discussed with respect to FIGS. 1-15D, wherein the self-aligned etch of the SASI layer 329 is performed before the formation of the inner spacers 333. This technique could also be applied to other embodiments discussed herein. FIGS. 51A-51D show the structure of FIGS. 50A-50-D after formation of the inner spacers 333, using processes similar to those described with respect to FIGS. 10A-10D. The final structure similar to FIGS. 15A-15D can then be obtained using steps similar to those described with respect to FIGS. 11A-15D, except that the SASI layer 329 has already been removed in the appropriate areas.

Consider now exemplary fabrication steps for another exemplary embodiment with multiple dielectric integration (i.e., different dielectric for conformal gate spacers and SASI layers). Referring again to FIG. 1, and also to FIGS. 16A-16B, repeat the steps of FIGS. 2A-6D. Begin with the selective removal of the high Ge % SiGe layer 317 as per FIGS. 16A-16D, as described with respect to FIGS. 7A-7D.

In FIGS. 17A-17D, deposit conformal SASI layer material 401—for example, use atomic layer deposition (ALD) (a non-limiting example is the IRad® (registered mark of Tokyo Electron Limited Tokyo JAPAN) type of ALD) to deposit SiO$_2$ or a low-k material such as SiOC, SiOCN, SiBCN, or the like, over the gates and fins and into cavities.

In FIGS. 18A-18D, carry out a selective isotropic removal of the SASI layer material 401, leveraging the pinch-off mechanism. Because it is formed in buried cavities, a conformal etch can be carried out to remove the SASI layer material 401 on exposed surfaces but the buried part (where the high Ge % SiGe was removed) will be retained. The remaining portion forms the SASI layer 401A. Furthermore regarding the pinch-off mechanism, with particular attention to FIGS. 16C, 17C, and 18C, note the empty cavity under the stack in FIG. 16C. Further note the deposition of the conformal material (SASI layer material 401) in FIG. 17C;

the conformal material extends over the entire wafer and pinches off the cavity under the stack. Carry out an isotropic etch-back of SASI layer material 401. It will be removed on all the exposed surfaces. However, the pinched-off portion under the stack is protected by the stack and the PTS and is not affected by the etch-back.

In FIGS. 19A-19D, carry out deposition of conformal gate spacer dielectric material 403; for example, Low-K material (with k-value<3.9). In this embodiment, there are two different materials, $SiO_2$ for the SASI layer 401A 401 and a Low-K material such as SiOCN for the conformal gate spacer dielectric material 403.

Figures 20A, 20B, 20C, 20D:
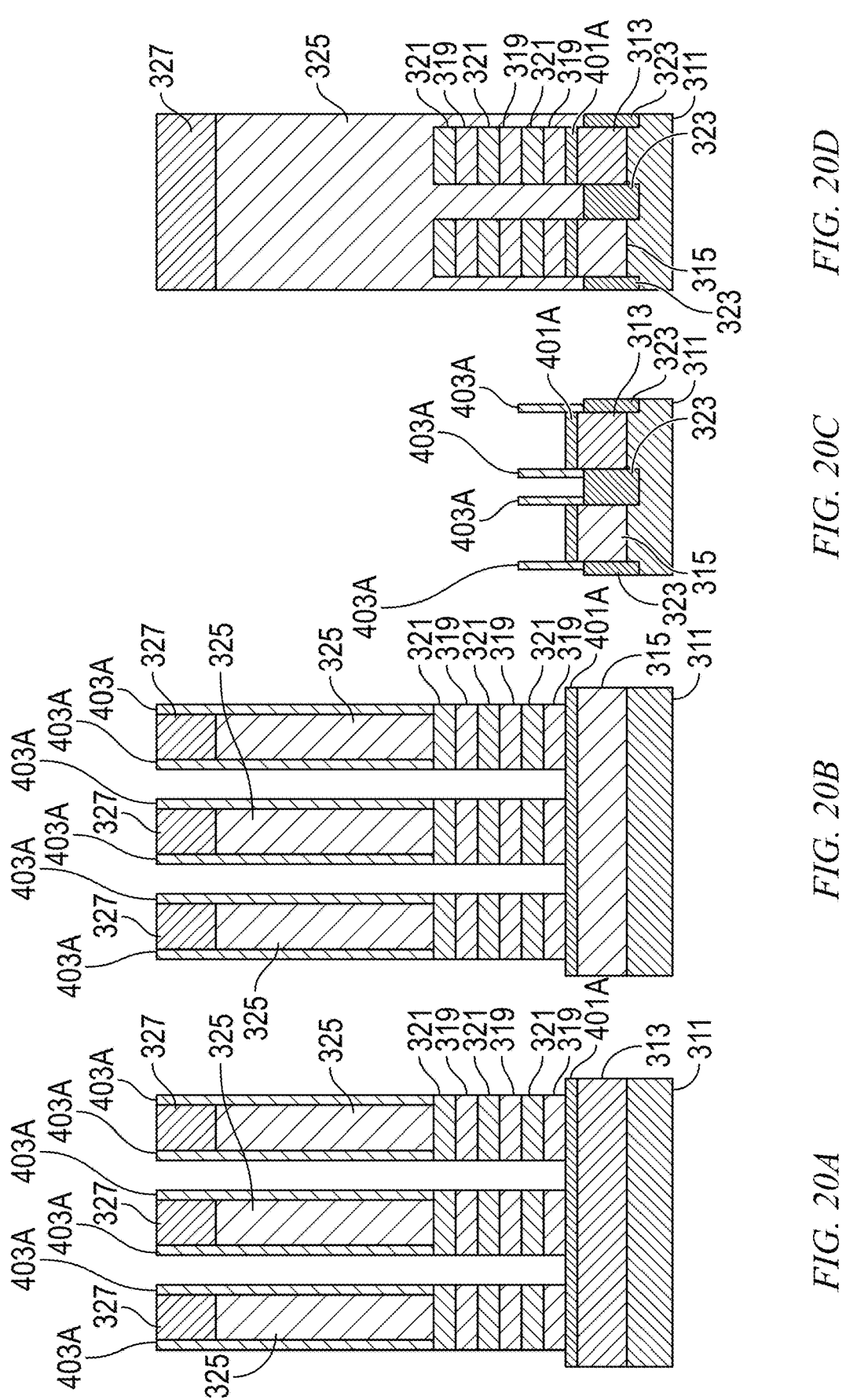
Figures 21A, 21B, 21C, 21D:
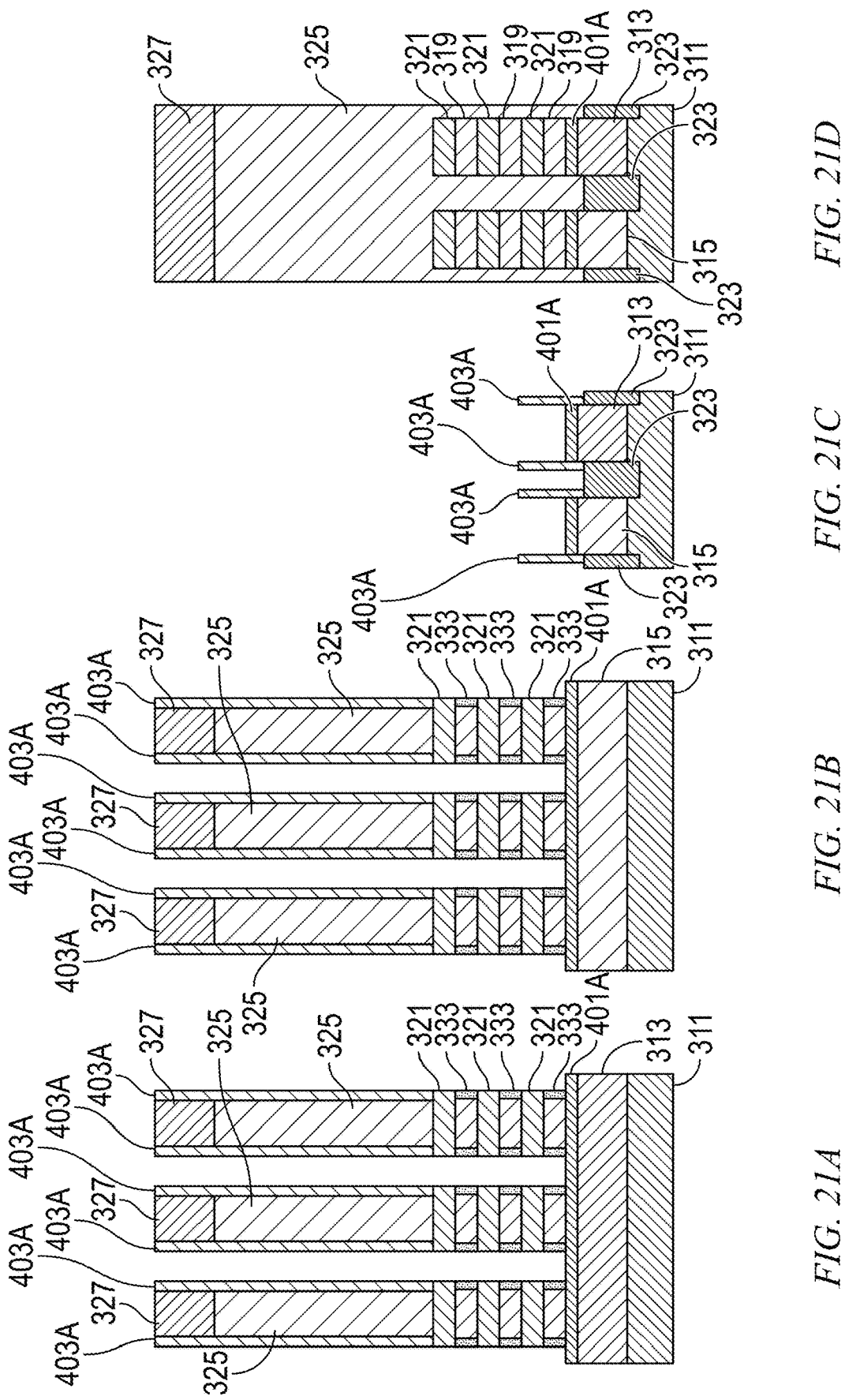
Figures 22A, 22B, 22C, 22D:
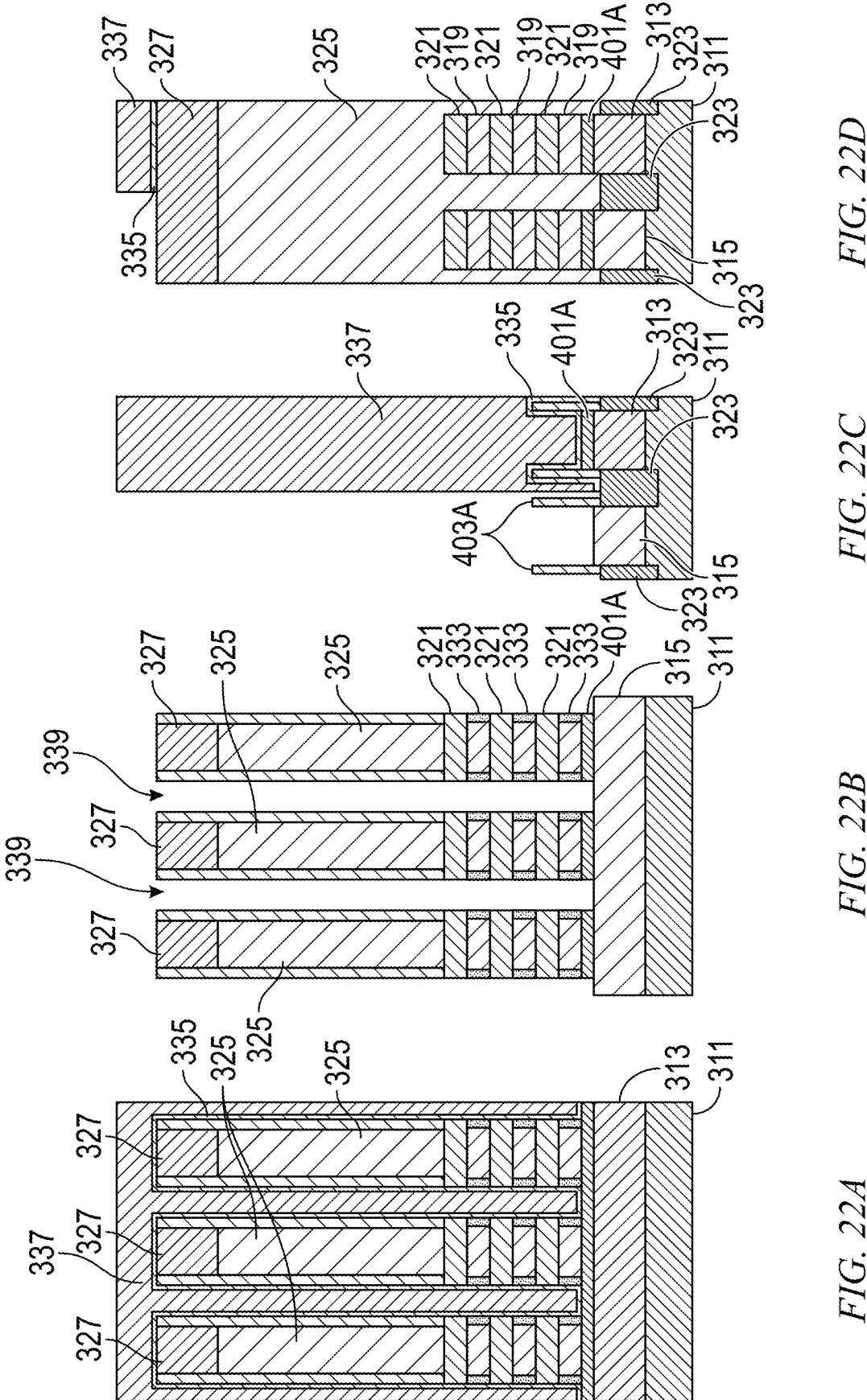
Figures 23A, 23B, 23C, 23D:
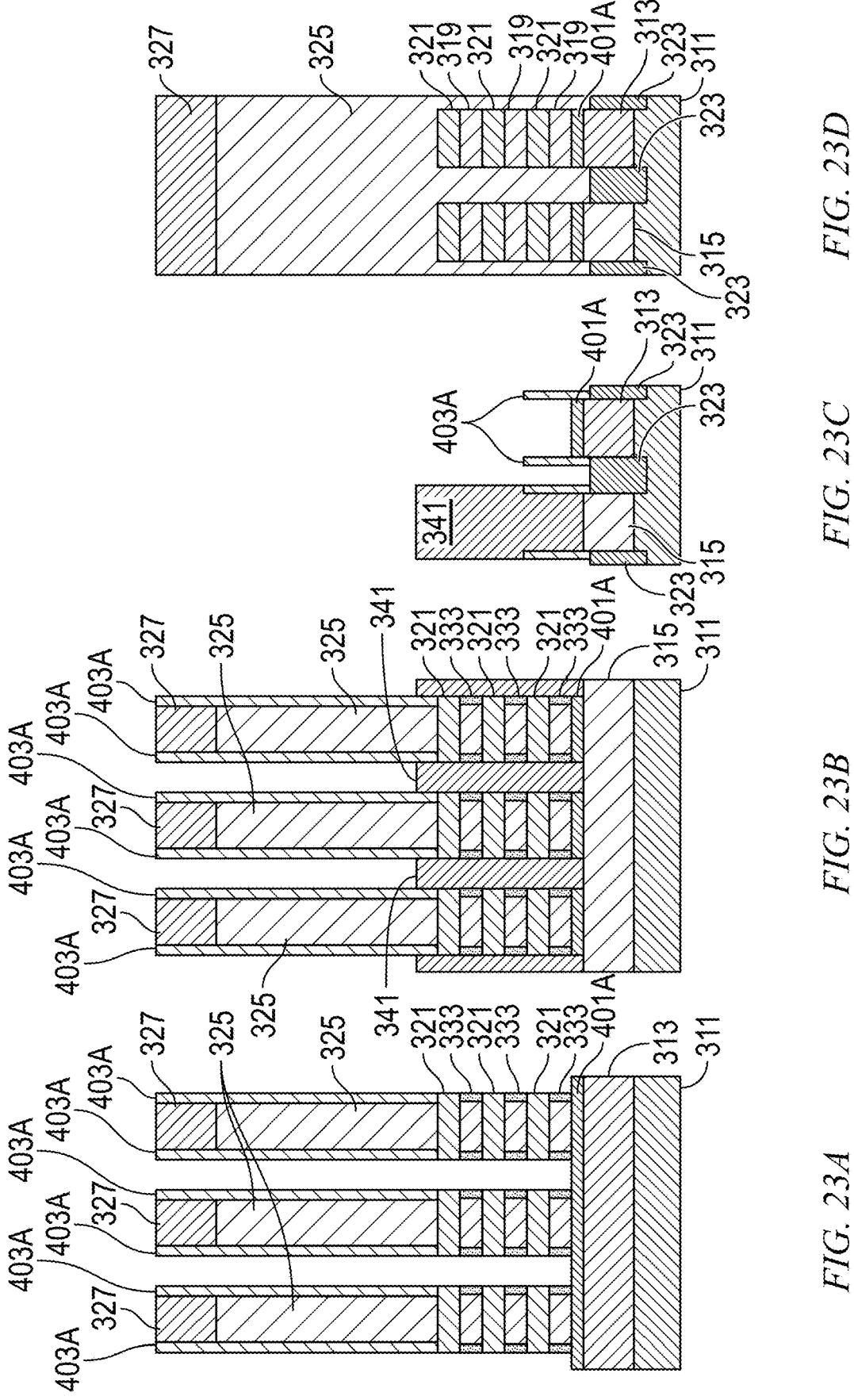
Figures 24A, 24B, 24C, 24D:
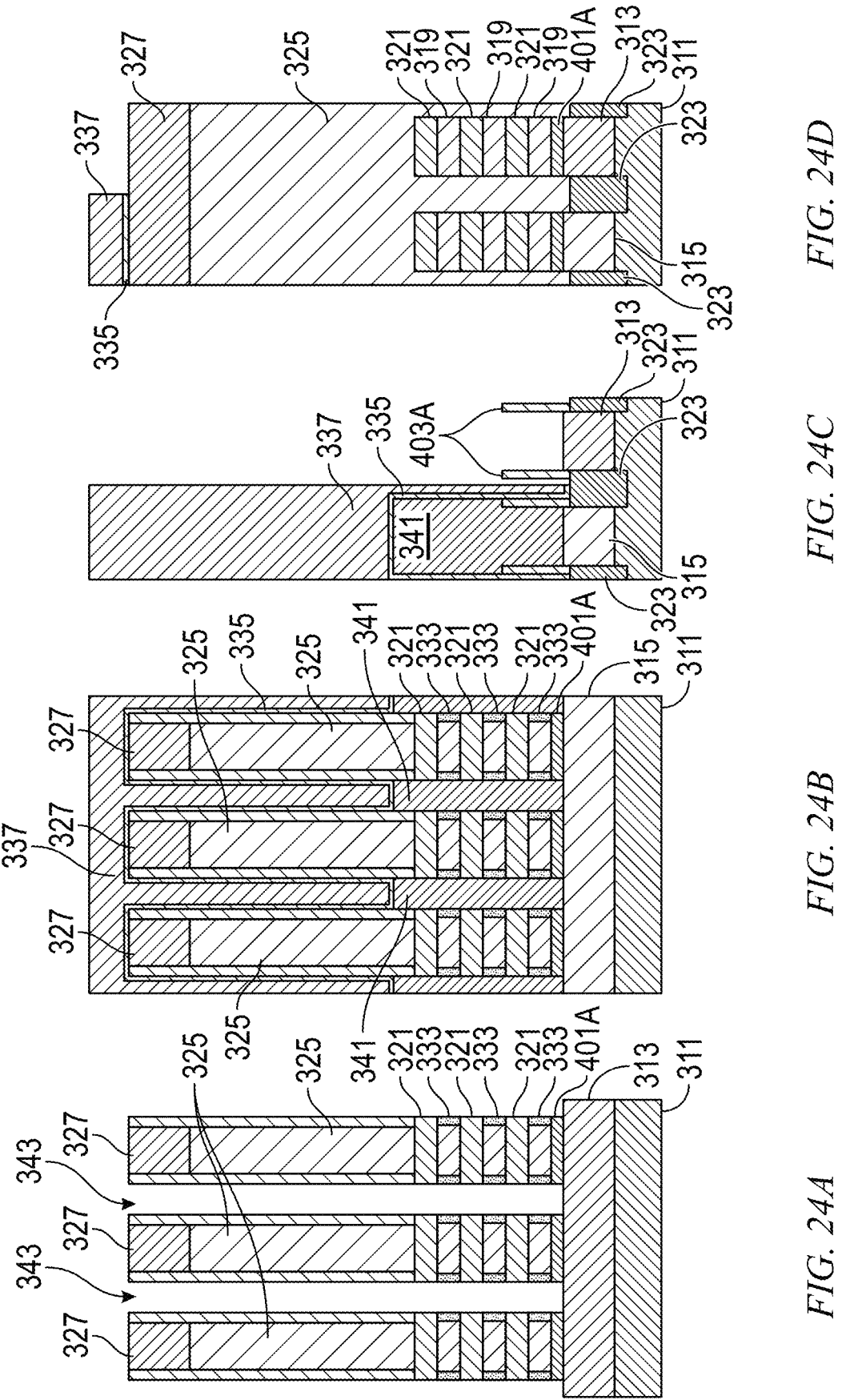
Figures 25A, 25B, 25C, 25D:
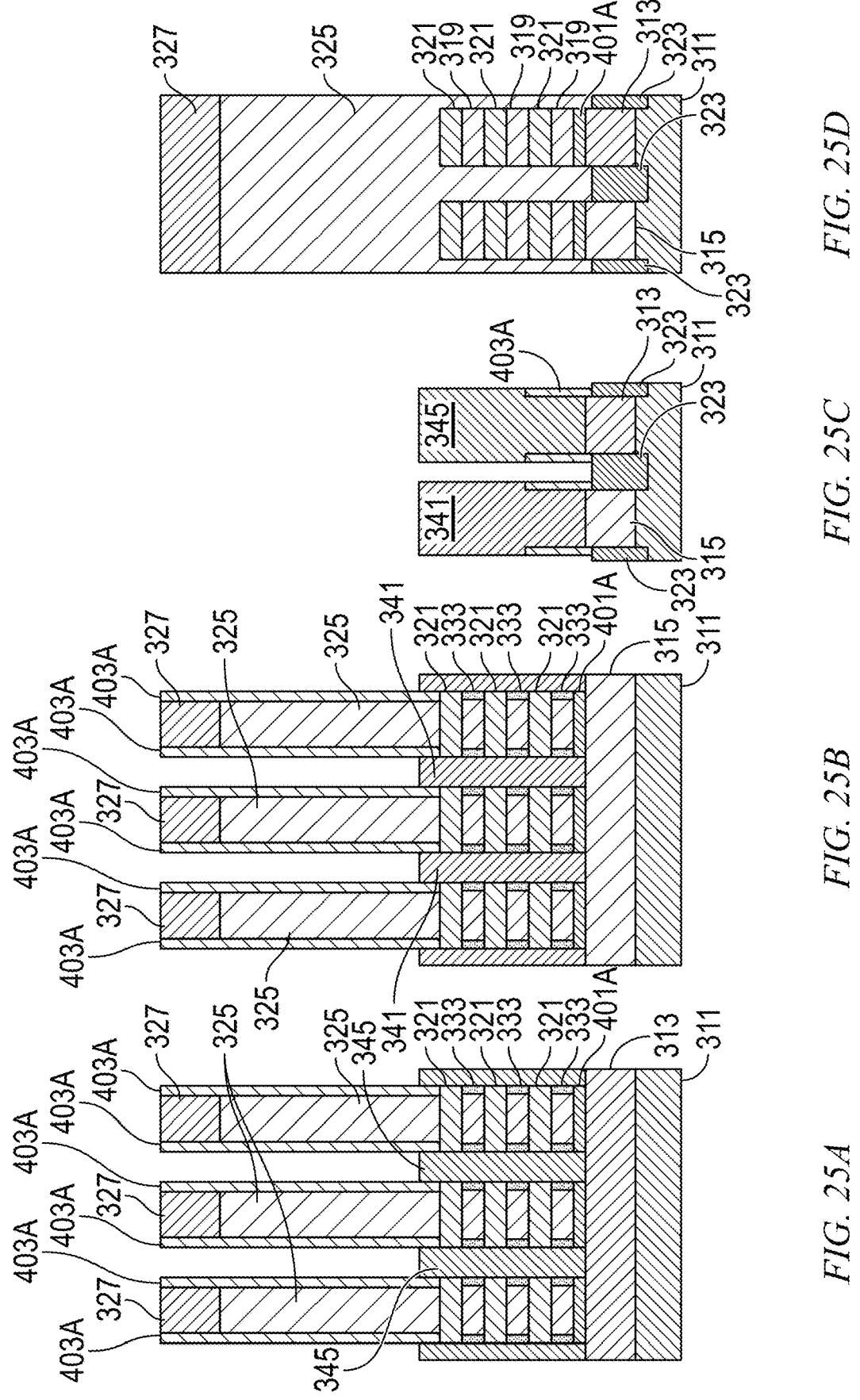
Figures 26A, 26B, 26C, 26D:
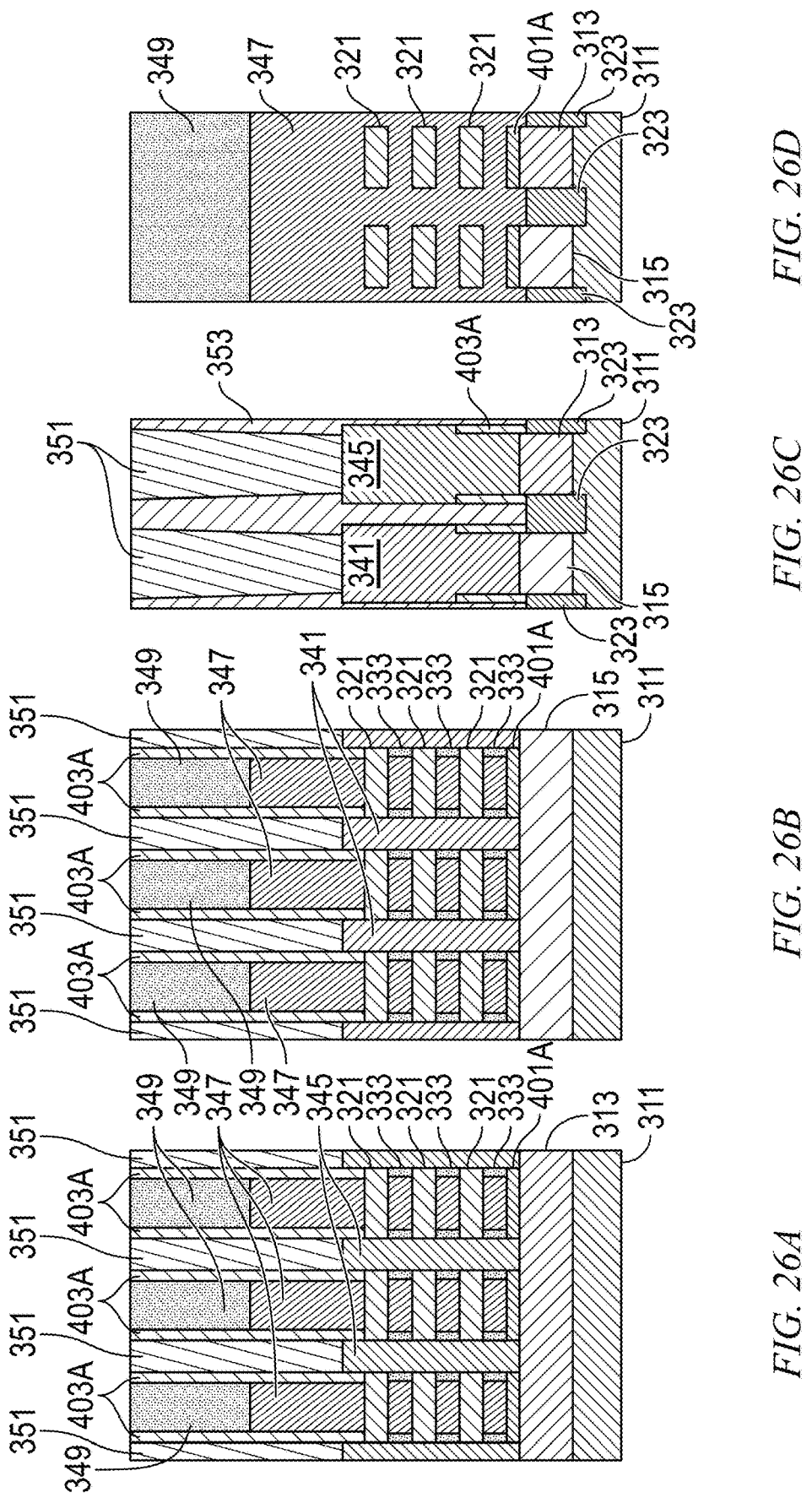
Figures 27A, 27B, 27C, 27D:
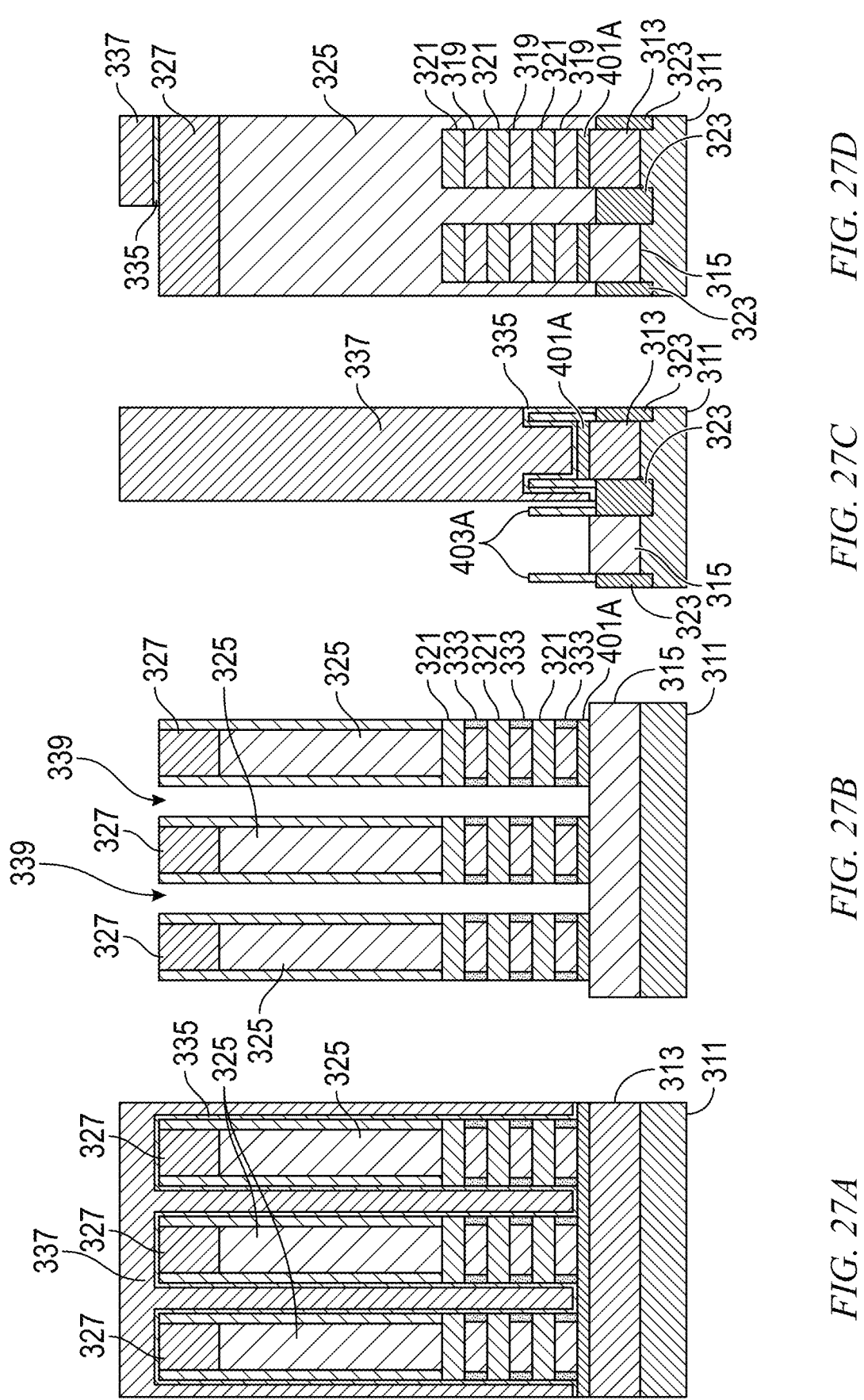
Figures 28A, 28B, 28C, 28D:
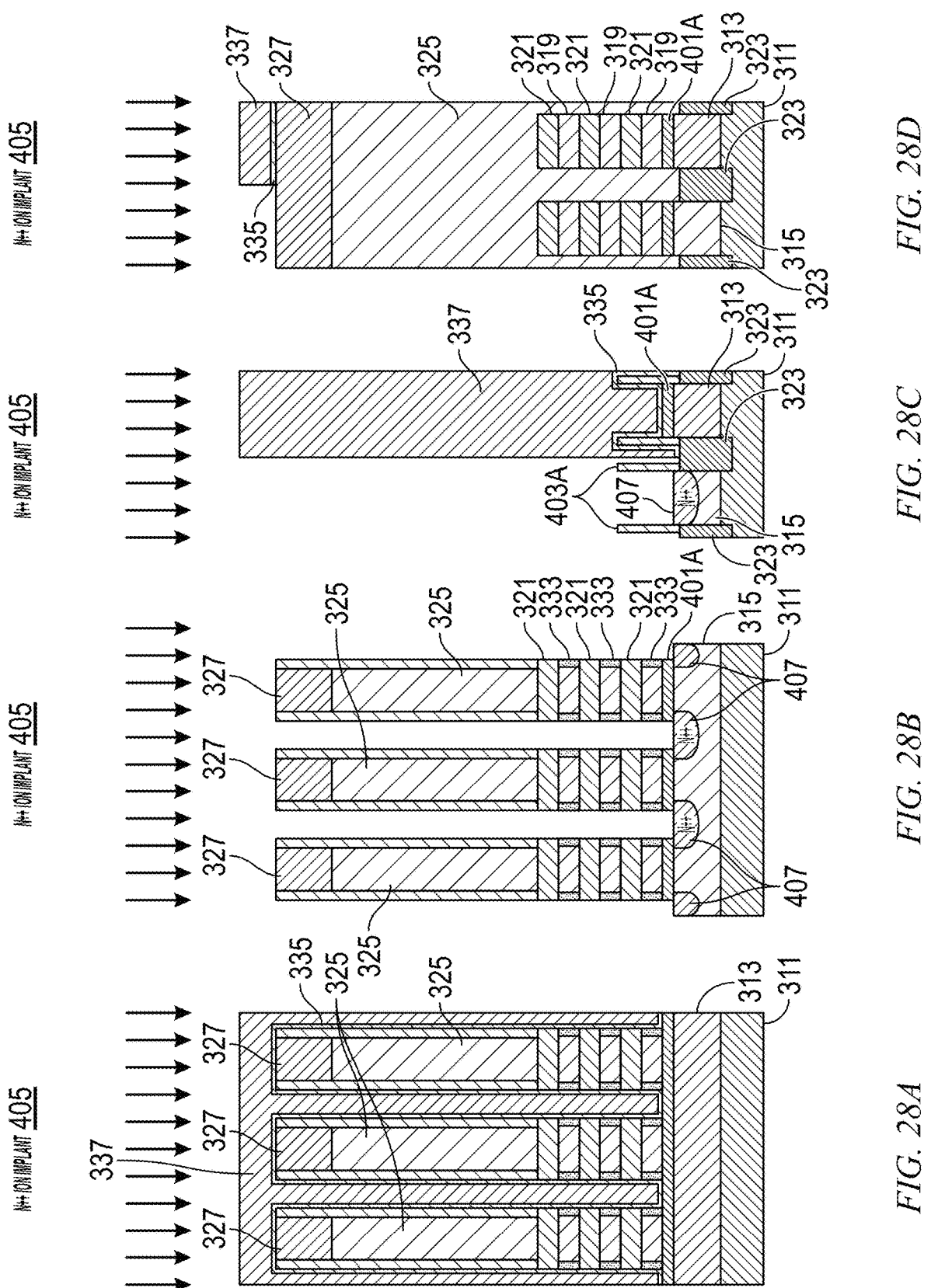
Figures 29A, 29B, 29C, 29D:
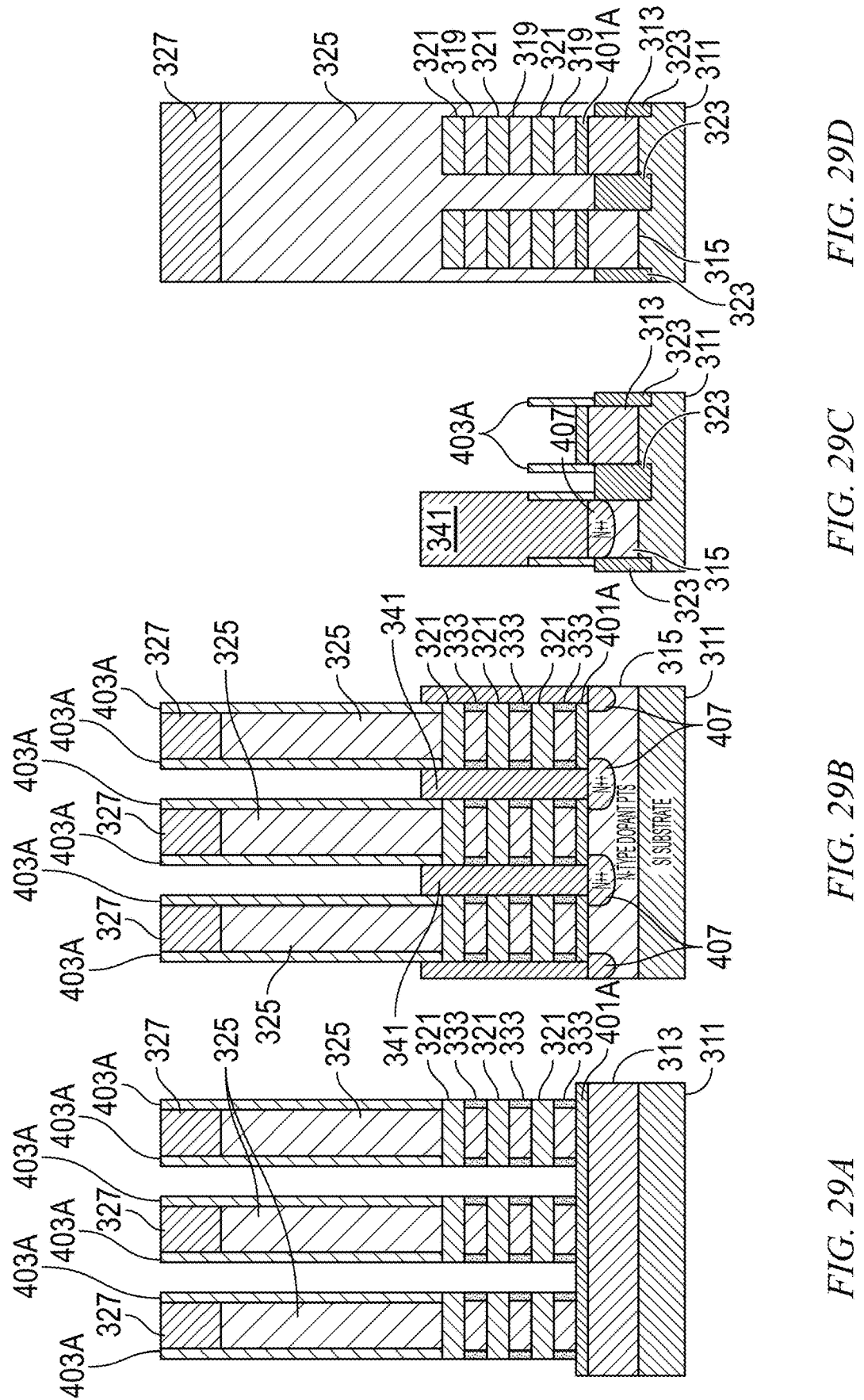
Figures 30A, 30B, 30C, 30D:
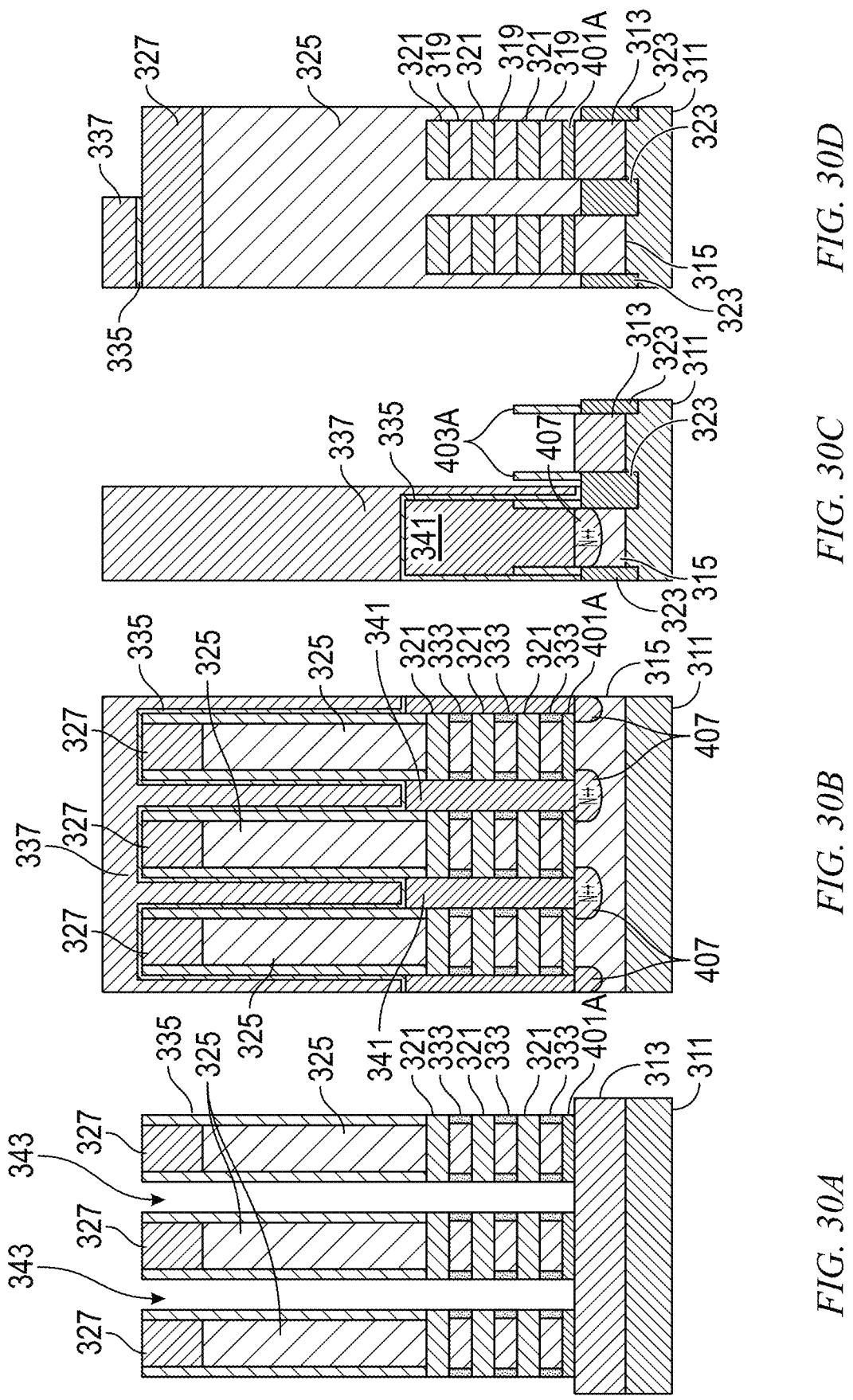
Figures 31A, 31B, 31C, 31D:
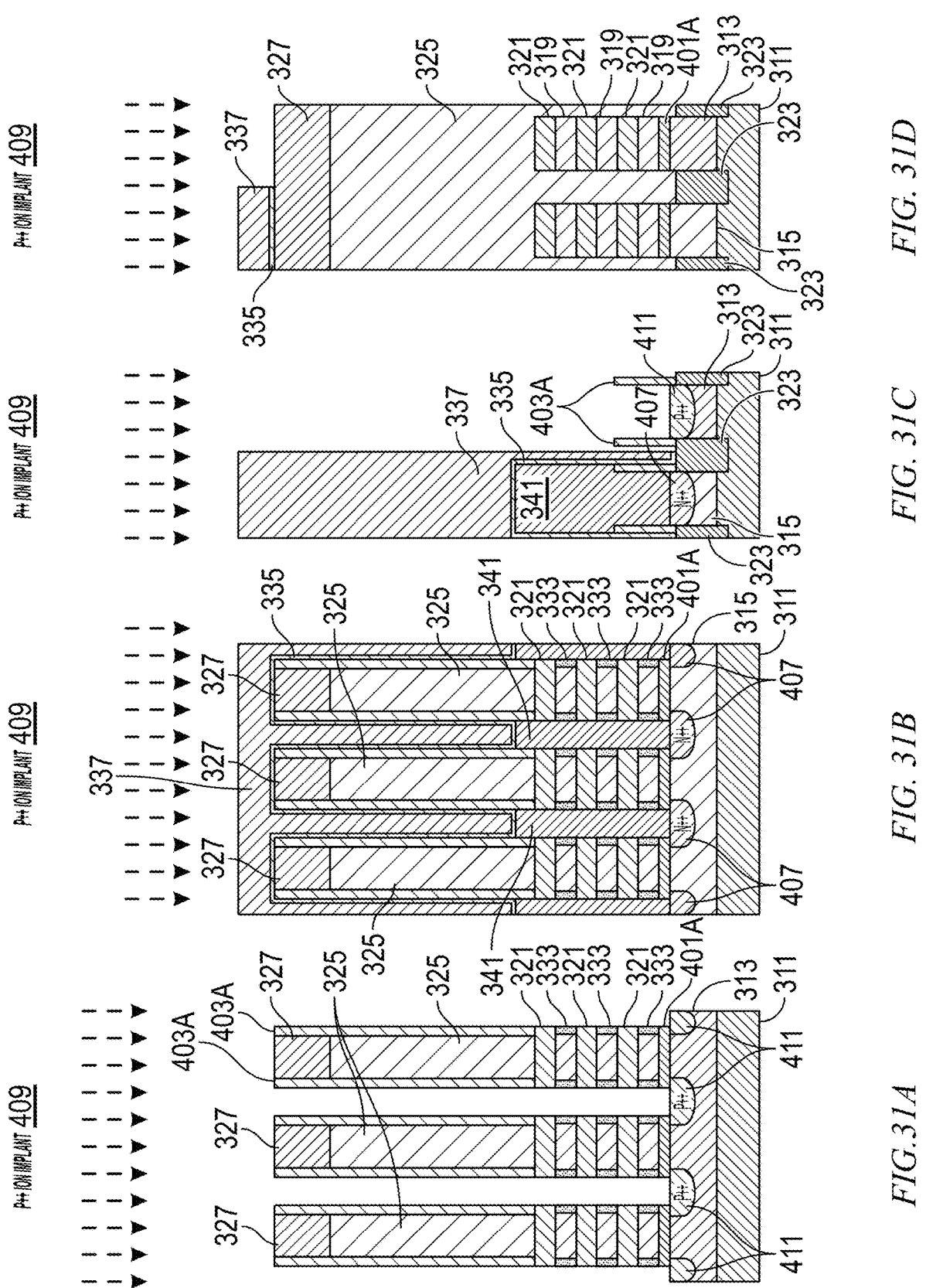
Figures 32A, 32B, 32C, 32D:
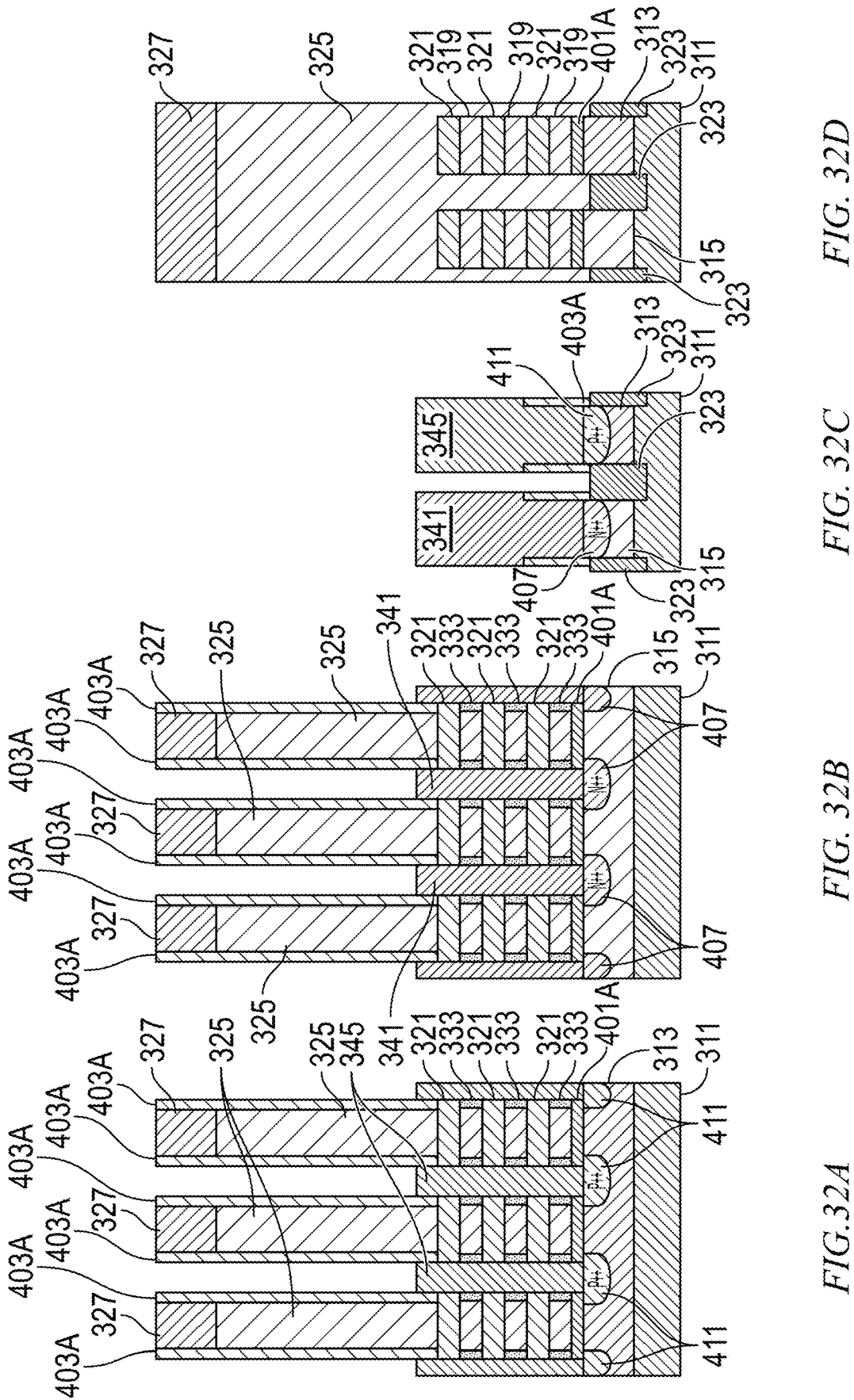
Figures 33A, 33B, 33C, 33D:
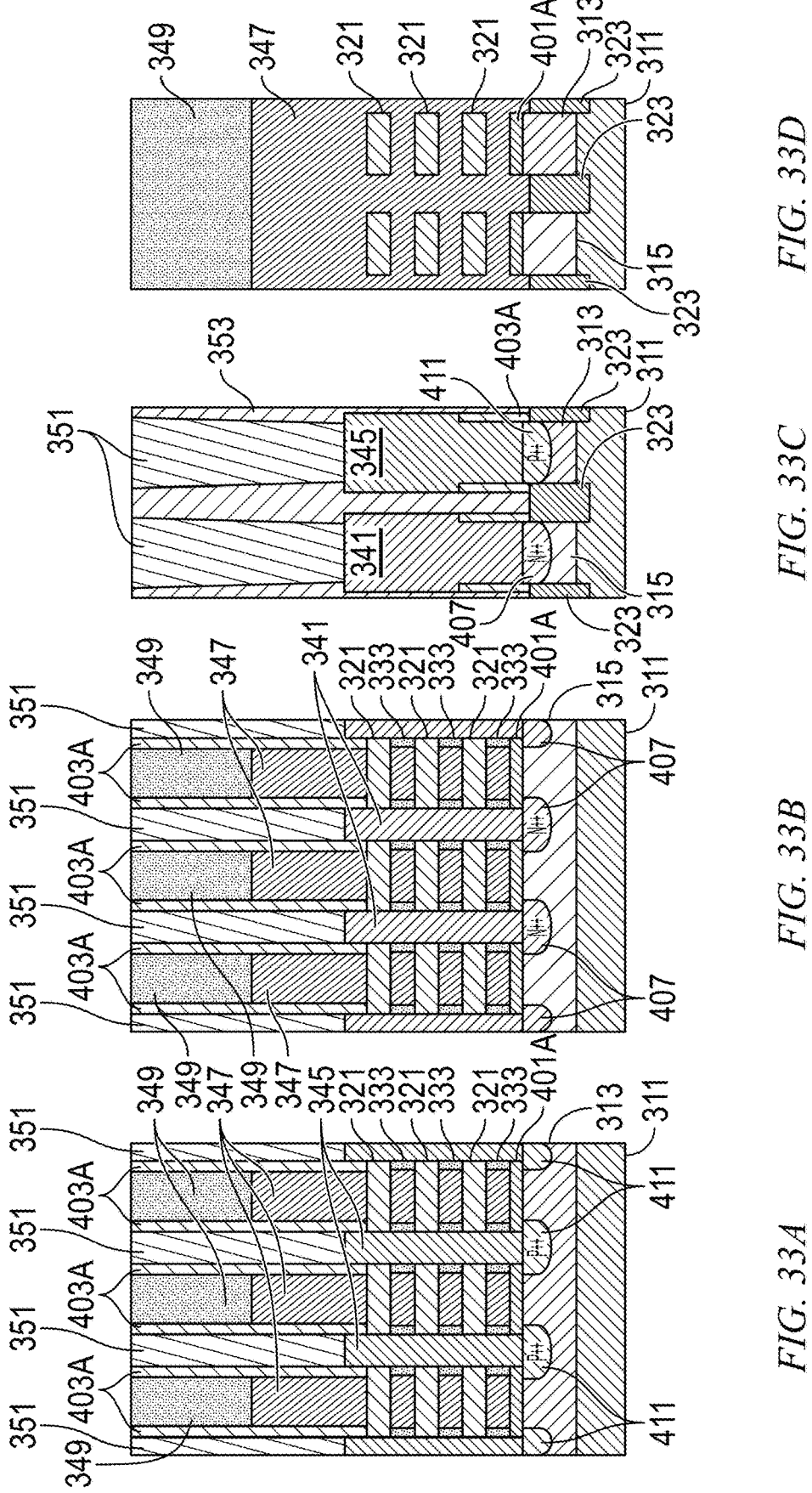
Figures 34A, 34B, 34C, 34D:
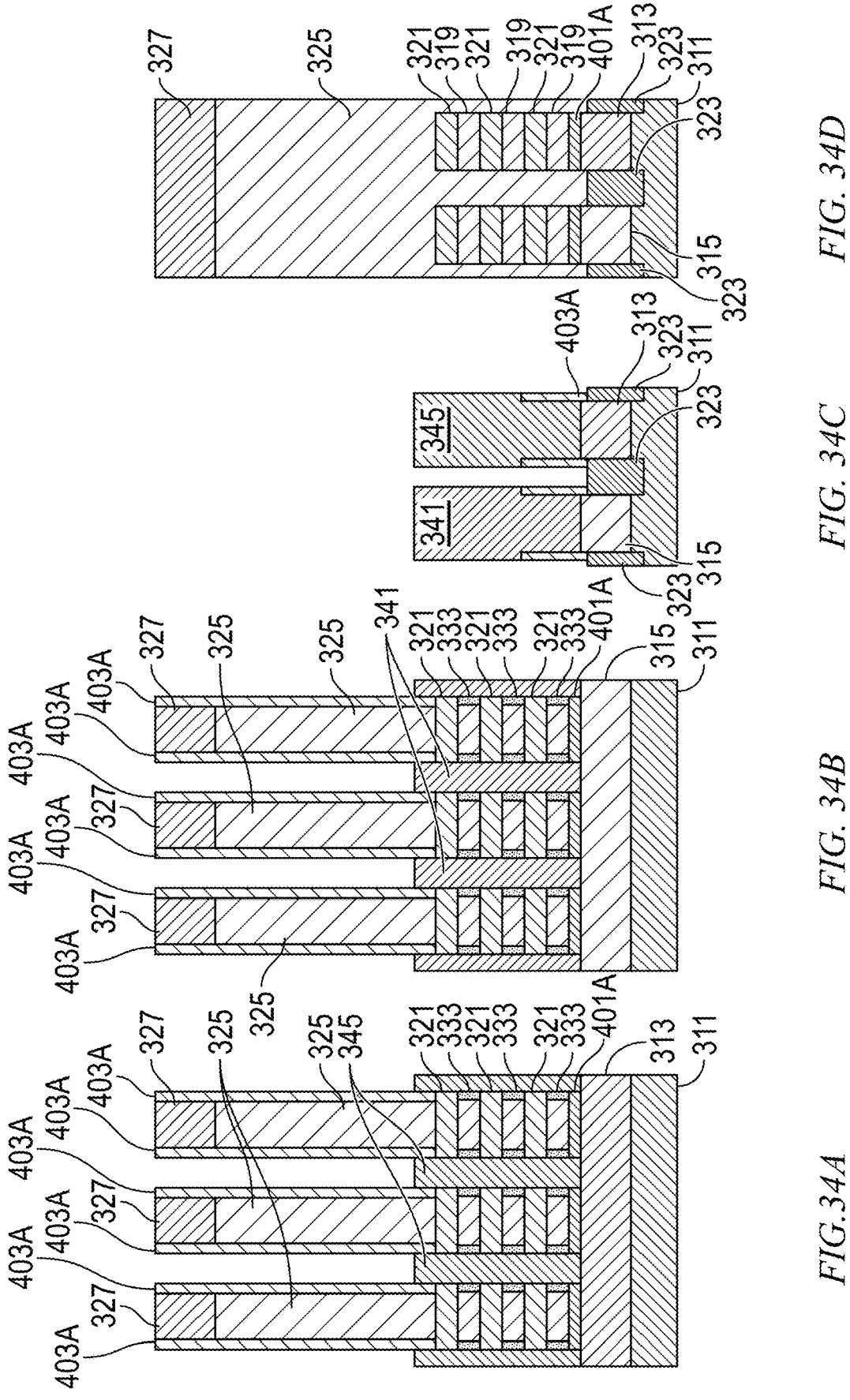
Figures 35A, 35B, 35C, 35D:
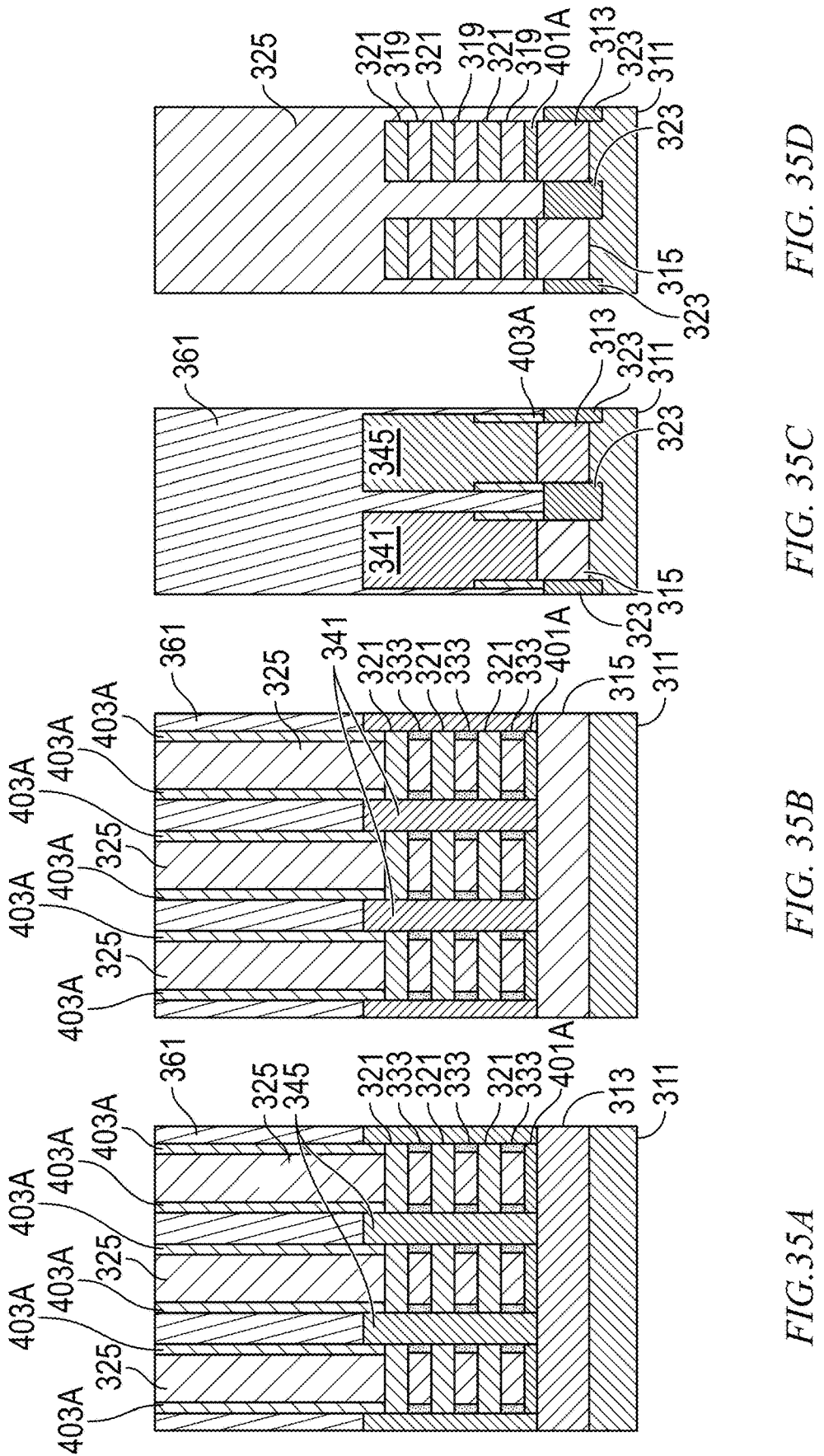
Figures 36A, 36B, 36C, 36D:
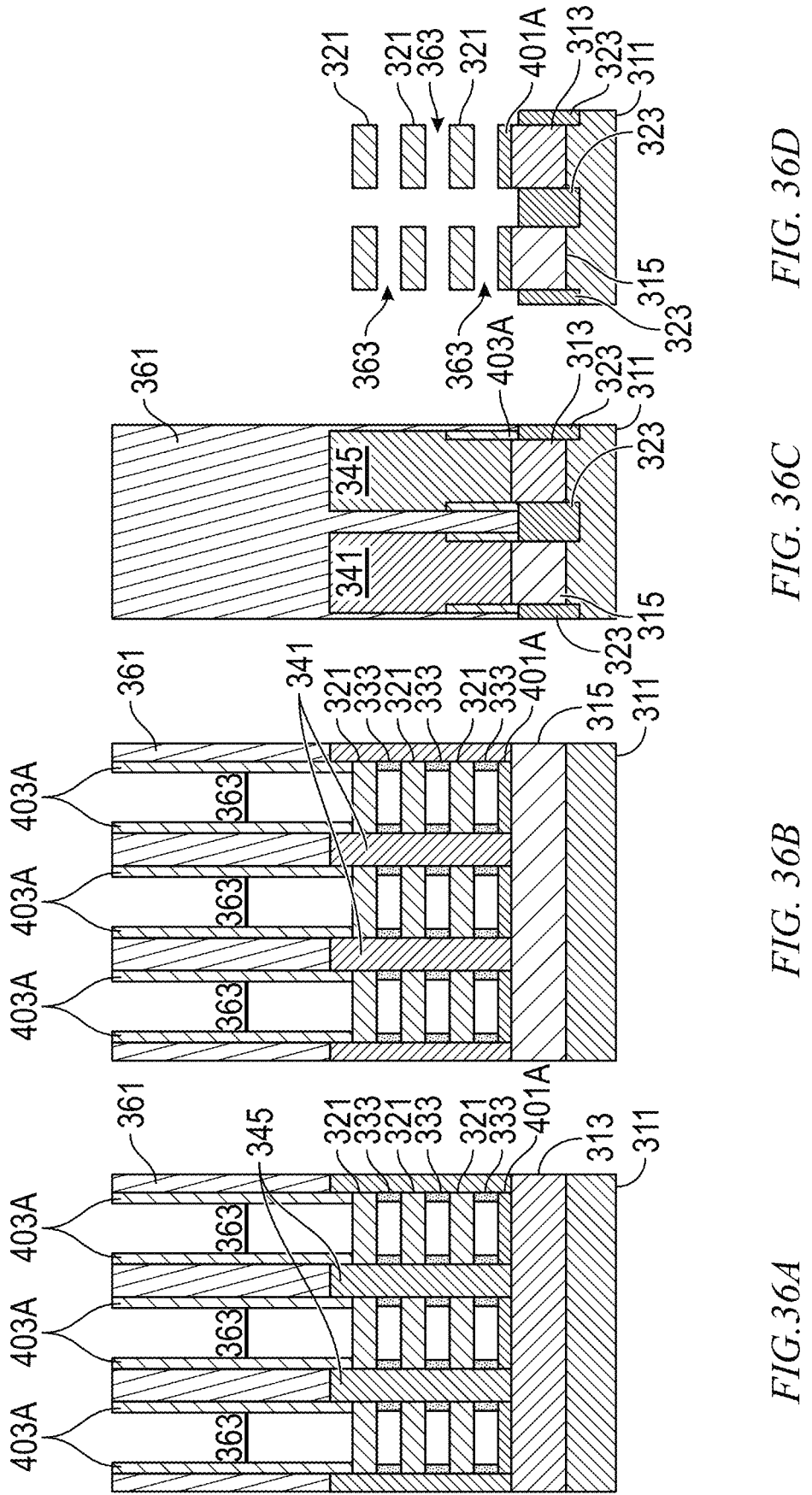
Figures 38A, 38B, 38C, 38D:
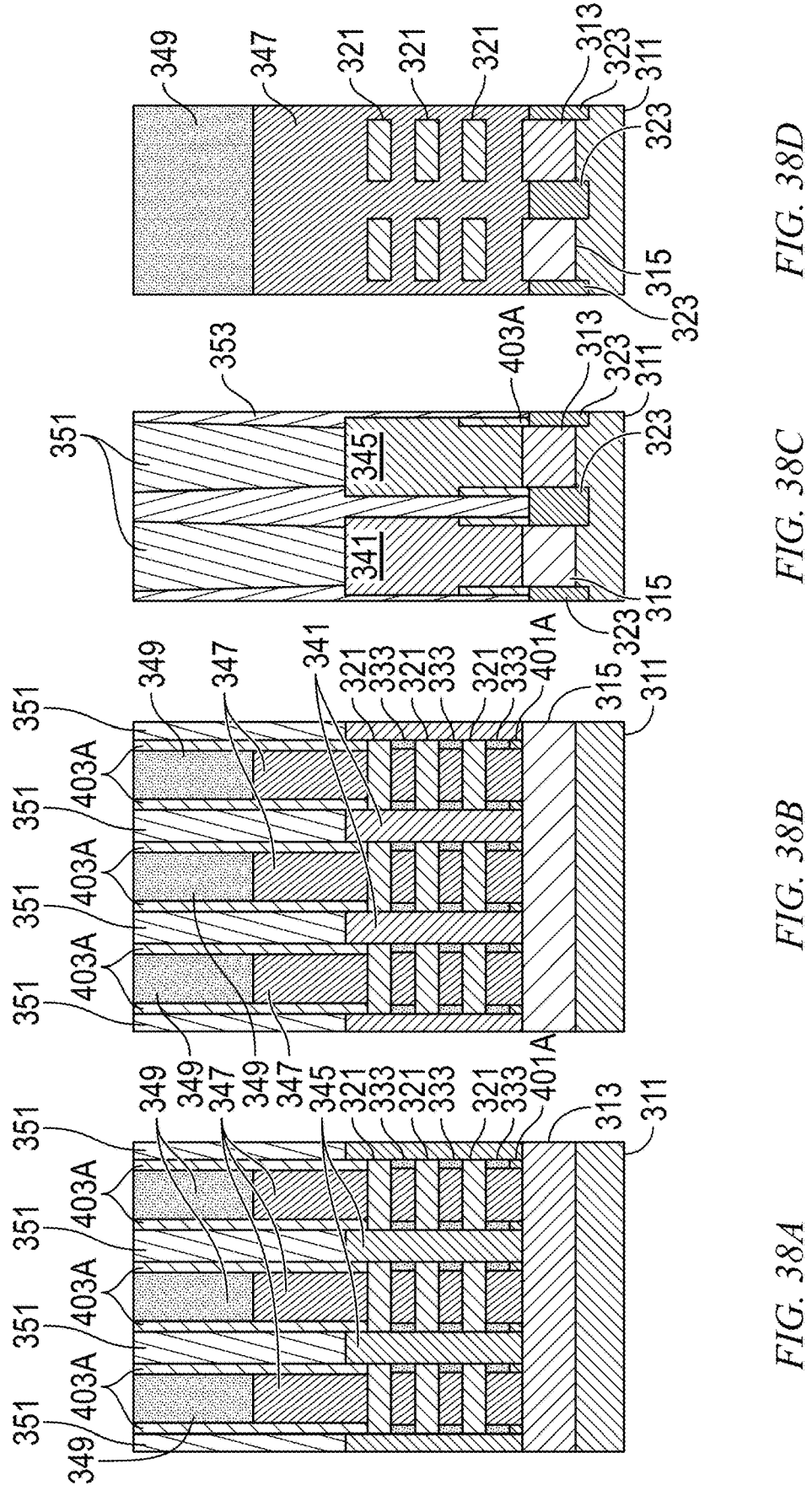
Figures 39A, 39B, 39C, 39D:
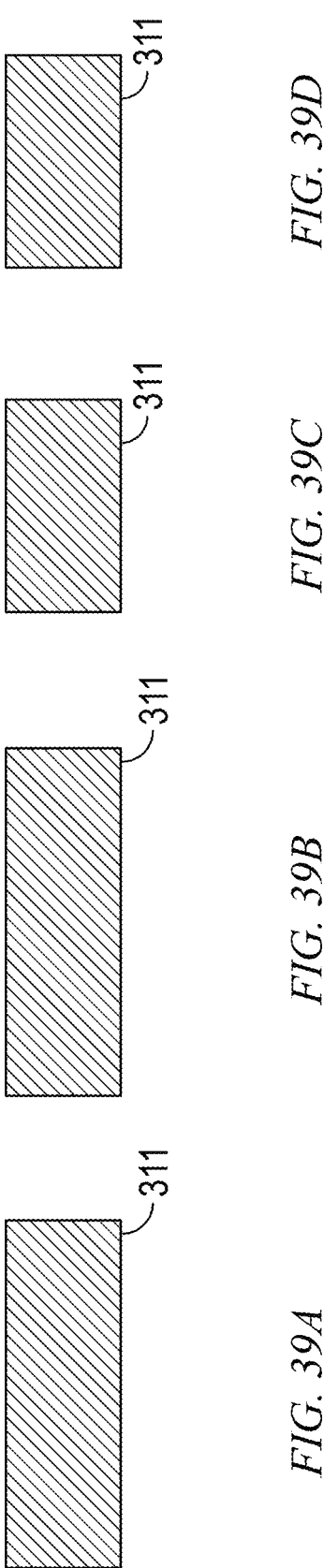
Figures 40A, 40B, 40C, 40D:
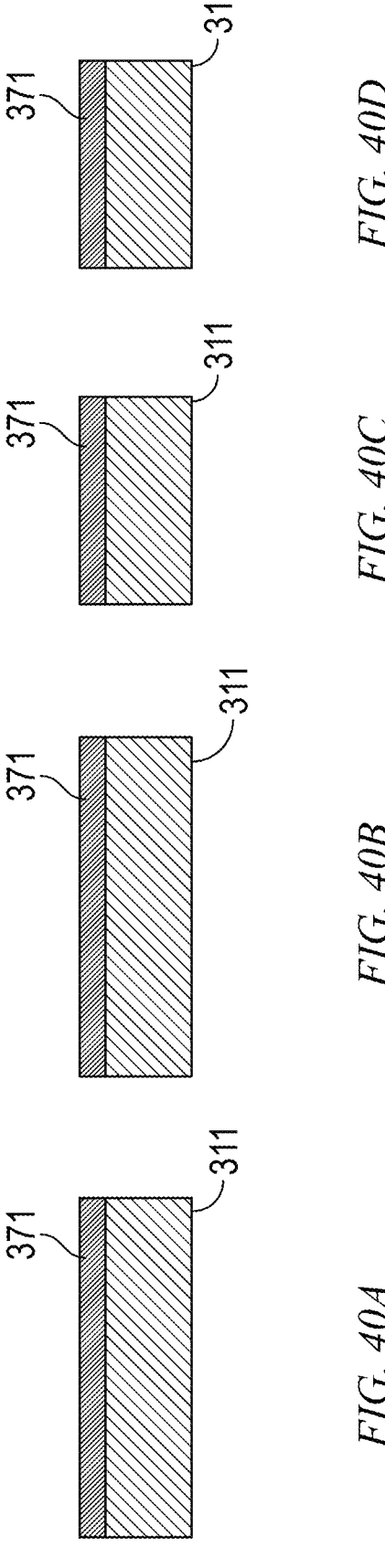

Referring now to FIGS. 20A-20D, carry out anisotropic etching of the spacers and recessing of the fins. Portions of the conformal gate spacer dielectric material 403 are removed from the horizontal surfaces, which re-exposes the NS stack in between the gates. The SASI layer 401A acts as a selective etch stop and facilitates forming a straight profile (enabling optimization of the fin sidewall vertical profile while preventing the risk of over-etch into the substrate). The remaining portions of the conformal gate spacer dielectric material 403 are designated as conformal gate spacers 403A. The fins are then recessed (i.e., etch through the NS stack as seen in FIGS. 20A, 20B, and 20C).

In FIGS. 21A-21D, form the inner spacers. Selectively indent the low Ge % SiGe layers 319, then carry out conformal deposition of inner spacer material such as SiBCN to form inner spacers 333. The indented low Ge % SiGe layers are not separately numbered in FIGS. 21A-21D, to avoid clutter.

In FIGS. 22A-25D, form the PFET and NFET junctions in essentially the same manner as described with respect to FIGS. 11A-14D; the description of the operations will accordingly not be duplicated. In the embodiment shown in FIGS. 22A-25D, advantageously, there is selectivity among the inner spacer material (e.g., SiBCN) of the inner spacers 333 and the materials used for SASI layer 401A (e.g., $SiO_2$) and conformal gate spacer 403A (e.g., Low-K material such as SiOCN). Suitable chemistry that will remove the SASI layer 401A can be used without any damage to the conformal gate spacer 403A or the inner spacers 333. The conformal gate spacer 403A is significant when building devices, since, if it fails, there will be a direct short between the gate and the S-D regions.

After this point, given the teachings herein, known processes can be employed by the skilled artisan to obtain the final structure shown in FIGS. 26A-26D. The known processes include dummy gate open, dummy gate removal, channel release, self-aligned contact (SAC) cap and trench metal contact formation. In particular, deposit ILD 353, planarize down to reopen the dummy gates, and carry out selective dummy gate removal and channel release. Deposit HKMG stacks 347, self-aligned contact (SAC) caps 349, and the trench metal contacts 351 to the S-D regions.

Thus, the final structure shown in FIGS. 26A-26D is similar to that of FIGS. 15A-15D except that the SASI layer 401A is a different material than the conformal gate spacers 403A.

Consider now exemplary fabrication steps for yet another exemplary embodiment with multiple dielectric integration (different dielectric for gate spacer and SASI layer) and source-drain implants (e.g., high-dose ion implantation localized in the source-drain region only). Identical steps as described with respect to FIGS. 16A-21D can be taken. FIGS. 27A-27D are similar to FIGS. 22A-22D. In FIGS. 28A-28D, carry out a high dose N-type S-D ion implant 405 for the PFET regions. This creates highly doped N++ substrate portions 407 in the PFET S-D regions.

The step illustrated in FIGS. 29A-29D is identical to that in FIGS. 23A-23D, but for the presence of the highly doped N++ substrate portions 407. The step illustrated in FIGS. 30A-30D is identical to that in FIGS. 24A-24D, but for the presence of the highly doped N++ substrate portions 407.

In FIGS. 31A-31D, carry out a high dose P-type S-D ion implant 409 for the NFET regions. This creates highly doped P++ substrate portions 411 in the NFET S-D regions.

The step illustrated in FIGS. 32A-32D is identical to that in FIGS. 25A-25D, but for the presence of the highly doped N++ substrate portions 407 and highly doped P++ substrate portions 411.

Thus, in FIGS. 27A-27D, prior to entering the epi chamber, open the SASI layer 401A, and in FIGS. 28A-28D, carry out a blanket high-dose N-type S-D implantation for the PFETs. This creates the local wells (highly doped N++ substrate portions 407) on which the epi will be located, to ensure a good device turn-off. In FIGS. 30A-30D and 31A-31D, do the same, but carry out blanket high-dose P-type S-D implantation for the for the NFETs. The S-D epitaxial growth and stripping of the patterning liner can be carried out as described above.

After this point, given the teachings herein, known processes can be employed by the skilled artisan to obtain the final structure shown in FIGS. 33A-33D. The known processes include dummy gate open, dummy gate removal, channel release, self-aligned contact (SAC) cap and trench metal contact formation. In particular, deposit ILD 353, planarize down to reopen the dummy gates, and carry out selective dummy gate removal and channel release. Deposit HKMG stacks 347, self-aligned contact (SAC) caps 349, and the trench metal contacts 351 to the S-D regions.

Thus, the final structure shown in FIGS. 33A-33D is similar to that of FIGS. 26A-26D, but for the presence of the highly doped N++ substrate portions 407 and highly doped P++ substrate portions 411. In this aspect, advantageously, before the epitaxial growth, in addition to having the PTS in place, undertake a local implantation to counter-dope the wells N++ and P++. In one or more embodiments, this enhances the ability to turn off the device and control leakage. In general, P-type epitaxy has N-type PTS with N++ wells underneath and N-type epitaxy has P-type PTS with P++ wells underneath.

Consider now exemplary fabrication steps for still another exemplary embodiment with multiple dielectric integration (different dielectric for gate spacer and SASI) and dielectric etch-back in the gate region. Steps can be carried out to produce a precursor structure as shown in FIGS. 25A-25D, as seen in FIGS. 34A-34D, which is the result after the NFET epitaxy and stripping the patterning liner. In FIGS. 35A-35D, deposit ILD 361 and carry out CMP to expose the dummy gates 325. In FIGS. 36A-36D, remove the sacrificial gate and release the channels. Note the resulting cavities 363. In FIGS. 37A-37D, carry out selective etch-back of the SASI layer 401A inside the gate cavities. After this point, given the teachings herein, known processes can be employed by the skilled artisan to obtain the final structure shown in FIGS. 38A-38D. The known processes include dummy gate open, dummy gate removal, channel release, self-aligned contact (SAC) cap and trench metal contact formation. ILD deposition, dummy gate opening, dummy gate removal, and channel release have been discussed elsewhere. Deposit HKMG stacks 347, self-aligned contact (SAC) caps 349, and the trench metal contacts 351 to the S-D regions. In this aspect, the (electrically insulating) SASI layer 401A is only located under the inner spacers in the extension region. In FIGS. 38A-38D, the HKMG stack 347 directly touching the P-PTS 313 and N-PTS 315 of Si substrate 311 will potentially significantly increase the parasitic gate to substrate capacitance, which potentially degrades the device performance.

Figures 41A, 41B, 41C, 41D:
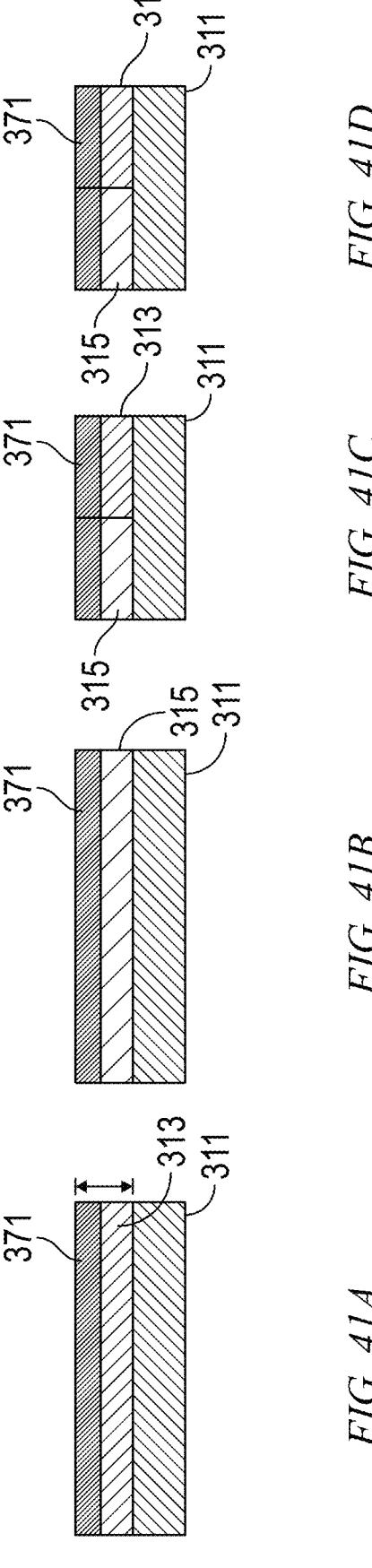
Figures 42A, 42B, 42C, 42D:
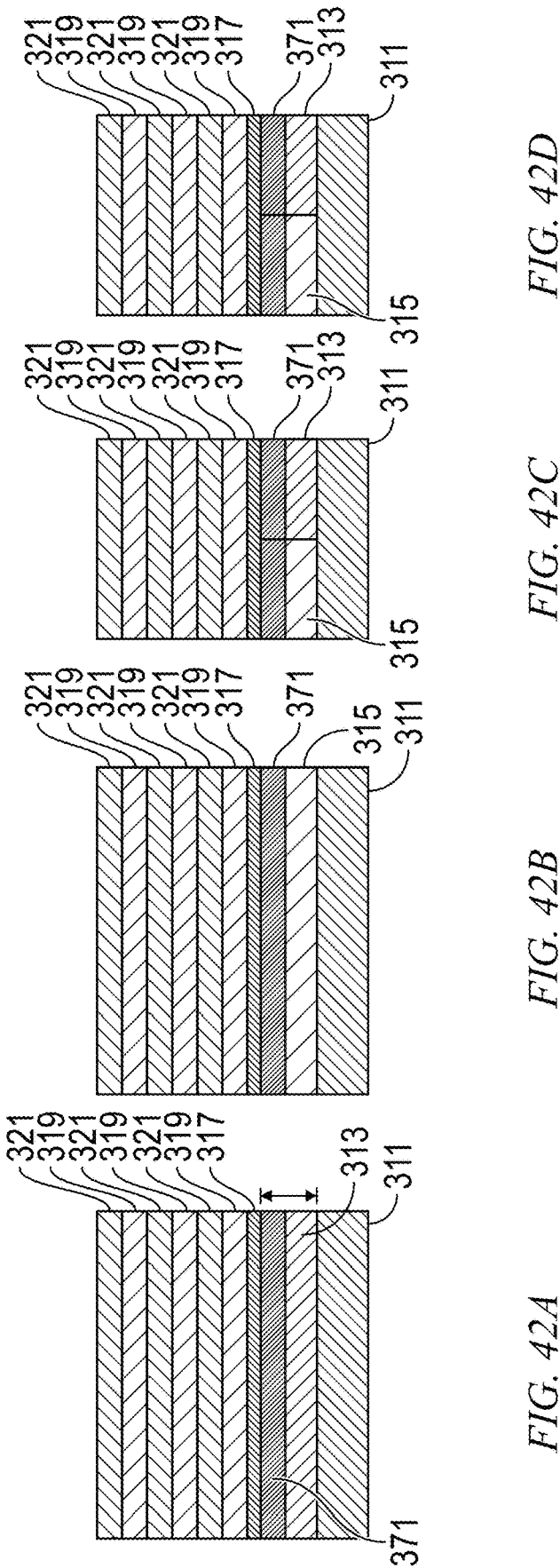
Figures 43A, 43B, 43C, 43D:
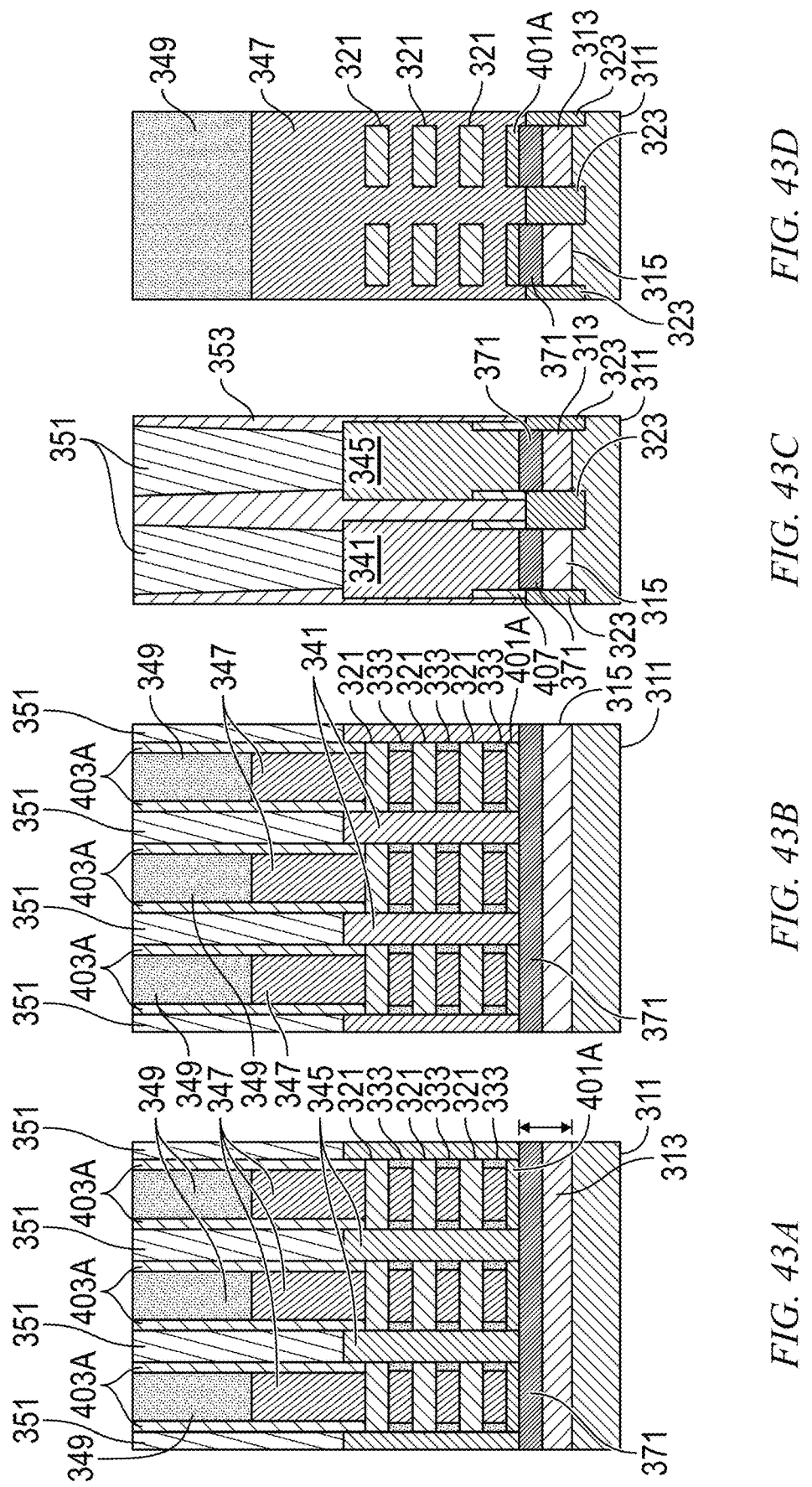
Figures 44A, 44B, 44C, 44D:
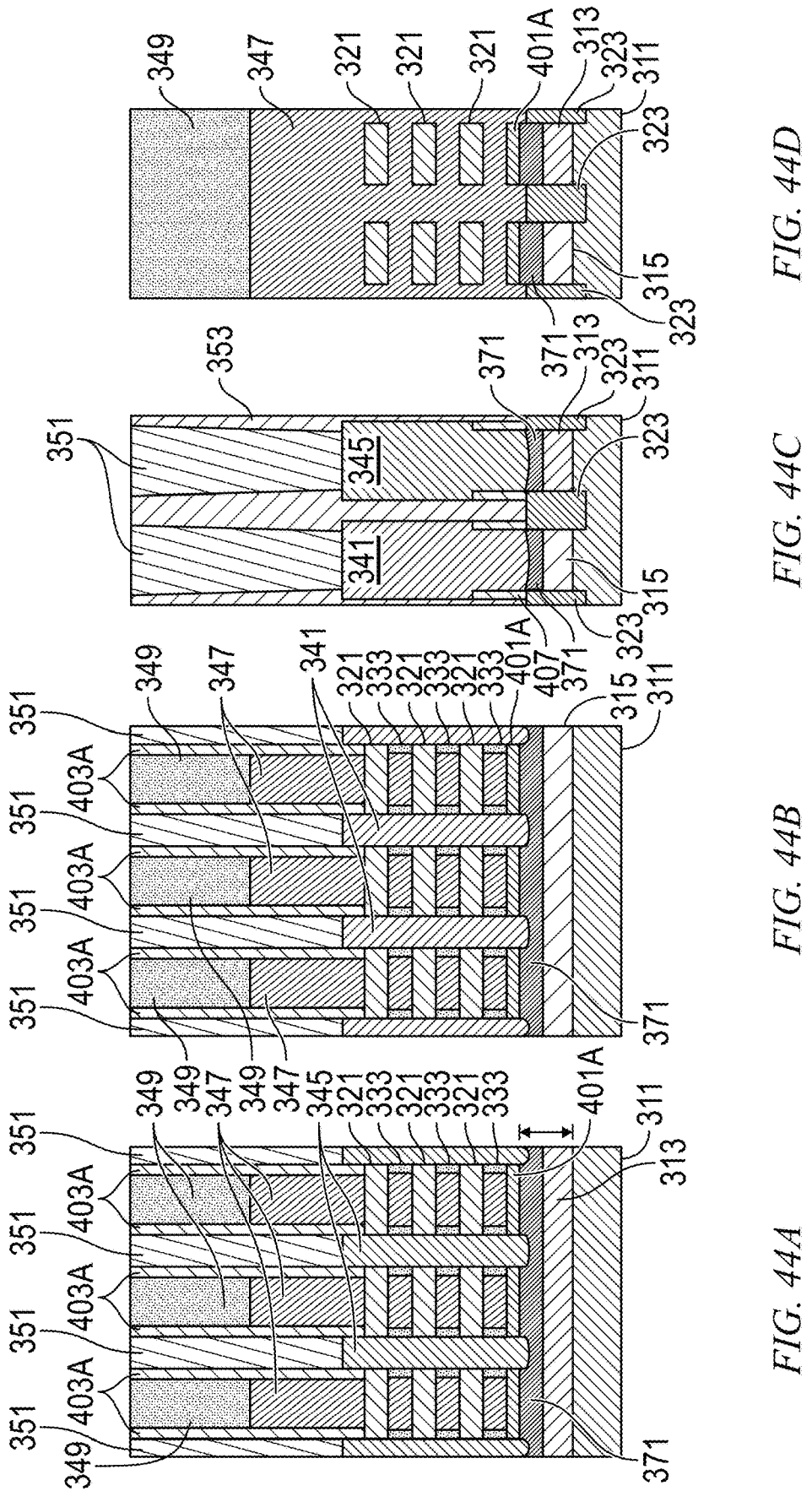
FIGS. 44A-44D show an alternative to the further exemplary semiconductor array structure of FIGS. 43A-43D, according to an aspect of the invention, wherein "A" is a cross-section taken along line X1 in FIG. 1, "B" is a cross-section taken along line X2 in FIG. 1, "C" is a cross-section taken along line Y1 in FIG. 1, and "D" is a cross-section taken along line Y2 in FIG. 1.
Figures 45A, 45B, 45C, 45D:
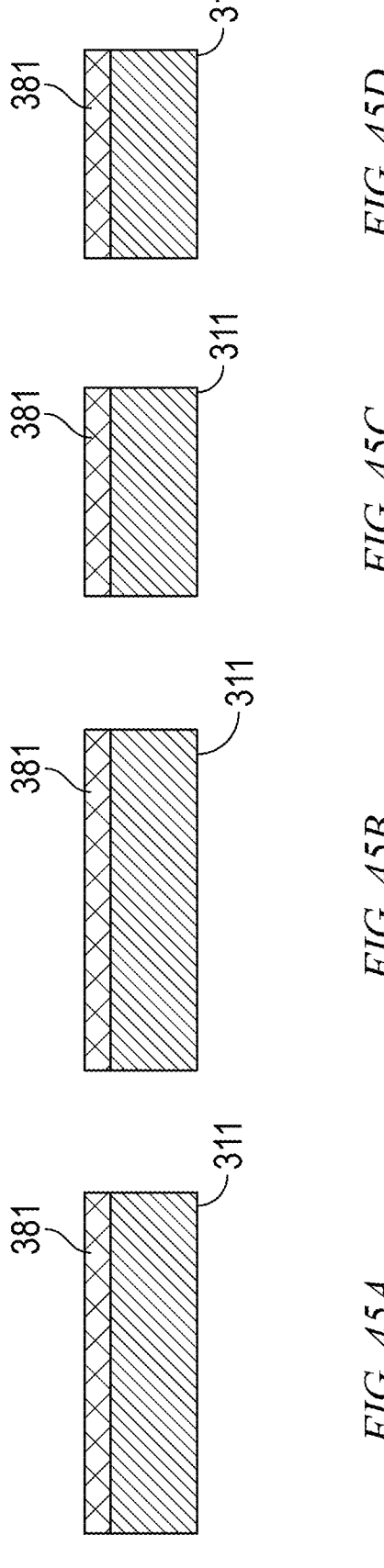

Referring now to FIGS. 39A-39D, consider now exemplary fabrication steps for an additional exemplary embodiment with multiple dielectric integration (different dielectric for gate spacer and SASI) and with insertion of a carbon-doped layer under the NS stack (e.g., an epitaxially grown carbon-rich silicon layer under the device). Referring to FIGS. 39A-39D begin with incoming bulk substrate, the same as FIGS. 2A-2B. In FIGS. 40A-40D, epitaxially grow SiC 371 or carry out carbon doping. In FIGS. 41A-41C implant the punch-through stopper (PTS) as in FIGS. 3A-3D. In FIGS. 42A-42D, epitaxially grow the nanosheet stack as in FIGS. 4A-4D. In FIGS. 43A-43D, there is the same structure as in FIGS. 26A-26D, except built on substrate with a carbon-doped/carbon-rich region, such as SiC 371. FIGS. 44A-44D show a variation-because of the carbon-doped/carbon-rich region, such as SiC 371, there can be greater resiliency to adding a bit more over-etching, so a small S-D epi extension (extension of PFET S-D epitaxy 341 and NFET S-D epitaxy 345) is provided into the SiC 371.

In FIGS. 44A-44D, the S-D epitaxy extends past the bottom-most surface of the SASI layer 401A, under the HKMG stack 347 and inner spacers 333 within the carbon-rich silicon layer such as SiC 371.

Figures 46A, 46B, 46C, 46D:
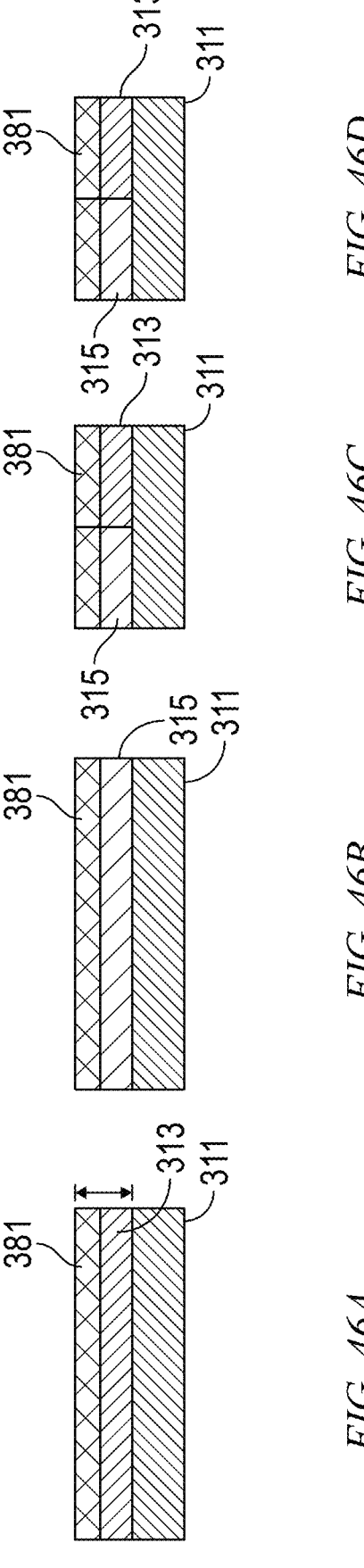
Figures 47A, 47B, 47C, 47D:
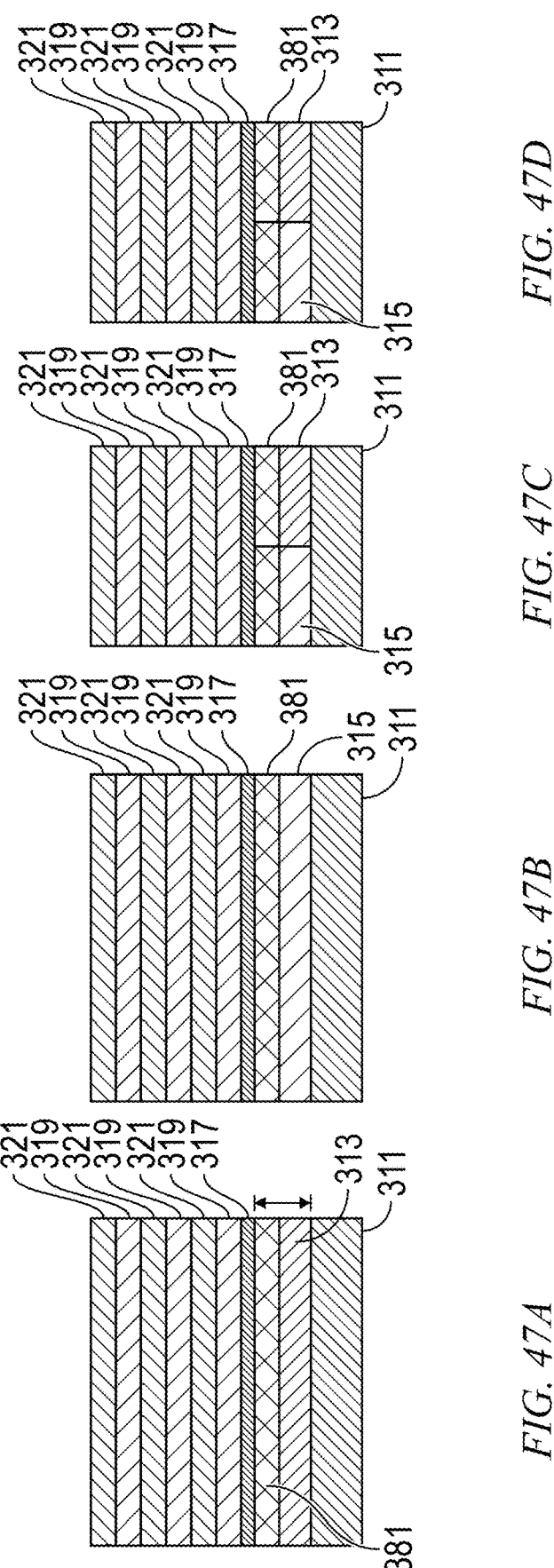
Figures 48A, 48B, 48C, 48D:
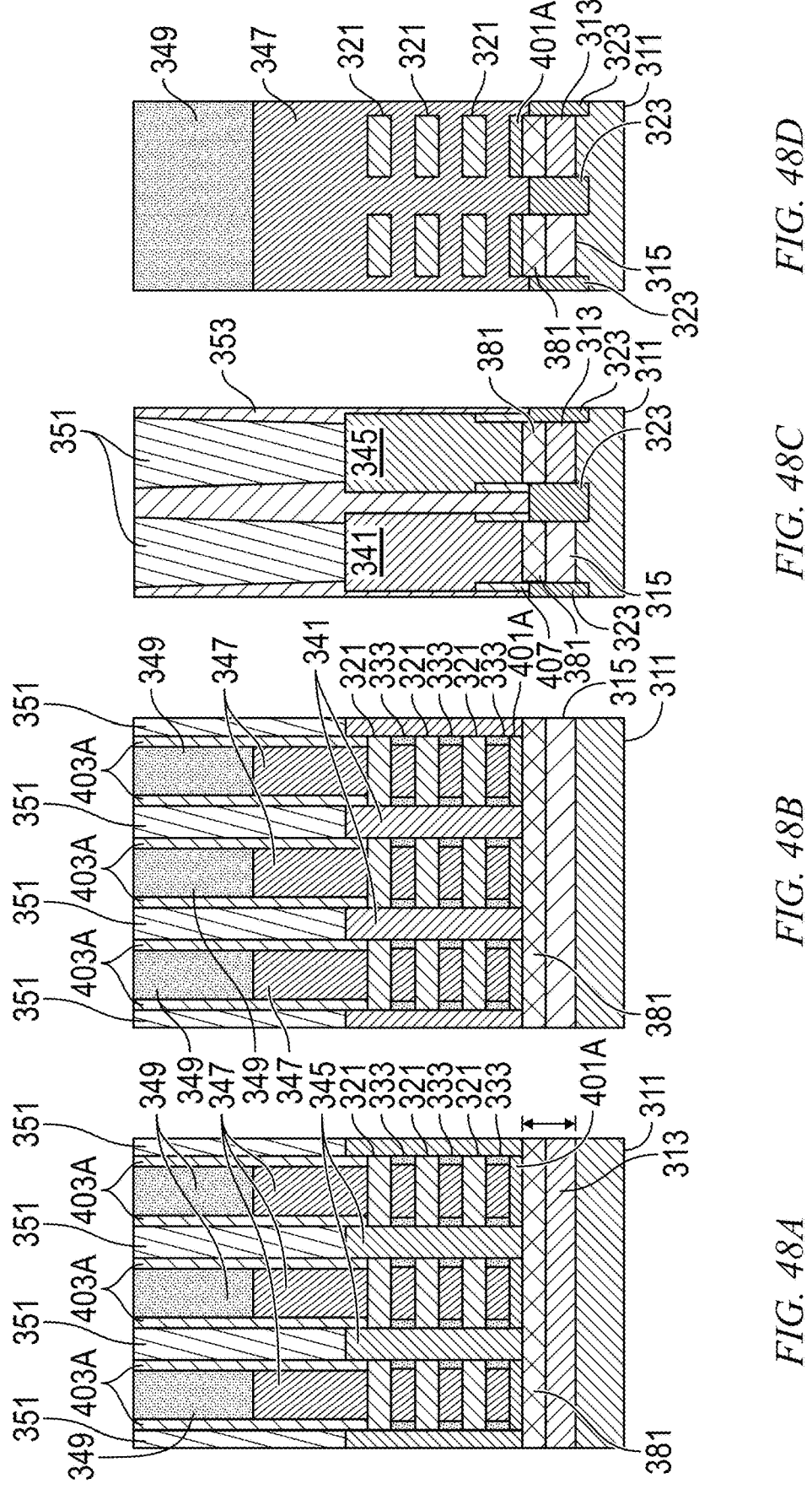
Figures 49A, 49B, 49C, 49D:
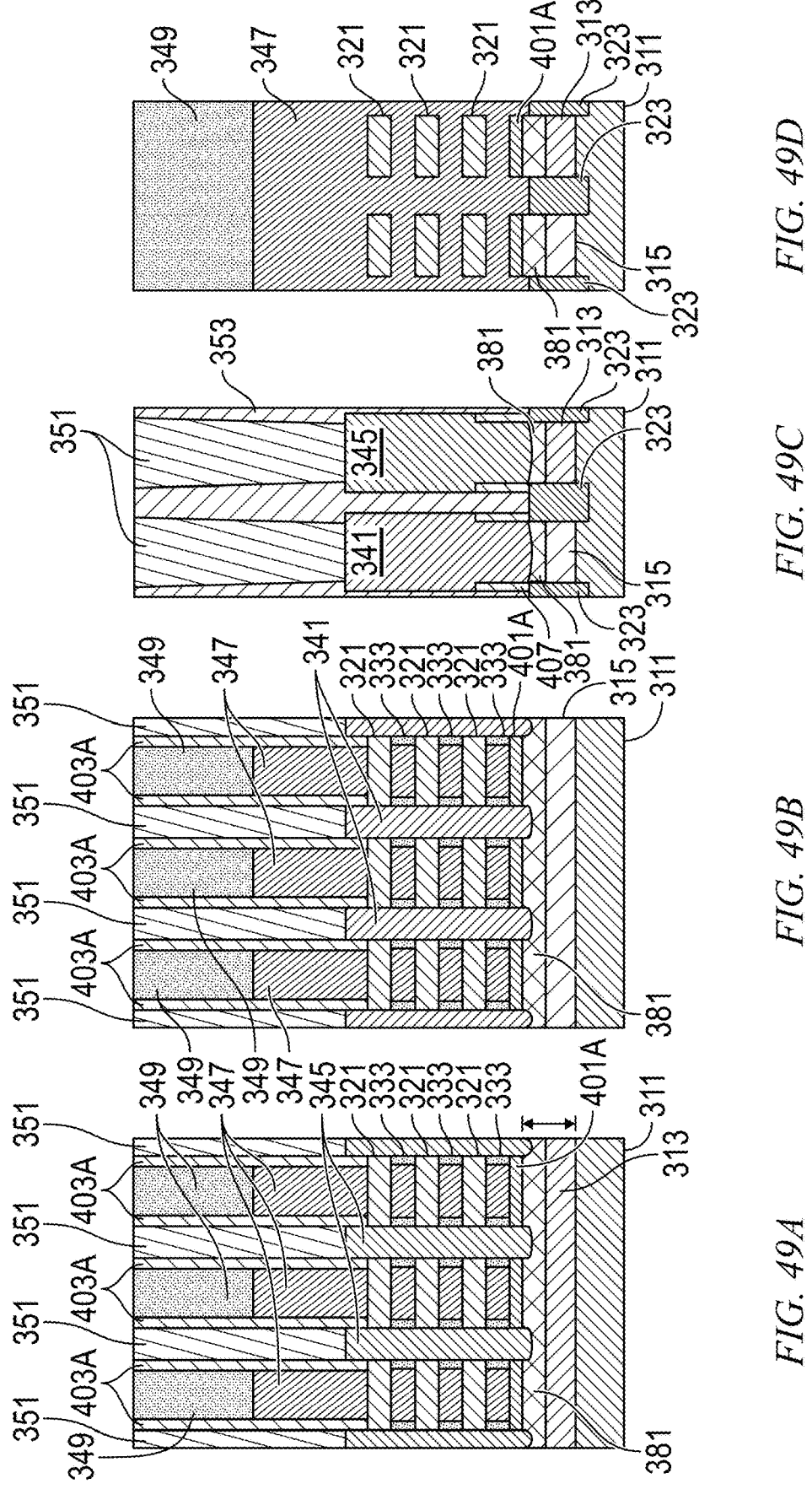
FIGS. 49A-49D show an alternative to the still further exemplary semiconductor array structure of FIGS. 48A-48D, according to an aspect of the invention, wherein "A" is a cross-section taken along line X1 in FIG. 1, "B" is a cross-section taken along line X2 in FIG. 1, "C" is a cross-section taken along line Y1 in FIG. 1, and "D" is a cross-section taken along line Y2 in FIG. 1.
Figures 50A, 50B, 50C, 50D:
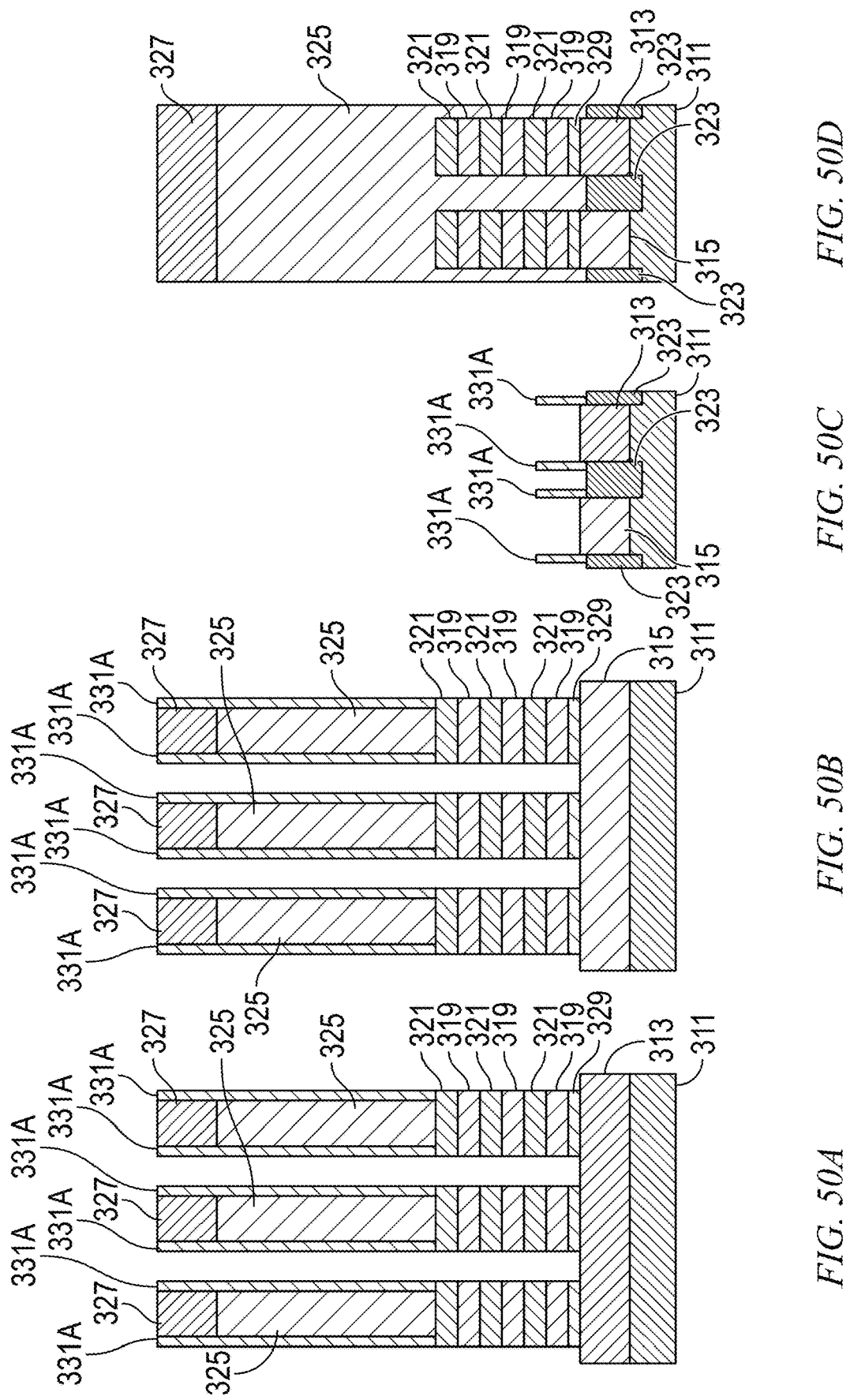
Figures 51A, 51B, 51C, 51D:
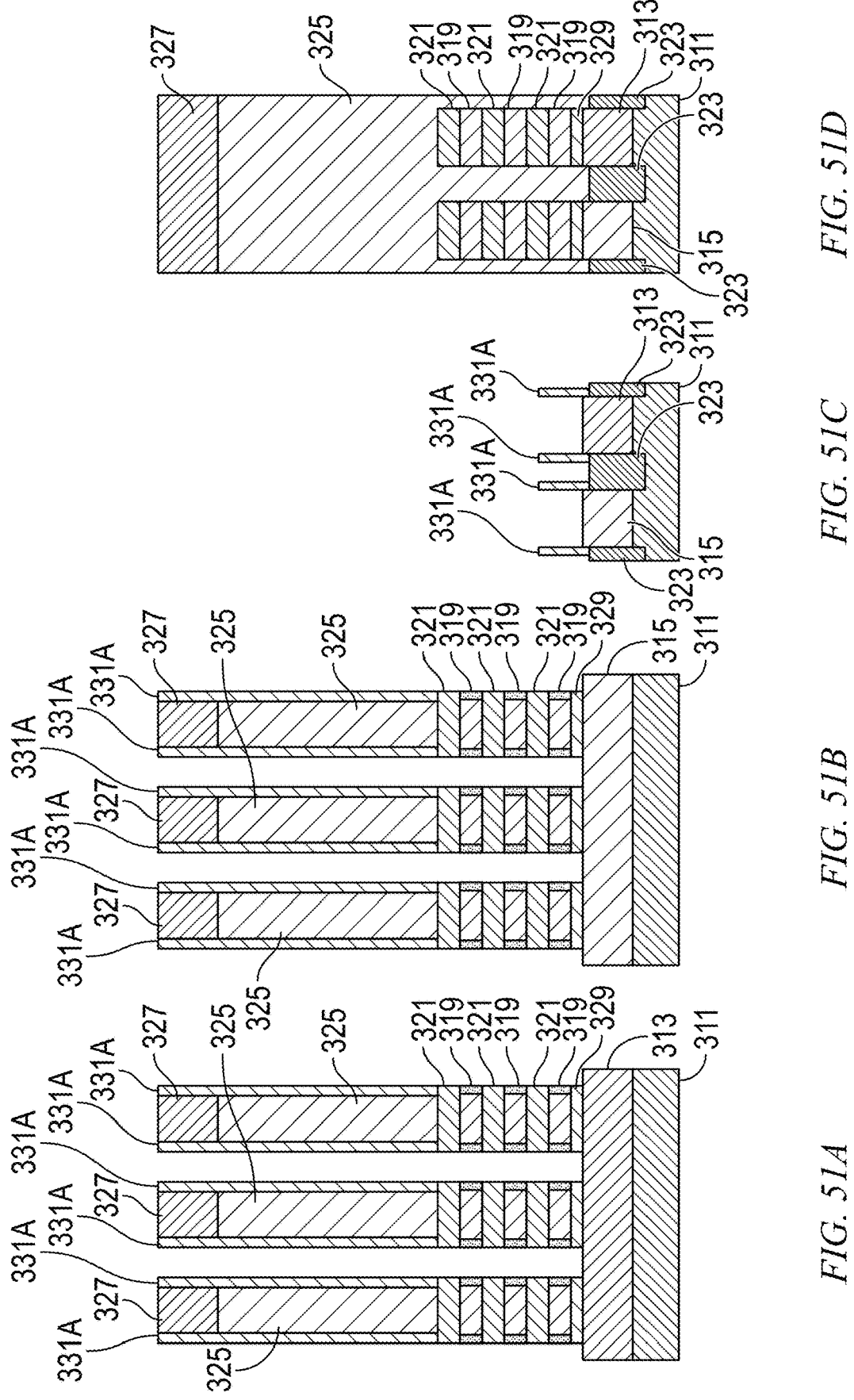

Referring now to FIGS. 45A-45D, consider now exemplary fabrication steps for another additional exemplary embodiment with multiple dielectric integration (different dielectric for gate spacer and SASI) and with insertion of a Super-Steep Retrograde Well (SSRW) layer under the NS stack (e.g., under the device). Begin with incoming bulk substrate, the same as FIGS. 2A-2B. In FIGS. 45A-45D, form the SSRW layer 381. In FIGS. 46A-46C implant the punch-through stopper (PTS) as in FIGS. 3A-3D. In FIGS. 47A-47D, epitaxially grow the nanosheet stack as in FIGS. 4A-4D. In FIGS. 48A-48D, there is the same structure as in FIGS. 26A-26D, except built on substrate with SSRW layer 381. FIGS. 49A-49D show a variation-because of the SSRW layer 381, there can be greater resiliency to adding a bit more over-etching, so a small S-D epi extension (extension of PFET S-D epitaxy 341 and NFET S-D epitaxy 345) is provided into the SSRW layer 381.

FIGS. 48A-48D and 49A-49D thus show an SSRW layer 381 in the gate and S-D regions, In FIGS. 49A-49D, the S-D epitaxy extends past the bottom-most surface of the SASI layer 401A, under the HKMG stack 347 and inner spacers 333 within the SSRW layer 381.

One or more embodiments thus include a SASI layer 329, 401A under at least the extension region, P-PTS 313, and N-PTS 315.

One or more embodiments thus provide an exemplary fabrication technique including forming PTS implants; forming an NS epitaxy stack with a thin sacrificial high Ge % SiGe layer (e.g., thickness about 3-8 nm); forming fins; depositing STI; and forming dummy gates. Further steps include forming a thin SASI under the NS stack; forming gate spacers; forming S-D trenches; and forming inner spacers. Even further steps include selectively removing the thin SASI from the S-D regions; forming S-D epitaxy; forming a final High-K metal gate (HKMG) stack; and forming trench metal contacts. Some embodiments include partial SASI under the gate, as well as recess-less S-D epitaxy on a substrate, optionally with an SiC layer under the stack.

Further, one or more embodiments provide a structure including a substrate; at least one Gate-All-Around (GAA) channel of at least one GAA FET disposed over the substrate; source and drain regions on each side of the gate and in direct contact with the edges of the GAA channel; and a punch-through-stopper implant layer under the source-drain and gate regions. Also included in one or more embodiments is an electrically insulating layer located in the gate and inner spacer regions and in-between the gate/inner Spacer and the substrate. In one or more instances, the top surface of the substrate is flat and continuous and does not exhibit substantial topography changes between the source-drain and gate regions ("does not exhibit substantial topography changes," as used herein, means that any recesses extend no more than 10 nm below the top surface of the substrate). In some cases, a recess in the substrate, if any, extends no more than 5 nm below the top surface of the substrate. In one or more embodiments, the source-drain regions are in direct contact with the substrate and do not extend past the bottom-most surface of the SASI layer located under the gate/inner spacers (or else extend no more than 5 nm, or in some cases, no more than 10 nm, below the substrate). In some cases, however, the source-drain regions extend past the bottom-most surface of the SASI layer located under the gate/inner spacers within a carbon-rich Silicon layer. In some cases, an SSRW layer is provided in the gate and source-drain regions, located within the PTS region in direct contact with the source-drain regions and the SASI layer located under the gate/inner spacers.

In some cases, the SASI layer located under the gate/inner spacers and the conformal gate spacers 331A have different materials. In some cases, the SASI layer is only located under the inner spacers. In some instances, a carbon-rich silicon layer is provided in the gate and source-drain regions, located within the PTS region in direct contact with the source-drain regions and the SASI layer located under the gate/inner spacers. In some instances, the source-drain regions extend past the bottom-most surface of the SASI layer located under the gate/inner spacers within the SSRW layer.

In a non-limiting example, the trench metal contacts 351 can include a silicide liner, such as Ni, Ti, NiPt, etc.; a thin metal adhesion layer, such as TiN or TaN; and conductive metal fill, such as Ru, W, Co, or Cu. Similar materials can be used for any other needed contacts, vias, power lines, etc. Regarding the material of STI 323, in a non-limiting example, use a liner such as SiCO, SiOCN and silicon nitride (SiN), with, e.g., silicon oxide (SiO) or other suitable dielectric material for the STI per se; STI can be deposited, for example, via High Density Plasma (HDP) deposition, Chemical Vapor Deposition (CVD), etc.

Regarding the dummy gate formation, such as in FIGS. 6A-6D, for example, deposit a thin layer of dummy dielectric ($SiO_2$) and amorphous Si (a-Si) material for the dummy gates, carry out planarization; deposit material for hard mask 327 (can be a multilayer dielectric); pattern the hardmask and etch the a-Si and the thin $SiO_2$ to form the dummy gates 325.

One or more embodiments do not utilize Bottom Dielectric Isolation (BDI). One or more embodiments do not require an in-trench oxidizer.

Referring, for example, to the embodiments of FIGS. 15A-15D, 26A-26D, 33A-33D, 43A-43D, 44A-44D, 48A-48D, and 49A-49D, in one aspect, an exemplary semiconductor structure includes a substrate 311. Bulk silicon is a non-limiting example of a suitable substrate material, other materials are also possible. The structure also includes a gate-all-around field effect transistor disposed over the substrate. The gate-all-around field effect transistor includes a first source-drain region (e.g., 345 if the FET is an n-FET or 341 if the FET is a p-FET); a second source-drain region (e.g., another instance of 345 if the FET is an n-FET or another instance of 341 if the FET is a p-FET); at least one channel region (e.g., one or more silicon layers 321) interconnecting the first and second source drain regions; and a gate structure surrounding the at least one channel region. Here, "gate structure" is used broadly to include, for example, the HKMG stack 347 and spacers, an example of which is discussed more fully below. A further element is a self-aligned substrate isolation (SASI) layer 329, 401A located between the substrate and the gate structure and extending over a width of the gate structure. The punch-through stopper (PTS) implant layer including P-PTS 313, N-PTS 315 is typically of opposite type to the adjacent epitaxial material ("epi") (e.g., 345 if the FET is an n-FET or 341 if the FET is a p-FET); i.e., the doping polarity of the PTS is opposite to the doping polarity of the source-drain regions.

Optionally, a punch-through stopper implant layer including P-PTS 313, N-PTS 315 is included in the substrate adjacent an upper surface of the substrate, facing towards the gate-all-around field effect transistor, below the first and second source-drain regions and the gate structure. In one or more embodiments, the self-aligned substrate isolation (SASI) layer is located between the substrate and the gate structure; for example, between the punch-through stopper implant layer on the upper surface of the substrate (and in contact therewith) and the gate structure.

In one or more embodiments, the gate structure includes a high-K metal gate stack 347 in a gate region; conformal gate spacers 331A, 403A on each side of the high-K metal gate, in an extension region; and inner spacers 333 on each side of the high-K metal gate, in the extension region. For clarification purposes, the non-limiting example in the figures, the at least one channel region includes three channel regions (e.g., three silicon layers 321), but a single channel region, two channel regions, or more than three channel regions are also possible.

Referring, for example, specifically to FIGS. 15A-15D, in some cases, the self-aligned substrate isolation (SASI) layer 329 and the conformal gate spacers 331A are the same material.

On the other hand, referring, for example, to FIGS. 26A-26D, in some cases, the self-aligned substrate isolation (SASI) layer 401A and the conformal gate spacers 403A are different materials.

In one or more embodiments, the at least one channel region comprises a plurality of channel regions (e.g., plurality of silicon layers 321) interconnecting the first and second source drain regions; the gate structure (e.g., HKMG stack 347) surrounds the plurality of channel regions; and the gate structure includes: the high-K metal gate stack 347 in the gate region; conformal gate spacers 331A, 403A on each side of the high-K metal gate, in an extension region; and inner spacers 333 on each side of the high-K metal gate, in the extension region.

Figures 15A, 15B, 15C, 15D:
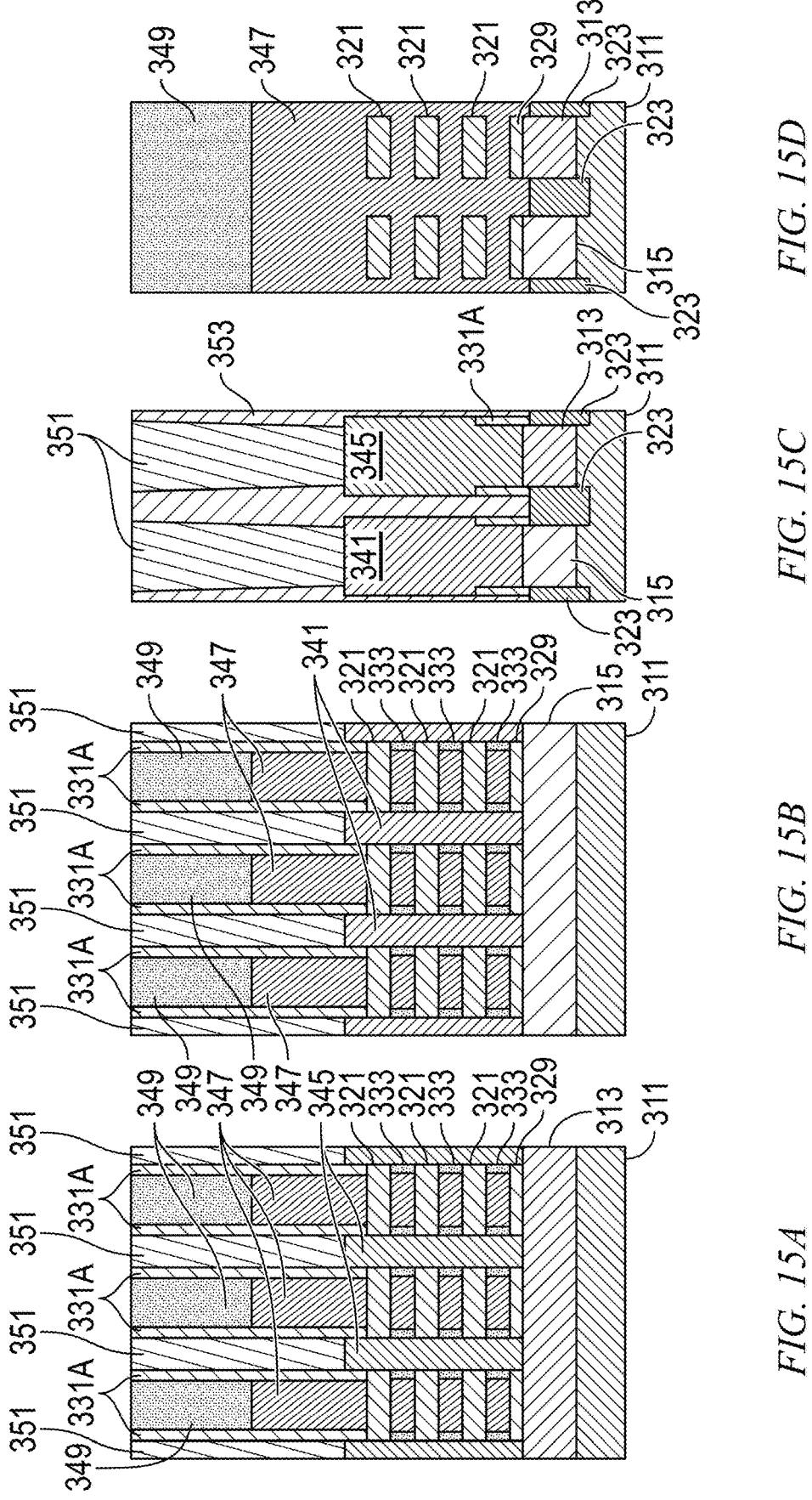
Figures 16A, 16B, 16C, 16D:
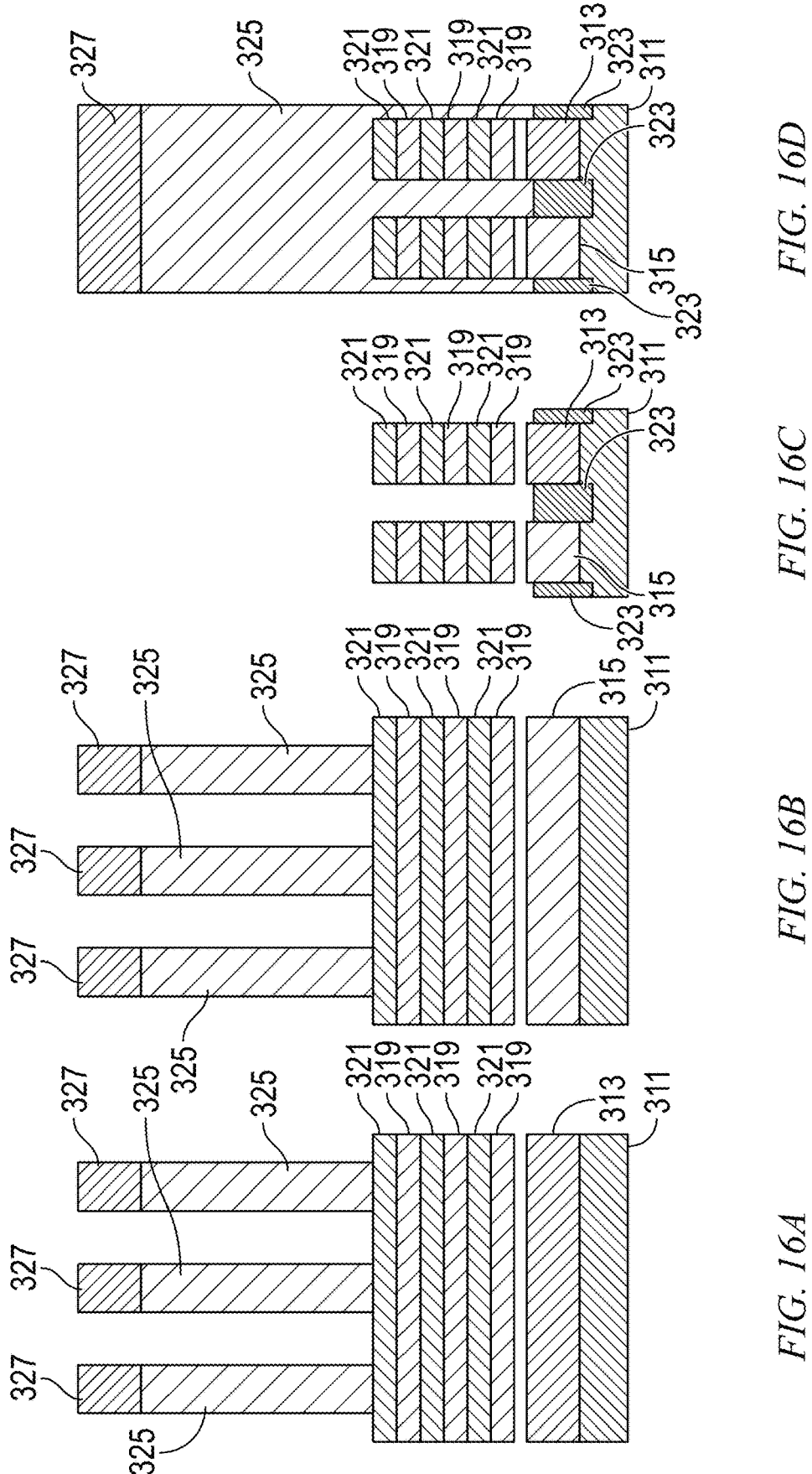
Figures 17A, 17B, 17C, 17D:
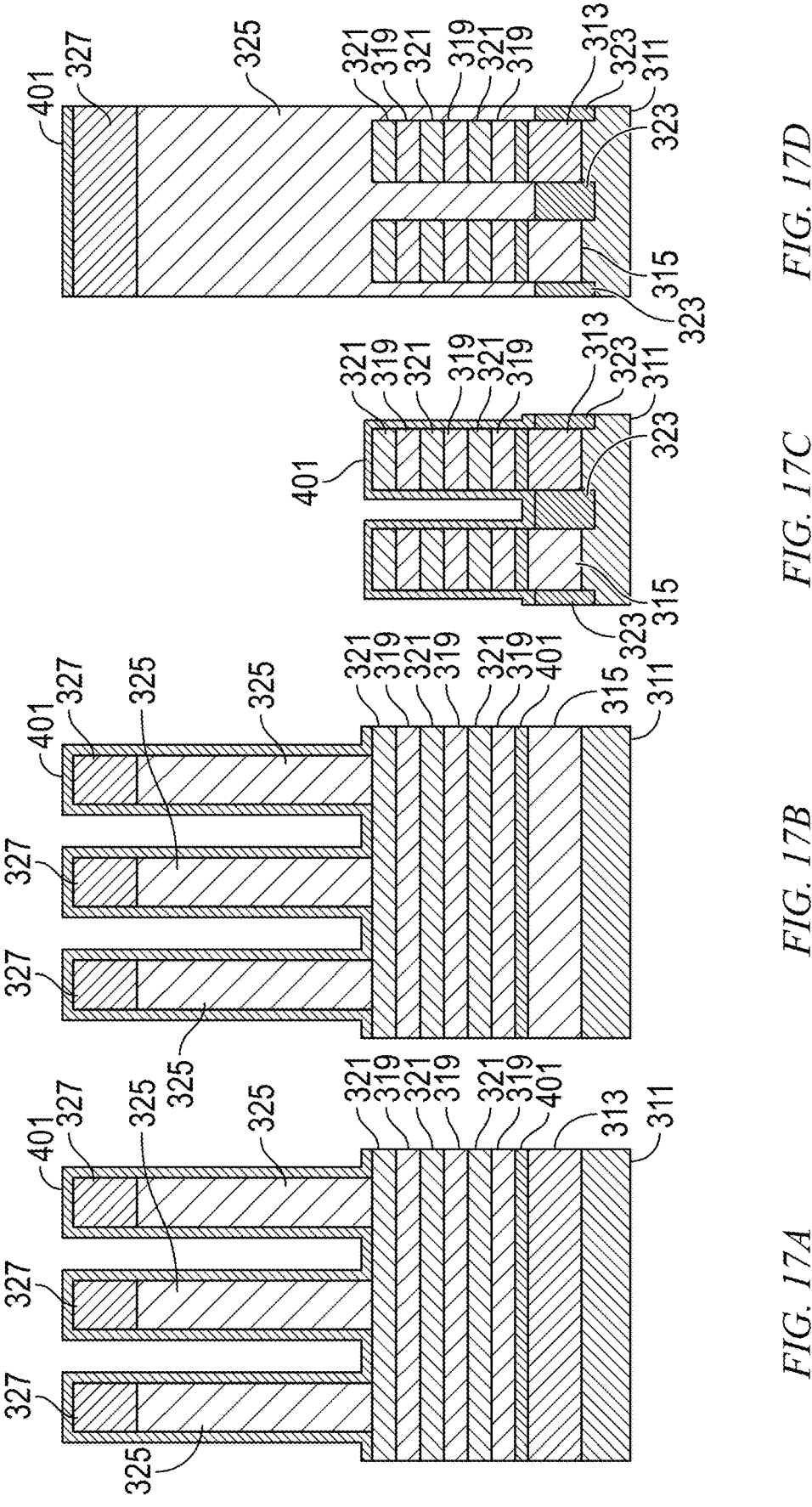
Figures 18A, 18B, 18C, 18D:
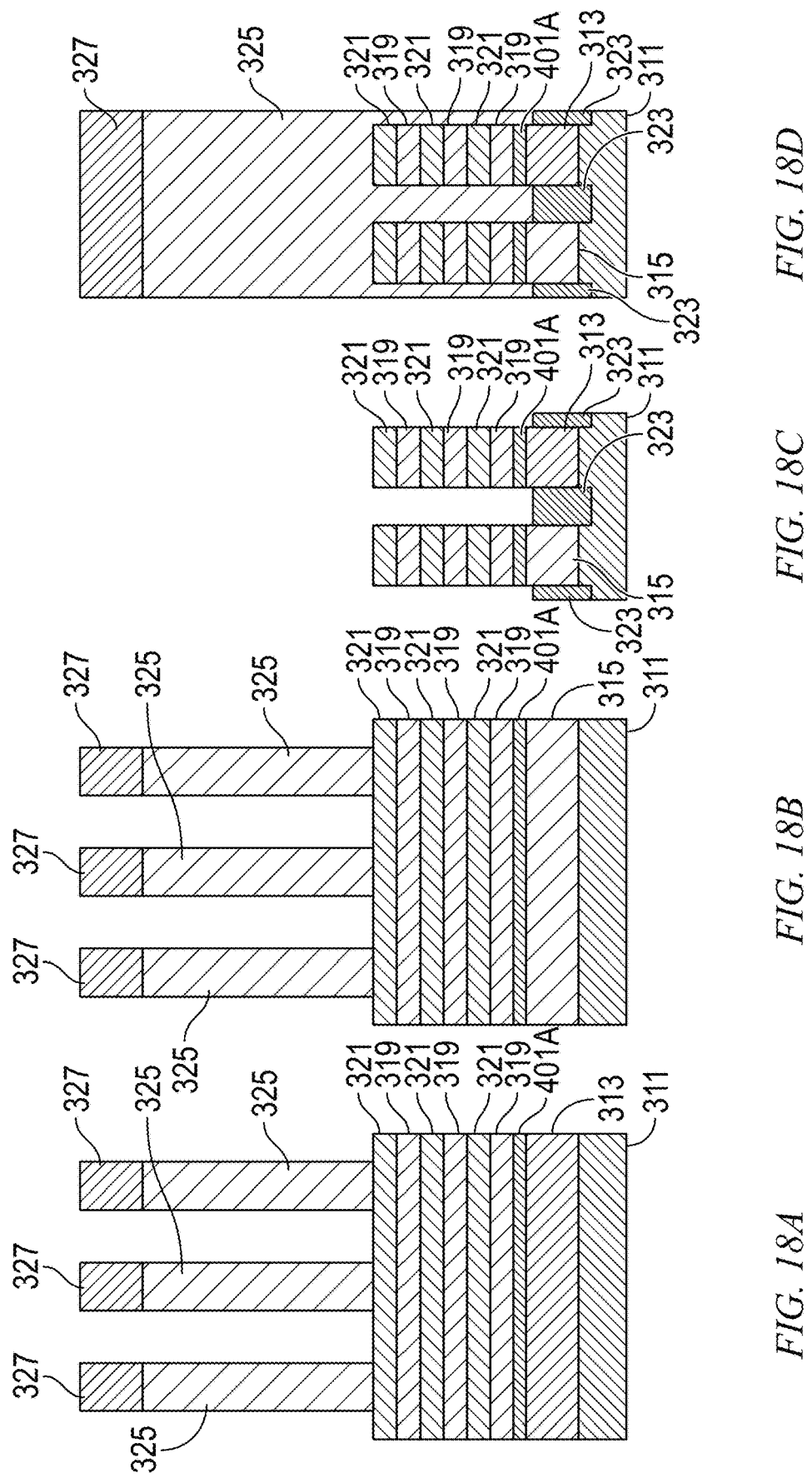
Figures 19A, 19B, 19C, 19D:
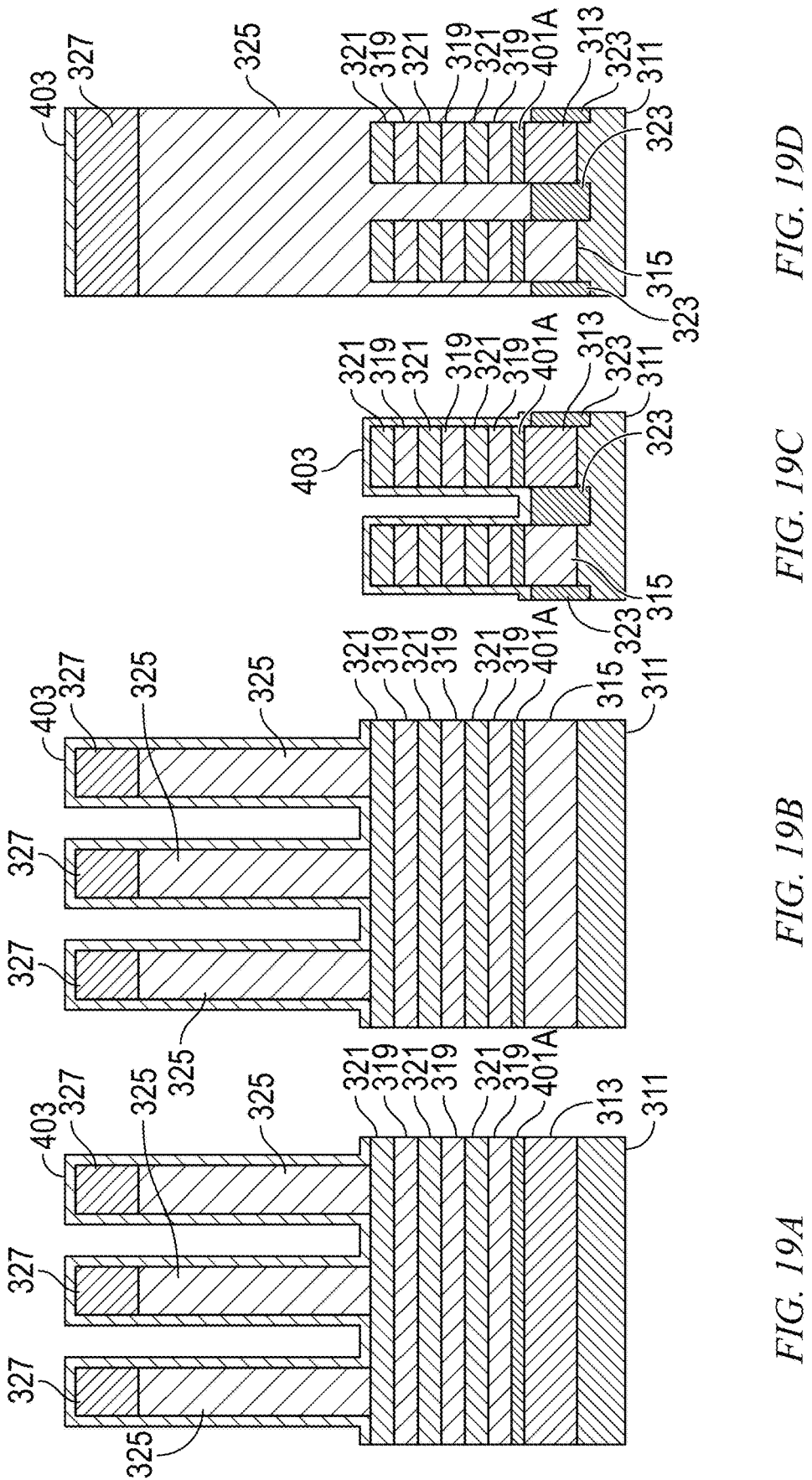

It is worth noting that, in one or more non-limiting examples as shown in the figures, such as in FIG. 15A, the uppermost one of the inner spacers 333 is lower than the uppermost one of the channels (e.g., uppermost one of the silicon layers 321). However, optionally, an additional inner spacer 333 could be located above the uppermost one of the channels (e.g., uppermost one of the silicon layers 321), underneath the conformal gate spacers 331A, 403A.

In one or more embodiments, the outer surface of the substrate is flat, continuous, and does not exhibit substantial topography changes between a portion of the outer surface adjacent the first and second source drain regions and a portion of the outer surface adjacent the gate structure. Note that the PTS is the outer layer of the substrate, where present, in embodiments such as that of FIGS. 15A-15D; the carbon-bearing leakage control layer is the outer layer of the substrate, where present, in embodiments such as that of FIGS. 41A-41D; and the SSRW layer is the outer layer of the substrate, where present, in embodiments such as that of FIGS. 46A-46D. As used herein, "does not exhibit substantial topography changes" means that a recess in the substrate, if any, extends no more than 10 nm below the top surface of the substrate. In some cases, a recess in the substrate, if any, extends no more than 5 nm below the top surface of the substrate. In some instances, there are no detectable recesses extending below the top surface of the substrate. In some instances, recesses extending more than 10 nm below the top surface of the substrate are present.

In one or more embodiments (e.g., FIGS. 15A-15D, 26A-26D, 38A-38D, 43A-43D, 44A-44D, 48A-48D, and 49A-49D), the first and second source drain regions directly contact the outer surface of the punch-through stopper implant layer and do not extend more than 5 nm (in other cases, do not extend more than 10 nm) below an inner surface of the self-aligned substrate isolation (SASI) layer ("inner" surface of the SASI layer is closer to the substrate than the other (outer) surface of the SASI layer—in the non-limiting example of FIGS. 15A-15D, the inner surface of the SASI layer is in contact with the PTS). In some instances, the first and second source drain regions directly contact the outer surface of the punch-through stopper implant layer and do not extend at all below the lower surface of the self-aligned substrate isolation (SASI) layer. Note that FIGS. 15A-15D, 26A-26D, 38A-38D, 43A-43D, and 48A-48D show examples where the first and second source drain regions do not extend at all below the lower surface of the SASI layer, while FIGS. 44A-44D and 49A-49D show examples where the first and second source drain regions do extend below the lower surface of the SASI layer, but by no more than 5 nm. Some embodiments could extend more than 10 nm.

Referring, for example, to FIGS. 43A-43D, one or more embodiments further include a carbon-bearing leakage control layer, such as SiC 371, but not limited thereto, located within the punch-through stopper implant layer on the outer surface of the substrate, in contact with the first and second source-drain regions and the self-aligned substrate isolation (SASI) layer. As will be appreciated by the skilled artisan, SiC, which is one example of a carbon-bearing leakage control layer, is a crystalline stoichiometric material, i.e., a crystalline matrix of silicon and carbon, which can be grown epitaxially, for example. Another example of a carbon-bearing leakage control layer is a carbon-rich silicon layer. Such a layer can be obtained, for example, by starting with crystalline silicon and implanting it/doping it locally with carbon. In one or more embodiments, the carbon-bearing leakage control layer is located under the stack to reduce the risk of leakage from the source to the drain; for example, adding an additional layer of leakage control besides the PTS. In general, the surface of the wafer close to device can have both a carbon-bearing leakage control layer and the PTS (or either one individually), and the same thing is true for the SSRW.

Referring, for example, to FIGS. 44A-44D, in some cases, the first and second source-drain regions extend past the inner surface of the self-aligned substrate isolation (SASI) layer 401A into the carbon-bearing leakage control layer (in a non-limiting example, no more than 10 nm or in some cases no more than 5 nm).

Referring, for example, to FIGS. 48A-48D, one or more embodiments further include a super-steep retrograde well (SSRW) layer 381 located within the substrate, in contact with the first and second source-drain regions and the self-aligned substrate isolation (SASI) layer.

Referring, for example, to FIGS. 49A-49D, in one or more embodiments, the first and second source-drain regions extend past an inner surface of the self-aligned substrate isolation (SASI) layer into the super-steep retrograde well (SSRW) layer (in a non-limiting example, they extend by no more than 10 nm or in some cases no more than 5 nm).

With reference to, e.g., FIGS. 33A-33D, some instances further include highly doped regions 407, 411 within the punch-through stopper implant layer adjacent the first and second source-drain regions. The highly doped regions are of the same doping polarity as the punch-through stopper implant layer.

It should be noted that in one or more embodiments, the self-aligned substrate isolation (SASI) layer 329, 401A does not substantially extend into the source-drain regions 341, 345 when viewed in the PFET and NFET cross-gate views; for example, in some cases no more than 5 nm.

Referring to FIGS. 38A-38D, in another aspect, an exemplary semiconductor structure includes a substrate 311. Bulk silicon is a non-limiting example of a suitable substrate material, other materials are also possible. The structure also includes a gate-all-around field effect transistor disposed over the substrate. The gate-all-around field effect transistor includes a first source-drain region (e.g., 345 if the FET is an n-FET or 341 if the FET is a p-FET); a second source-drain region (e.g., another instance of 345 if the FET is an n-FET or another instance of 341 if the FET is a p-FET); at least one channel region (e.g., one or more silicon layers 321) interconnecting the first and second source drain regions; and a gate structure surrounding the at least one channel region. In one or more embodiments, the gate structure includes: a high-K metal gate (e.g. HKMG stack 347) in a gate region; conformal gate spacers 403A on each side of the high-K metal gate, in an extension region; and inner spacers 333 on each side of the high-K metal gate, in the extension region. A further element is a self-aligned substrate isolation (SASI) layer located between the substrate and the inner spacers. The self-aligned substrate isolation (SASI) layer does not extend across the high-K metal gate.

Optionally, a punch-through stopper implant layer including P-PTS 313, N-PTS 315 is included on an outer surface of the substrate, facing towards the gate-all-around field effect transistor, inward of the first and second source-drain regions and the gate structure. The punch-through stopper (PTS) implant layer including P-PTS 313, N-PTS 315 is typically of opposite type to the adjacent epitaxial material ("epi") (e.g., 345 if the FET is an n-FET or 341 if the FET is a p-FET); i.e., the doping polarity of the PTS is opposite to the doping polarity of the source-drain regions.

In another aspect, a semiconductor array structure includes a substrate 311. Bulk silicon is a non-limiting example of a suitable substrate material, other materials are also possible. Also included are a plurality of P-type gate-all-around field effect transistors disposed over the substrate. Each P-type gate-all-around field effect transistor includes: a first P-type source-drain region 341; a second P-type source-drain region (another instance of 341); and at least one PFET channel region (e.g., one or more silicon layers 321) interconnecting the first and second P-type source drain regions. For the avoidance of doubt, "PFET channel region" means a channel region of a PFET and does not imply that the channel region is doped. Each P-type gate-all-around field effect transistor also includes a PFET gate structure surrounding the at least one PFET channel region.

Also included are a plurality of N-type gate-all-around field effect transistors disposed over the substrate. Each N-type gate-all-around field effect transistor includes: a first N-type source-drain region NFET S-D epitaxy 345; a second N-type source-drain region (another instance of NFET S-D epitaxy 345); and at least one NFET channel region (e.g., one or more silicon layers 321) interconnecting the first and second N-type source drain regions. For the avoidance of doubt, "NFET channel region" means a channel region of an NFET and does not imply that the channel region is doped. Each N-type gate-all-around field effect transistor also includes an NFET gate structure surrounding the at least one NFET channel region. Further elements of the semiconductor array structure include a first plurality of self-aligned substrate isolation (SASI) layers 329, 401A are located between the substrate (e.g., the plurality of N-type punch-through stopper implant layers) and the NFET gate structures and extend over a width of the NFET gate structures; and a second plurality of self-aligned substrate isolation (SASI) layers 329, 401A are located between the substrate (e.g., the plurality of P-type punch-through stopper implant layers) and the PFET gate structures and extend over a width of the PFET gate structures.

Optionally, a plurality of N-type punch-through stopper implant layers (N-PTS 315) are included in the substrate adjacent an upper surface of the substrate, facing towards the P-type gate-all-around field effect transistors, below the first and second P-type source-drain regions and the PFET gate structures; and a plurality of P-type punch-through stopper implant layers 313 are included in the substrate adjacent the upper surface of the substrate, facing towards the N-type gate-all-around field effect transistors, inward of the first and second N-type source-drain regions and the NFET gate structures.

In another aspect, an exemplary method of forming a semiconductor array structure includes epitaxially growing, outward of a substrate 311, a nanosheet stack including a lower, sacrificial high Ge % SiGe layer 317, and a plurality of alternating low Ge % SiGe layers 319 and Si layers 321 above the sacrificial high Ge % SiGe layer, as shown, for example, in FIGS. 4A-4D. Further steps include forming a plurality of fins 301, 303 in the nanosheet stack and forming shallow trench isolation material (STI 323) between the fins, as shown, for example, in FIGS. 5A-5D; forming dummy gates 325 surrounding the fins, as shown, for example, in FIGS. 6A-6D; and substituting a self-aligned substrate isolation (SASI) layer 329, 401A for the sacrificial high Ge % SiGe layer, as shown, for example, in FIGS. 8A-8D and 17A-18D. Even further steps include forming gate spacers 331A, 403A on sides of the dummy gates and forming source-drain trenches between the dummy gates, as shown, for example, in FIGS. 9A-9D and 20A-20D; forming inner spacers 333 adjacent edges of the plurality of alternating low Ge % SiGe layers, as shown, for example, in FIGS. 10A-10D and 21A-21D; and selectively removing the self-aligned substrate isolation (SASI) layer from bottoms of the source-drain trenches, as shown, for example, in FIGS. 11A-12D, 22A-24B, and 50A-51D. Note that the selective SASI removal can be done before or after the inner spacer formation. Yet further steps include epitaxially growing source-drain regions 341, 343 in the source-drain trenches, as shown, for example, in FIGS. 12A-14D (note the benefit of providing an exposed substrate for S-D epitaxy nucleation, which is a significant advantage for epitaxy formation, and potentially for strain engineering); and replacing the dummy gates and the plurality of alternating low Ge % SiGe layers 319 with high-K metal gate (HKMG) stacks and forming trench metal contacts 351 between the high-K metal gate (HKMG) stacks down to the source-drain regions, as shown, for example, in FIGS. 15A-15D.

One or more embodiments further include forming a punch-through-stopper (PTS) implant including P-PTS 313, N-PTS 315 on a substrate 311, as shown, for example, in FIGS. 3A-3D; the nanosheet stack is epitaxially grown on the punch-through-stopper (PTS) implant.

One or more embodiments further include forming a carbon-bearing leakage control layer within the substrate, prior to forming the punch-through-stopper (PTS) implant on the substrate. See the example of FIGS. 40A-41D.

One or more embodiments further include forming a super-steep retrograde well (SSRW) layer within the substrate, prior to forming the punch-through-stopper (PTS) implant on the substrate. See the example of FIGS. 45A-46D.

Referring to FIGS. 50A-51D, in some cases, the step of selectively removing the self-aligned substrate isolation (SASI) layer from bottoms of the source-drain trenches is carried out prior to the step of forming the inner spacers adjacent to the edges of the plurality of alternating low Ge % SiGe layers.

Thus, one or more embodiments advantageously provide a self-aligned substrate isolation (SASI) layer for optimal fin recess control, which reduces or eliminates over-etch into the substrate/PTS, minimizing the risk of leakage under the gate. Furthermore, one or more embodiments provide the benefit of significantly reducing gate-to-substrate capacitance; a SASI layer is preserved under the stack, which physically disconnects the bottom high-K metal gate (HKMG) from the sub-fin. Even further, one or more exemplary fabrication techniques provide an exposed substrate for S-D epitaxy nucleation, which is a significant advantage for epitaxy formation, and potentially for strain engineering. Yet further, one or more exemplary fabrication techniques can advantageously be implemented by adapting known fabrication processes.

In yet a further aspect, a hardware description language (HDL) design structure is encoded on a machine-readable data storage medium. The HDL design structure includes elements that when processed in a computer-aided design system generate a machine-executable representation of a semiconductor structure and/or semiconductor structure array, and/or any portion thereof, as described.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any appli-

| cation and/or electronic system. Given the teachings of the present disclosure provided herein, one of ordinary skill in the art will be able to contemplate other implementations and applications of embodiments disclosed herein.

Figure 53:
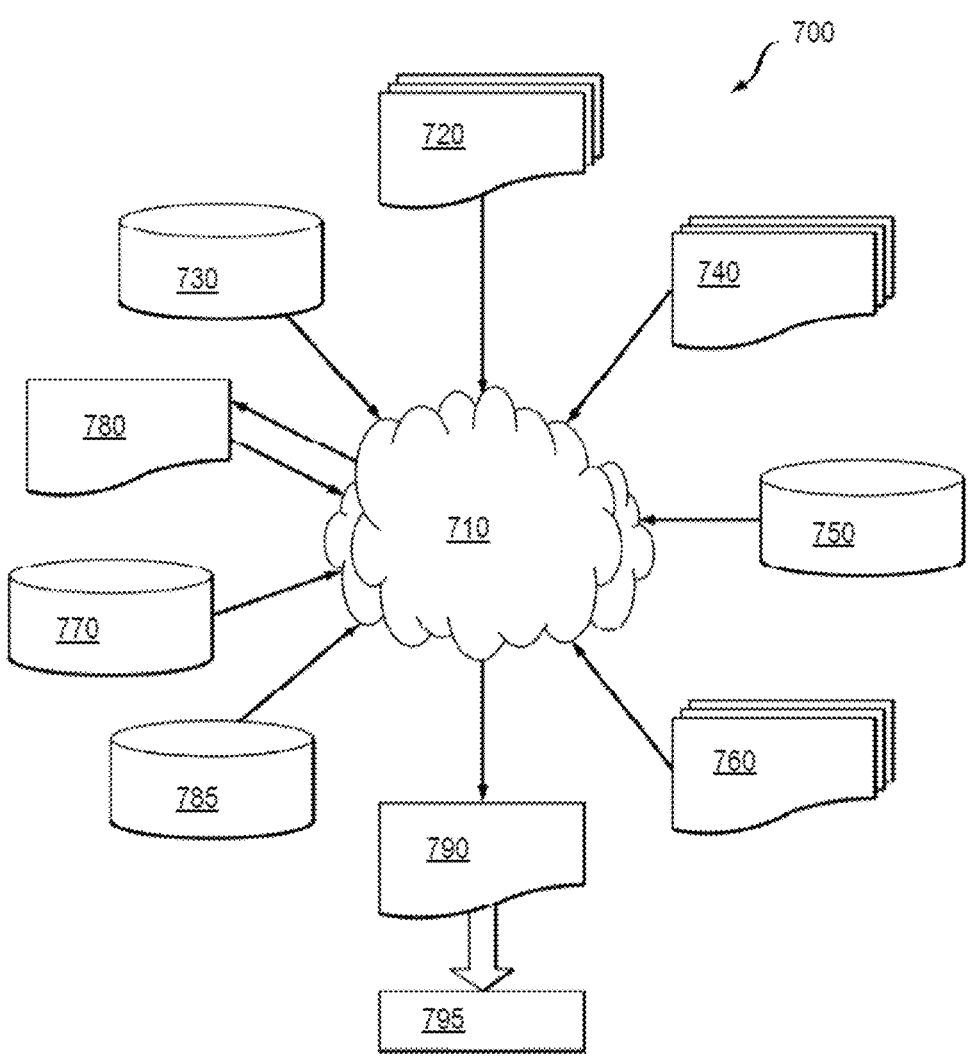
FIG. 53 is a flow diagram of a design process used in semiconductor design, manufacture, and/or test.

Reference should now be had to FIG. 52, which depicts a computing environment useful in connection with some aspects of the present invention, such as with the design process of FIG. 53.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as code 200 for computer-aided semiconductor integrated circuit design simulation, test, layout, and/or manufacture. In addition to the block including code 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 52. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 53 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 53 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
   a substrate;
   a gate-all-around field effect transistor disposed over the substrate, the gate-all-around field effect transistor including:
      a first source-drain region;
      a second source-drain region;
      at least one channel region interconnecting the first and second source-drain regions;
      a gate structure surrounding the at least one channel region;
   a punch-through stopper implant layer in the substrate below the first and second source-drain regions and the gate structure;
   a self-aligned substrate isolation (SASI) layer located between the punch-through stopper implant layer and the gate structure and extending over a width of the gate structure; and
   a first doped region adjacent the first source-drain region and a second doped region adjacent the second source-drain region, wherein the first and second doped regions are:
      located within the punch-through stopper implant layer;
      more highly doped than the punch-through stopper implant layer; and
      not extending across the width of the gate structure.

2. The semiconductor structure of claim 1, wherein:
   the self-aligned substrate isolation (SASI) layer is in contact with the punch-through stopper implant layer.

3. The semiconductor structure of claim 2, wherein the gate structure includes:
   a metal gate in a gate region;
   conformal gate spacers on each side of the metal gate, in an extension region; and
   inner spacers on each side of the metal gate, in the extension region.

4. The semiconductor structure of claim 3, wherein the self-aligned substrate isolation (SASI) layer and the conformal gate spacers are different materials.

5. The semiconductor structure of claim 2, wherein:
   the at least one channel region comprises a plurality of channel regions interconnecting the first and second source-drain regions;
   the gate structure surrounds the plurality of channel regions; and the gate structure includes:
      a metal gate in a gate region;
      conformal gate spacers on each side of the metal gate, in an extension region; and
      inner spacers on each side of the metal gate, in the extension region.

6. The semiconductor structure of claim 5, wherein an outer surface of the substrate is flat, continuous, and does not exhibit substantial topography changes between a portion of the outer surface adjacent the first and second source-drain regions and a portion of the outer surface adjacent the gate structure.

7. The semiconductor structure of claim 5, wherein an outer surface of the substrate is flat, continuous, and does not have a recess.

8. The semiconductor structure of claim 5, wherein the first and second source-drain regions directly contact an outer surface of the first and second doped regions, respectfully, and do not extend more than 5 nm below a lower surface of the self-aligned substrate isolation (SASI) layer.

9. The semiconductor structure of claim 5, wherein the first and second source-drain regions directly contact an outer surface of the first and second doped regions, respectfully, and do not extend more than 10 nm below a lower surface of the self-aligned substrate isolation (SASI) layer.

10. The semiconductor structure of claim 5, wherein the first and second source-drain regions directly contact an outer surface of the first and second doped regions, respectfully, and do not extend below a lower surface of the self-aligned substrate isolation (SASI) layer.

11. The semiconductor structure of claim 2, wherein the first and second doped regions are of a same doping polarity as the punch-through stopper implant layer.

12. A semiconductor array structure comprising:
   a substrate;
   a plurality of P-type gate-all-around field effect transistors disposed over the substrate, each P-type gate-all-around field effect transistor including:
      a first P-type source-drain region;
      a second P-type source-drain region;
      at least one PFET channel region interconnecting the first and second P-type source-drain regions; and
      a PFET gate structure surrounding the at least one PFET channel region;
   a plurality of N-type gate-all-around field effect transistors disposed over the substrate, each N-type gate-all-around field effect transistor including:
      a first N-type source-drain region;
      a second N-type source-drain region;
      at least one NFET channel region interconnecting the first and second N-type source-drain regions; and
      an NFET gate structure surrounding the at least one NFET channel region;
   a plurality of N-type punch-through stopper implant layers in the substrate below the P-type source-drain regions and the PFET gate structures;
   a plurality of P-type punch-through stopper implant layers in the substrate below the N-type source-drain regions and the NFET gate structures;
   a plurality of carbon-bearing leakage control layers in the substrate below the P-type source-drain regions and the PFET gate structures and below the N-type source-drain regions and the NFET gate structures;
   a first plurality of self-aligned substrate isolation (SASI) layers located between the carbon-bearing leakage control layers in the substrate and the NFET gate structures and extending over a width of the NFET gate structures; and a second plurality of self-aligned substrate isolation (SASI) layers located between the carbon-bearing leakage control layers in the substrate and the PFET gate structures and extending over a width of the PFET gate structures.

13. The semiconductor structure of claim 12, wherein the first and second N-type and P-type source-drain regions extend past a lower surface of the first plurality and second plurality of self-aligned substrate isolation (SASI) layers, respectively, into the plurality of carbon-bearing leakage control layers.

14. A hardware description language (HDL) design structure encoded on a machine-readable data storage medium, said HDL design structure comprising elements that when processed in a computer-aided design system generate a machine-executable representation of a semiconductor array structure, wherein said HDL design structure comprises:

a substrate;

a plurality of P-type gate-all-around field effect transistors disposed over the substrate, each P-type gate-all-around field effect transistor including:

a first P-type source-drain region;

a second P-type source-drain region;

at least one PFET channel region interconnecting the first and second P-type source-drain regions; and a PFET gate structure surrounding the at least one PFET channel region;

a plurality of N-type gate-all-around field effect transistors disposed over the substrate, each N-type gate-all-around field effect transistor including:

a first N-type source-drain region;

a second N-type source-drain region;

at least one NFET channel region interconnecting the first and second N-type source-drain regions; and an NFET gate structure surrounding the at least one NFET channel region;

a first plurality of super-steep retrograde well (SSRW) layers in the substrate below the N-type source-drain regions and the NFET gate structures;

a second plurality of super-steep retrograde well (SSRW) layers in the substrate below the P-type source-drain regions and the PFET gate structures;

a plurality of P-type punch-through stopper implant layers in the substrate below the first plurality of super-steep retrograde well (SSRW) layers;

a plurality of N-type punch-through stopper implant layers in the substrate below the second plurality of super-steep retrograde well (SSRW) layers;

a first plurality of self-aligned substrate isolation (SASI) layers located between the first plurality of super-steep retrograde well (SSRW) layers in the substrate and the NFET gate structures and extending over a width of the NFET gate structures; and a second plurality of self-aligned substrate isolation (SASI) layers located between the second plurality of super-steep retrograde well (SSRW) layers in the substrate and the PFET gate structures and extending over a width of the PFET gate structures.

15. The semiconductor structure of claim 14, wherein the first and second N-type and P-type source-drain regions, respectively, extend past an inner surface of the first plurality and second plurality of self-aligned substrate isolation (SASI) layers into the first plurality and second plurality of super-steep retrograde well (SSRW) layers.

16. The hardware description language (HDL) design structure of claim 14, wherein:

the plurality of P-type punch-through stopper implant layers and the N-type source-drain regions are in contact with the first plurality of super-steep retrograde well (SSRW) layers; and the plurality of N-type punch-through stopper implant layers and the P-type source-drain regions are in contact with the second plurality of super-steep retrograde well (SSRW) layers.

17. A semiconductor array structure comprising:

a substrate;

a plurality of P-type gate-all-around field effect transistors disposed over the substrate, each P-type gate-all-around field effect transistor including:

a first P-type source-drain region;

a second P-type source-drain region;

at least one PFET channel region interconnecting the first and second P-type source-drain regions; and a PFET gate structure surrounding the at least one PFET channel region;

a plurality of N-type gate-all-around field effect transistors disposed over the substrate, each N-type gate-all-around field effect transistor including:

a first N-type source-drain region;

a second N-type source-drain region;

at least one NFET channel region interconnecting the first and second N-type source-drain regions; and an NFET gate structure surrounding the at least one NFET channel region;

a plurality of N-type punch-through stopper implant layers in the substrate adjacent an upper surface of the substrate, facing towards the P-type gate-all-around field effect transistors, below the P-type source-drain regions and the PFET gate structures;

a plurality of P-type punch-through stopper implant layers in the substrate adjacent the upper surface of the substrate, facing towards the N-type gate-all-around field effect transistors, below the N-type source-drain regions and the NFET gate structures;

a first plurality of self-aligned substrate isolation (SASI) layers located between the plurality of P-type punch-through stopper implant layers and the NFET gate structures and extending over a width of the NFET gate structures;

a second plurality of self-aligned substrate isolation (SASI) layers located between the plurality of N-type punch-through stopper implant layers and the PFET gate structures and extending over a width of the PFET gate structures;

a plurality of first doped regions in the plurality of P-type punch-through stopper implant layers adjacent the first and second N-type source-drain regions; and a plurality of second doped regions in the plurality of N-type punch-through stopper implant layers adjacent the first and second P-type source-drain regions, wherein the plurality of first and second doped regions, respectively, are more highly doped than the P-type and N-type punch-through stopper implant layers and do not extend across the width of the NFET and PFET gate structures.

18. The semiconductor structure of claim 17, wherein the PFET and NFET gate structures include:

a metal gate in a gate region;

conformal gate spacers on each side of the metal gate, in an extension region; and inner spacers on each side of the metal gate, in the extension region.

19. The semiconductor structure of claim 18, wherein the first and second plurality of self-aligned substrate isolation (SASI) layers and the conformal gate spacers are different materials.

20. A hardware description language (HDL) design structure encoded on a machine-readable data storage medium, said HDL design structure comprising elements that when processed in a computer-aided design system generate a machine-executable representation of a semiconductor array structure, wherein said HDL design structure comprises:

a substrate;

a plurality of P-type gate-all-around field effect transistors disposed over the substrate, each P-type gate-all-around field effect transistor including:

a first P-type source-drain region;

a second P-type source-drain region;

at least one PFET channel region interconnecting the first and second P-type source-drain regions; and a PFET gate structure surrounding the at least one PFET channel region;

a plurality of N-type gate-all-around field effect transistors disposed over the substrate, each N-type gate-all-around field effect transistor including:

a first N-type source-drain region;

a second N-type source-drain region;

at least one NFET channel region interconnecting the first and second N-type source-drain regions; and an NFET gate structure surrounding the at least one NFET channel region;

a plurality of N-type punch-through stopper implant layers in the substrate adjacent an upper surface of the substrate, facing towards the P-type gate-all-around field effect transistors, below the P-type source-drain regions and the PFET gate structures;

a plurality of P-type punch-through stopper implant layers in the substrate adjacent the upper surface of the substrate, facing towards the N-type gate-all-around field effect transistors, below the N-type source-drain regions and the NFET gate structures;

a first plurality of self-aligned substrate isolation (SASI) layers located between the plurality of P-type punch-through stopper implant layers and the NFET gate structures and extending over a width of the NFET gate structures;

a second plurality of self-aligned substrate isolation (SASI) layers located between the plurality of N-type punch-through stopper implant layers and the PFET gate structures and extending over a width of the PFET gate structures;

a plurality of first doped regions in the plurality of P-type punch-through stopper implant layers adjacent the first and second N-type source-drain regions; and a plurality of second doped regions in the plurality of N-type punch-through stopper implant layers adjacent the first and second P-type source-drain regions, wherein the plurality of first and second doped regions, respectively, are more highly doped than the plurality of P-type and N-type punch-through stopper implant layers and do not extend across the width of the NFET and PFET gate structures.

21. The semiconductor structure of claim 20, wherein the PFET and NFET gate structures include:

a metal gate in a gate region;

conformal gate spacers on each side of the metal gate, in an extension region; and inner spacers on each side of the metal gate, in the extension region.

22. The semiconductor structure of claim 21, wherein the first and second plurality of self-aligned substrate isolation (SASI) layers and the conformal gate spacers are different materials.

* * * * *